United States Patent
Suganuma et al.

(10) Patent No.: US 8,445,876 B2
(45) Date of Patent: May 21, 2013

(54) EXTREME ULTRAVIOLET LIGHT SOURCE APPARATUS

(75) Inventors: Takashi Suganuma, Hiratsuka (JP); Masato Moriya, Hiratsuka (JP); Tamotsu Abe, Hiratsuka (JP); Kouji Kakizaki, Hiratsuka (JP); Osamu Wakabayashi, Hiratsuka (JP)

(73) Assignee: Gigaphoton Inc., Tochigi (JP)

( * ) Notice: Subject to any disclaimer, the term of this patent is extended or adjusted under 35 U.S.C. 154(b) by 214 days.

(21) Appl. No.: 12/603,872

(22) Filed: Oct. 22, 2009

(65) Prior Publication Data

US 2010/0140512 A1 Jun. 10, 2010

(30) Foreign Application Priority Data

Oct. 24, 2008 (JP) ................................ 2008-274317

(51) Int. Cl.
*H01J 35/00* (2006.01)
*G03B 27/54* (2006.01)

(52) U.S. Cl.
USPC ........................................ 250/504 R; 355/67

(58) Field of Classification Search
USPC .................. 250/493.1–504 R; 355/66–71
See application file for complete search history.

(56) References Cited

U.S. PATENT DOCUMENTS

| | | | | |
|---|---|---|---|---|
| 4,585,349 A | * | 4/1986 | Gross et al. | 356/624 |
| 4,799,783 A | * | 1/1989 | Takahashi et al. | 351/206 |
| 2005/0236589 A1 | * | 10/2005 | Brunfeld et al. | 250/559.11 |
| 2006/0192156 A1 | * | 8/2006 | Hasegawa | 250/504 R |
| 2006/0219957 A1 | * | 10/2006 | Ershov et al. | 250/504 R |
| 2007/0008517 A1 | * | 1/2007 | Fomenkov et al. | 356/218 |
| 2007/0012889 A1 | * | 1/2007 | Sogard | 250/504 R |
| 2007/0069162 A1 | * | 3/2007 | Banine et al. | 250/504 R |
| 2007/0139634 A1 | * | 6/2007 | Mulder | 355/67 |
| 2008/0151221 A1 | * | 6/2008 | Sogard | 356/51 |

FOREIGN PATENT DOCUMENTS

JP  2007-109451  4/2007

\* cited by examiner

*Primary Examiner* — Robert Kim
*Assistant Examiner* — David E Smith
(74) *Attorney, Agent, or Firm* — McDermott Will & Emery LLP

(57) ABSTRACT

An extreme ultraviolet (EUV) light source apparatus in which a location or posture shift of an EUV collector mirror can be detected. The apparatus includes: a chamber; a target supply mechanism for supplying a target material into the chamber; a driver laser for irradiating the target material with a laser beam to generate plasma; a collector mirror having a first focal point and a second focal point, for reflecting light, which is generated at the first focal point, toward the second focal point; a splitter optical element provided in an optical path of the light reflected by the collector mirror, for splitting a part of the light reflected by the collector mirror; and an image sensor provided in an optical path of the light split by the splitter optical element, for detecting a profile of the light split by the splitter optical element.

24 Claims, 49 Drawing Sheets

IF IMAGE — 101
— 103
— 105
TRANSFERRED IMAGE OF IF IMAGE
107 TWO-DIMENSIONAL CCD SENSOR

IF IMAGE — 108
109 TWO-DIMENSIONAL CCD SENSOR

EXTREME ULTRAVIOLET LIGHT SOURCE APPARATUS

CROSS-REFERENCE TO RELATED APPLICATION

The present application claims priority from Japanese Patent Application No. 2008-274317 filed on Oct. 24, 2008, the contents of which are incorporated herein by reference in their entirety.

BACKGROUND OF THE INVENTION

1. Field of the Invention

The present invention relates to an extreme ultraviolet (EUV) light source apparatus to be used as a light source of exposure equipment.

2. Description of a Related Art

In recent years, as semiconductor processes become finer, photolithography has been making rapid progress toward finer fabrication. In the next generation, micro-fabrication at 70 nm to 45 nm, further, micro-fabrication at 32 nm and beyond will be required. Accordingly, in order to fulfill the requirement for micro-fabrication at 32 nm and beyond, for example, exposure equipment is expected to be developed by combining an EUV light source for generating EUV light having a wavelength of about 13 nm and reduced projection reflective optics.

As the EUV light source, there is an LPP (laser produced plasma) type light source using plasma generated by irradiating a target with a laser beam. The LPP type light source has advantages that extremely high intensity close to black body radiation can be obtained because plasma density can be considerably made larger, that light emission of only the necessary waveband can be performed by selecting the target material, and that an extremely large collection solid angle can be ensured because it is a point light source having substantially isotropic angle distribution and there is no structure such as electrodes surrounding the light source. Therefore, the LPP type light source is predominant as a light source for photolithography.

FIG. 52 is a schematic diagram for explanation of a configuration and an alignment method of a conventional LPP type MTV light source apparatus. The LPP type EUV light source apparatus utilizes EUV light radiated from plasma generated by irradiating a target material, which is supplied into a vacuum chamber (EUV chamber), with a laser beam.

As shown in FIG. 52, the LPP type EUV light source apparatus includes a driver laser for generating a laser beam such as a short-pulse $CO_2$ laser beam, a laser beam focusing optics (including a reflection mirror and an off-axis parabolic mirror, for example) for focusing the laser beam on the target material to turn the target material into plasma, and an EUV chamber in which EUV light is generated. An EUV collector mirror for collecting the EUV light radiated from plasma to output the EUV light is provided within the EUV chamber.

As the target material, for example, a metal such as tin (Sn) or lithium (Li) is used. The target material is melted in a target supply unit and pressurized by an inert gas such as argon (Ar), and a jet of the target material is injected from a target nozzle in which a microscopic hole is formed. When regular disturbance is provided to the jet of the target material by using a vibrator attached to the target nozzle, the jet of the target material is split into droplets having uniform diameters and intervals.

The laser beam generated from the driver laser is guided by the laser beam focusing optics and applied to the target via a window. The target irradiated with the laser beam is turned into plasma, and various wavelength components including the EUV light are radiated.

The EUV collector mirror is a spheroidal mirror having a first focal point and a second focal point, and placed such that the first focal point is located at a focusing point of the laser beam, which corresponds to a plasma emission point (EUV emission point), and the second focal point is located at an intermediate focusing point (IF), which corresponds to a point light source for an exposure unit. The reflection surface of the EUV collector mirror is coated with a multilayer-coating in which molybdenum (Mo) and silicon (Si) thin coatings are alternately stacked (Mo/Si multilayer-coating), for example, for selectively reflecting a desired wavelength component (e.g., a component having a wavelength of 13.5 nm). Thereby, the EUV collector mirror selectively reflects and collects the EUV light radiated from the plasma, converges the EUV light on the second focal point of the EUV collector mirror, and supplies the EUV light to a device such as an exposure unit utilizing EUV light.

Here, the driver laser beam and the EUV light are invisible light, and therefore, the location adjustment of the optics has been not easy. For example as shown in FIG. 52, when the EUV collector mirror is changed due to the heat of the laser beam, the location of the intermediate focusing point (IF) is shifted. Conventionally, an IF location sensor has been inserted between the EUV light source apparatus and the exposure unit, an image of the EUV emission point formed near the intermediate focusing point (IF) has been detected, and the location and the angle, at which the EUV collector mirror is placed, have been adjusted based on the detection result.

As a related technology, Japanese Patent Application Publication JP-P2007-109451A discloses an alignment method including the steps of placing an IF location sensor near an intermediate focusing point (IF) at fixed intervals, observing an image of an EUV emission point, and adjusting alignment of an EUV collector mirror based on the result, in an EUV light source apparatus.

However, according to the above-mentioned alignment method, there have been the following problems because the IF location sensor is inserted into an optical path of EUV light and blocks the EUV light at observation of the image of the EUV emission point.

(1) While the image of the EUV emission point is observed, it is impossible to supply EUV light to an exposure unit to perform exposure.

(2) When the EUV collector mirror is replaced, it is impossible to observe the image of the MTV emission point to perform automatic alignment.

(3) When the optics is out of alignment due to changes in thermal load of the EUV light source apparatus, it is impossible to detect a light profile (e.g., location and/or shape) of the image of the EUV emission point while the EUV light is supplied to the exposure unit.

(4) When the optics is out of alignment due to changes in thermal load of the EUV light source apparatus, it is impossible to stabilize the image of the EUV emission point by feedback control while the EUV light is supplied to the exposure unit.

SUMMARY OF THE INVENTION

The present invention has been achieved in view of the above-mentioned problems. A purpose of the present invention is to provide an extreme ultraviolet light source apparatus in which a location or posture shift of an EUV collector mirror can be detected.

In order to accomplish the above-mentioned purpose, an extreme ultraviolet light source apparatus according to one aspect of the present invention is an apparatus for generating extreme ultraviolet light by irradiating a target material with a laser beam to turn the target material into plasma, and the apparatus includes: a chamber in which the extreme ultraviolet light is generated; a target supply mechanism for supplying the target material into the chamber; a driver laser for irradiating the target material, which is supplied by the target supply mechanism, with the laser beam to generate the plasma; an EUV collector mirror having a first focal point and a second focal point, for reflecting light, which is generated at the first focal point, toward the second focal point; a splitter optical element provided in an optical path of the light reflected by the EUV collector mirror, for splitting a part of the light reflected by the EUV collector mirror; and a detection mechanism provided in an optical path of the light split by the splitter optical element, for detecting a profile of the light split by the splitter optical element.

According to the one aspect of the present invention, by detecting the profile of the light split by the splitter optical element provided in the optical path of the light reflected by the EUV collector mirror, the location or posture shift of the EUV collector mirror can be detected.

DESCRIPTION OF THE PREFERRED EMBODIMENTS

Figure 1:
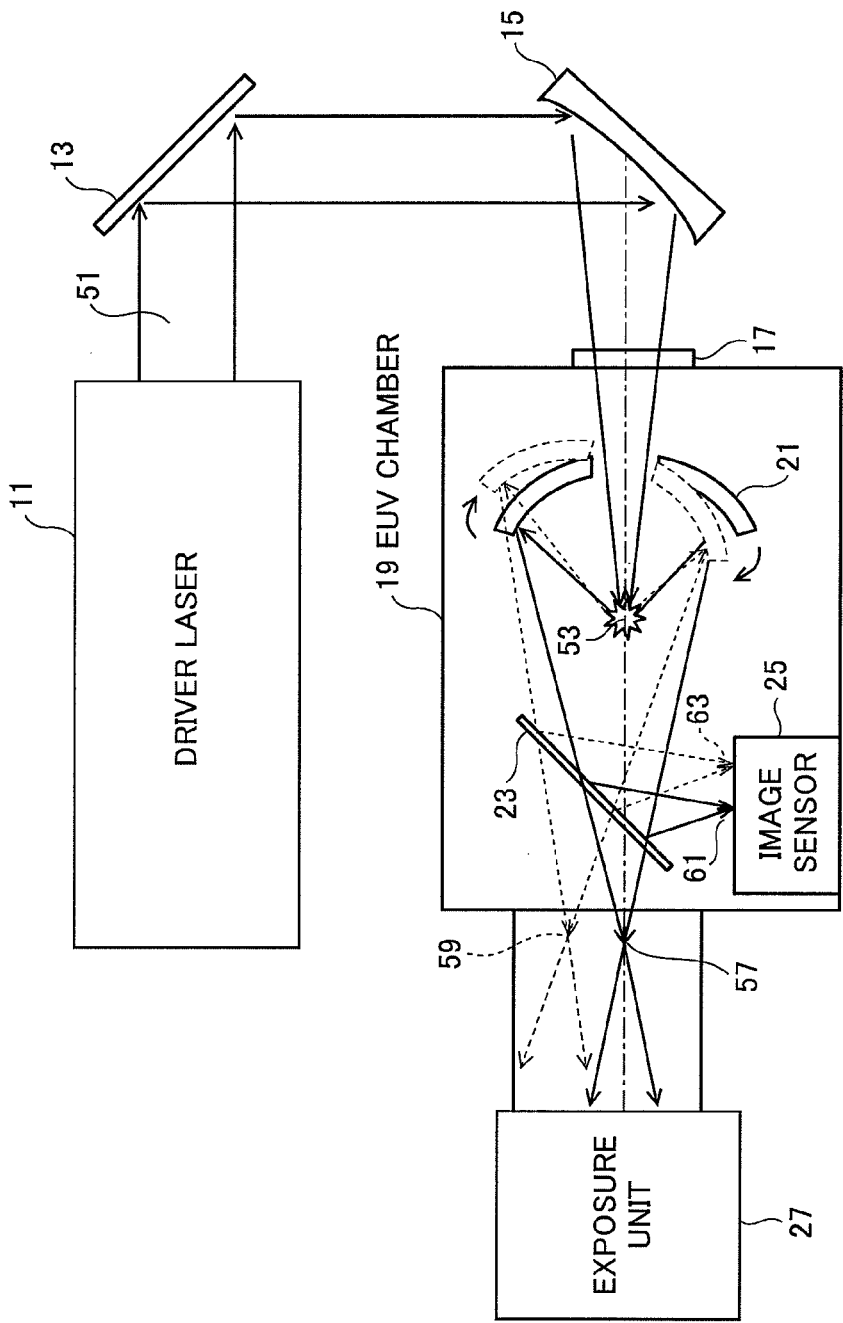
FIG. 1 is a schematic diagram showing a configuration of an EUV light source apparatus according to the first embodiment of the present invention.

Hereinafter, preferred embodiments of the present invention will be explained in detail by referring to the drawings. The same reference numerals are assigned to the same component elements and the explanation thereof will be omitted.

Embodiment 1

FIG. 1 is a schematic diagram showing a configuration of an EUV light source apparatus according to the first embodiment of the present invention. The EUV light source apparatus employs a laser produced plasma (LPP) type for generating EUV light by irradiating a target material with a laser beam to excite the target material.

As shown in FIG. 1, the EUV light source apparatus according to the embodiment includes a driver laser 11 for generating a laser beam 51 for irradiating and exciting the target material, a reflection mirror 13 and an off-axis parabolic mirror 15 forming a laser beam focusing optics for focusing the laser beam 51 on the target material, and an EUV chamber 19 in which EUV light is generated. The EUV light generated by the EUV light source apparatus is supplied to an exposure unit 27.

Figure 2:
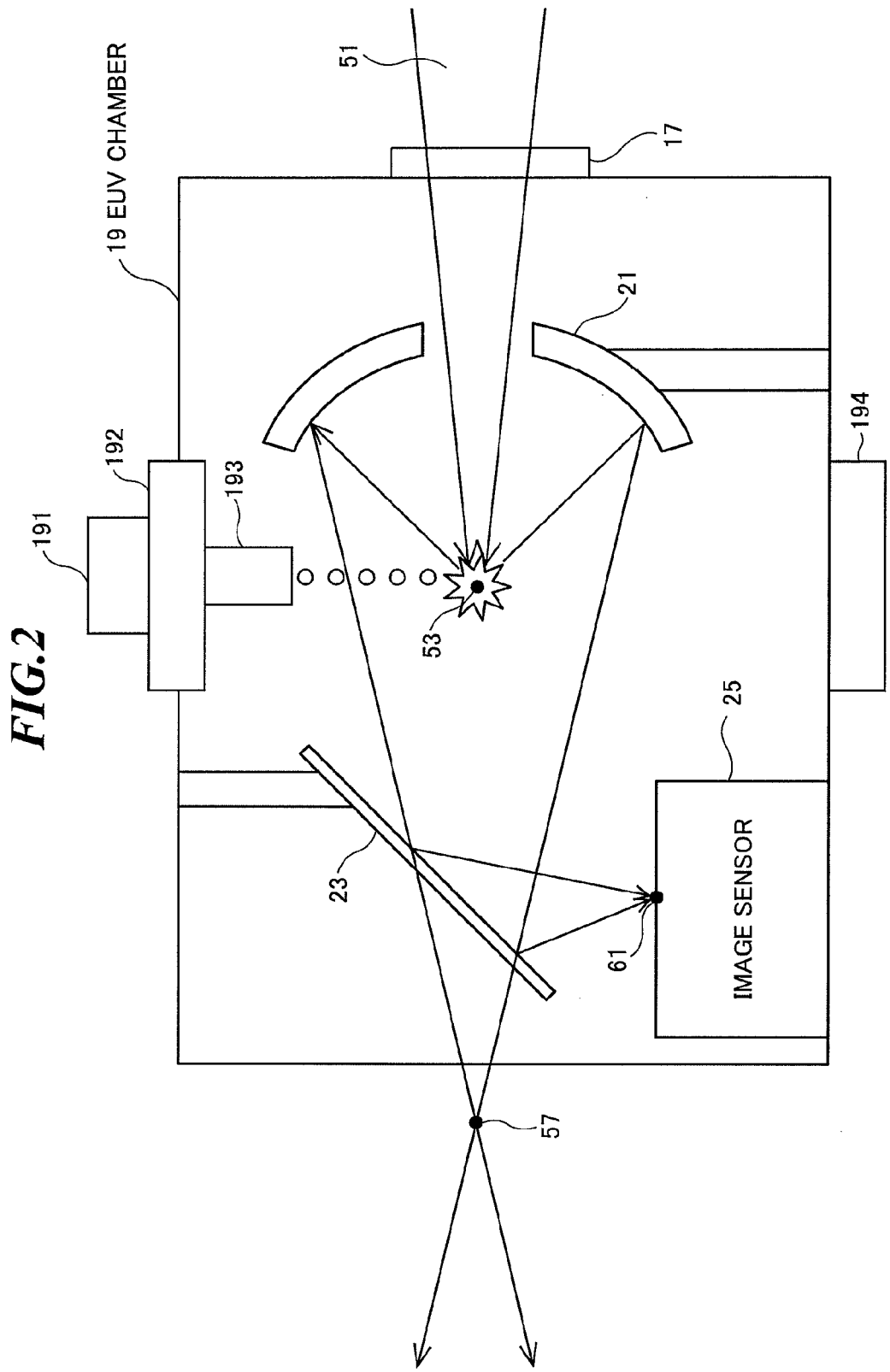
FIG. 2 is an enlarged view of an EUV chamber as shown in FIG. 1.

FIG. 2 is an enlarged view of the EUV chamber as shown in FIG. 1. In the EUV chamber 19, a target supply unit 191, a target location adjustment unit 192, a target nozzle 193, a target collecting unit 194, a window 17, an EUV collector mirror 21, a splitter optical element 23, and an image sensor 25 are provided.

The target supply unit 191 supplies the target material to the target nozzle 193. The target material is a material to be excited and turned into plasma when irradiated with the laser beam 51. As the target material, xenon (Xe), a mixture containing xenon as a main component, argon (Ar), krypton (Kr), water ($H_2O$) or alcohol in the gas state under low atmospheric pressure, a melted metal such as tin (Sin), lithium (Li), or the like, a solution formed by dispersing fine metal particles of tin, tin oxide, copper, or the like in water or alcohol, an ion solution by dissolving lithium fluoride (LiF) or lithium chloride (LiCl) in water, or the like is used.

The state of the target material may be a gas, liquid, or solid state at room temperature. For example, when a target material such as xenon in the gas state at room temperature is used as a liquid target, the target supply unit 191 liquefies a xenon gas by pressurization and cooling, and supplies it to the target nozzle 193. On the other hand, for example, when a material such as tin in the solid state at room temperature is used as a liquid target, the target supply unit 191 liquefies tin by heating, and supplies it to the target nozzle 193.

The target location adjustment unit 192 adjusts the location of the target nozzle 193 so that the target material is accurately supplied to an EUV emission point (a location where the target material is irradiated with the laser beam 51). The target nozzle 193 injects the target material supplied from the target supply unit 191 to form droplet target or target jet, and supplies it to the EUV emission point. When the droplet target is formed, a vibration mechanism for vibrating the target nozzle 193 at a predetermined frequency is further provided.

The target collecting unit 194 collects the target material that has been injected from the target nozzle 193 but has not contributed to generation of plasma without being irradiated with the laser beam 51, and debris (neutral debris and ion debris) produced at generation of plasma. Thereby, the target collecting unit 194 prevents the reduction in degree of vacuum within the EUV chamber 19 (pressure rise) and contamination of the window 17, the EUV collector mirror 21, and so on.

Referring to FIG. 1 again, the driver laser 11 is a laser beam source such as a $CO_2$ laser that can pulse-oscillate at a high repetition rate, and generates the laser beam 51 such as a short-pulse $CO_2$ laser beam. Further, a laser beam focusing optics for focusing the laser beam 51 on the target material is provided in an optical path of the laser beam 51. In FIG. 1, the reflection mirror 13 and the off-axis parabolic mirror 15 are used as the laser beam focusing optics, but the laser beam focusing optics may include at least one lens and/or at least one mirror.

The laser beam 51 generated by the driver laser 11 is reflected by the reflection mirror 13 to enter the off-axis parabolic mirror 15 as parallel light. The off-axis parabolic mirror 15 has a reflection surface formed by a parabolic surface. The laser beam 51 reflected by the off-axis parabolic mirror 15 passes through the window 17 of the EUV chamber 19, passes through an opening formed at the center of the EUV collector mirror 21, and is collected to the focal point (EUV emission point) of the off-axis parabolic mirror 15.

In synchronization with the timing, at which the droplet or jet of the target material reaches the EUV emission point, the driver laser 11 is oscillated and the laser beam 51 generated by the driver laser 11 is applied to the target material. Thereby, the target material is turned into plasma and light including EUV light is radiated from the plasma. The light radiated from the plasma includes various wavelength components at various energy levels.

The EUV collector mirror 21 reflects a desired wavelength component (e.g., EUV light having a wavelength of about 13.5 nm) from among the light radiated from the plasma, and collects it toward the exposure unit 27. For the purpose, a multilayer-coating (e.g., Mo/Si multilayer-coating) for selectively reflecting the desired wavelength component is formed on the reflection surface of the EUV collector mirror 21. The number of layers of the multilayer-coating is typically about several tens to several hundreds. However, the light reflected by the EUV collector mirror 21 includes a certain degree of wavelength components other than the desired wavelength component.

Here, the EUV collector mirror 21 is a spheroidal mirror having the reflection surface formed by a spheroidal surface, and has the first focal point 53 and the second focal point 57. The location and posture of the EUV collector mirror 21 and the locations and postures of the driver laser 11 and the laser beam focusing optics are set such that the location of the first focal point 53 of the EUV collector mirror 21 coincides with the location of the focal point (EUV emission point) of the off-axis parabolic mirror 15 and the location of the second focal point (intermediate focusing point: IF) 57 of the EUV collector mirror 21 coincides with a desired reference location.

Therefore, the EUV light source apparatus forms an image of EUV light generated at the location of the first focal point 53 of the EUV collector mirror 21 at the location of the second focal point 57 of the EUV collector mirror 21. Thereby, the image of the light generated at the EUV emission point and reflected by the EUV collector mirror 21 (hereinafter, also referred to as "emission point image") is formed at the intermediate focusing point (IF).

In an optical path between the first focal point 53 and the second focal point 57 of the EUV collector mirror 21, a splitter optical element 23 for splitting a part of the light reflected by the EUV collector mirror 21 is provided. Further, in an optical path of the light split by the splitter optical element 23, an image sensor 25 is provided as a detection mechanism for detecting a profile (location and/or shape) of the light split by the splitter optical element 23.

The EUV light transmitted through the splitter optical element 23 enters the exposure unit 27 through the intermediate focusing point (IF). On the other hand, the light reflected by the splitter optical element 23 forms an emission point image at the third focal point 61. The emission point image at the third focal point 61 corresponds to the emission point image at the intermediate focusing point (IF), and also referred to as "IF image" as below. At the third focal point 61, a detection surface of the image sensor 25 is provided, and the image sensor 25 detects the IF image. Since the IF image temporally varies and the light profile (location and/or shape) of the IF image changes, it is preferable that the image sensor 25 is a two-dimensional sensor that can measure the light profile (location and/or shape) of the IF image.

For example, assuming that the location of the EUV collector mirror 21 is shifted to the location as shown by broken lines in FIG. 1 at high thermal load, the EUV light radiated from the EUV emission point is collected as shown by the broken lines to a location 59 shifted from the desired reference location, and thus, the location of the IF changes. When the location of the IF changes, the light split by the splitter optical element 23 is also collected to a location 63 shifted from the original third focal point 61. Therefore, how much the detection location 63 is displaced relative to the location of the original third focal point 61 can be measured according to the light profile of the IF image detected by the image sensor 25.

The EUV light source apparatus according to the first embodiment has the following advantages.
(1) Even while the EUV light is supplied to the exposure unit to perform exposure, the location of IF can be detected. Therefore, in the case where the EUV light source apparatus informs the exposure unit of an abnormality, the yield of wafers to be exposed or the like is improved.
(2) When the EUV collector mirror is replaced for maintenance, misalignment of the optical axis of a new EUV collector mirror can be detected without a special device.
(3) Even while the EUV light is supplied to the exposure unit to perform exposure, the intensity distribution of the light of the IF image can be detected, and thereby, the quality of the EUV light supplied to the exposure unit, particularly, an abnormality of the wavefront can be detected. Accordingly, the yield of wafers to be exposed can be improved. Further, abnormalities of distortion of the EUV collector mirror due to heat and so on can be detected.

Figure 3:
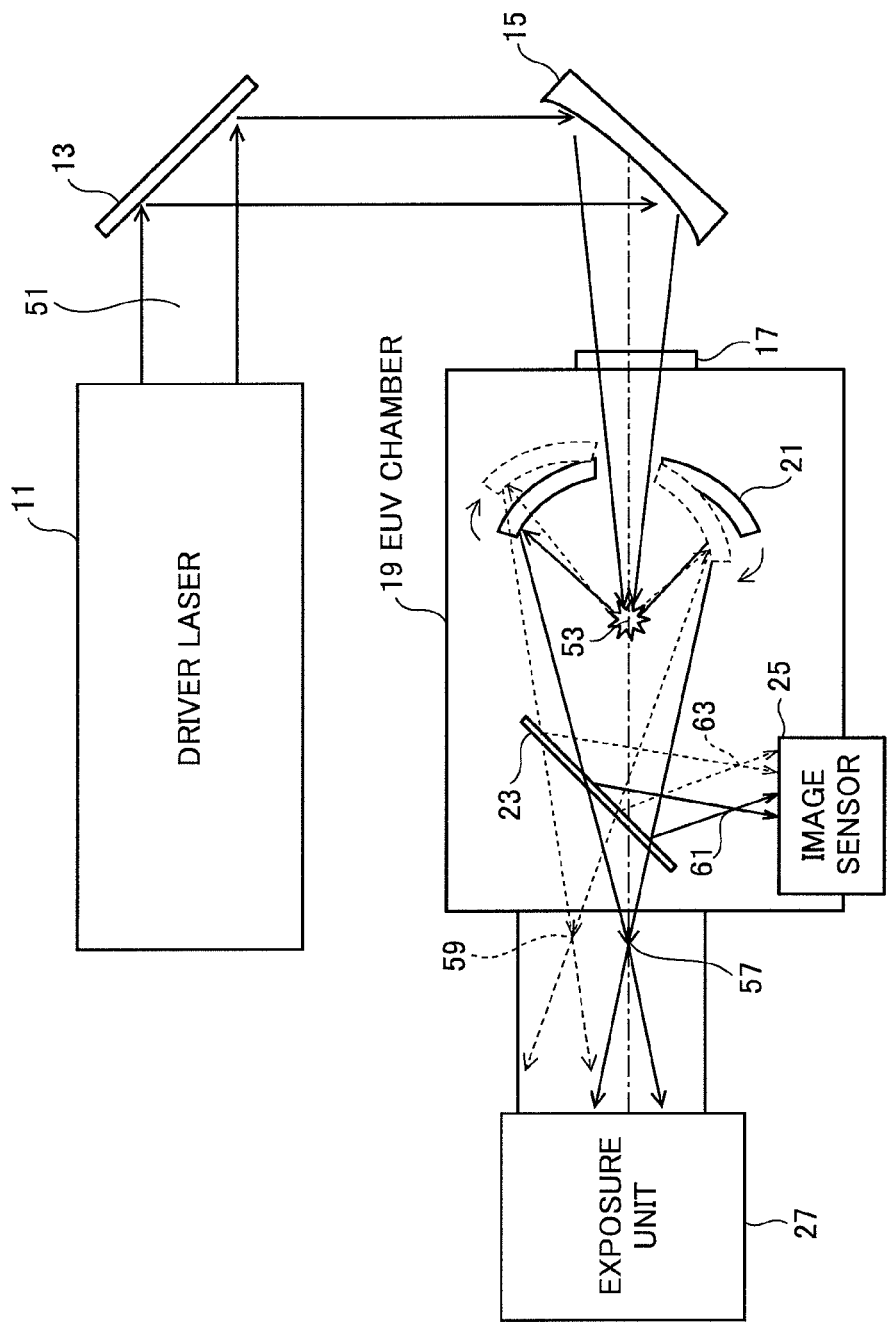
FIG. 3 is a schematic diagram showing a configuration of an EUV light source apparatus according to a first modified example of the first embodiment of the present invention.

FIG. 3 is a schematic diagram showing a configuration of an EUV light source apparatus according to a first modified example of the first embodiment of the present invention. In the first modified example of the first embodiment as shown in FIG. 3, the image sensor 25 for detecting the profile of the light split by the splitter optical element 23 is provided farther from the splitter optical element 23 than that in the first embodiment as shown in FIG. 1. Thereby, the light reflected by the splitter optical element 23 enters the detection surface of the image sensor 25 after forming the IF image at the third focal point 61. Therefore, the image sensor 25 detects a light profile (far-field pattern) in a region (far field) farther from the EUV emission point than the third focal point 61.

Figure 4:
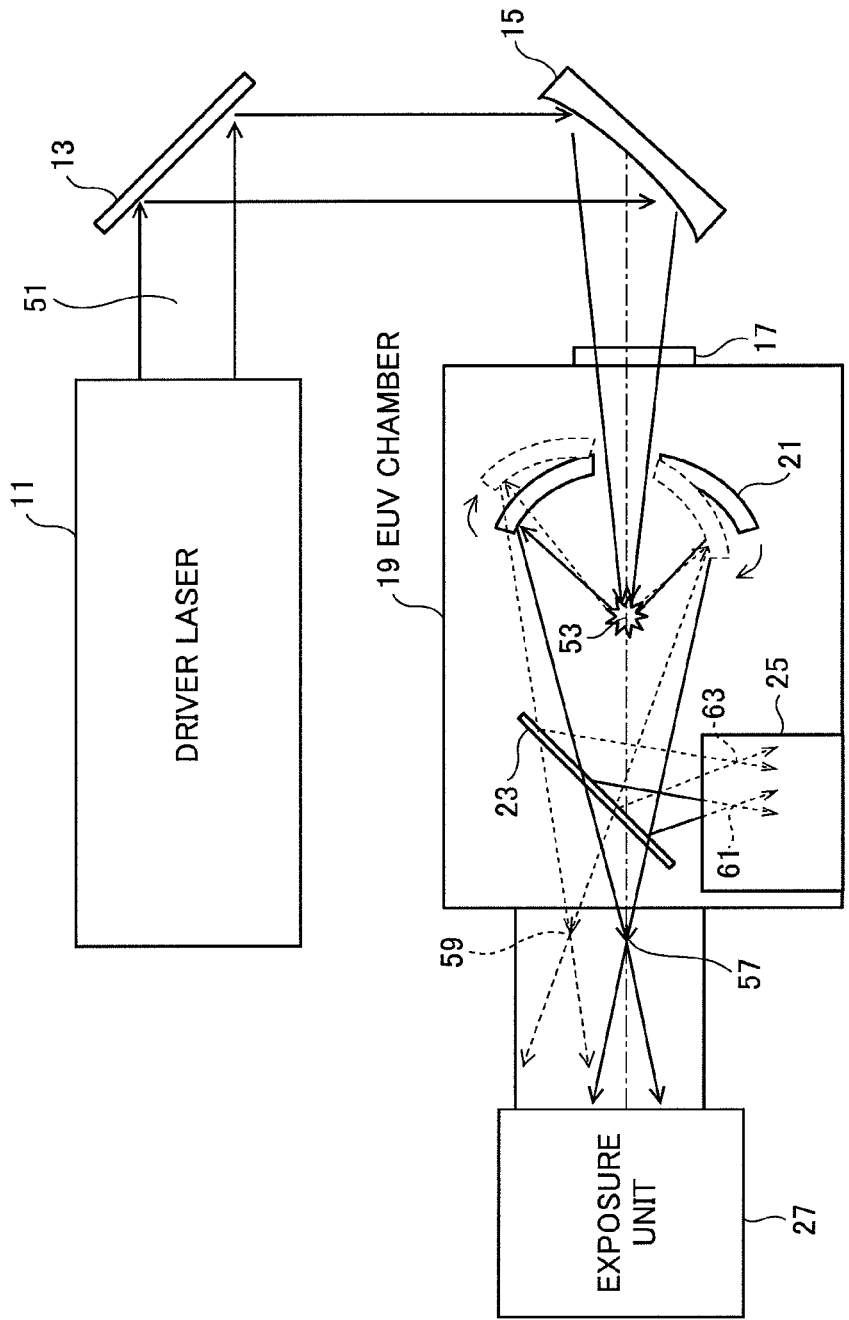
FIG. 4 is a schematic diagram showing a configuration of an EUV light source apparatus according to a second modified example of the first embodiment of the present invention.

FIG. 4 is a schematic diagram showing a configuration of an EUV light source apparatus according to a second modified example of the first embodiment of the present invention. In the second modified example of the first embodiment as shown in FIG. 4, the image sensor 25 for detecting the profile of the light split by the splitter optical element 23 is provided nearer to the splitter optical element 23 than that in the first embodiment as shown in FIG. 1. Thereby, the light reflected by the splitter optical element 23 enters the detection surface of the image sensor 25 before forming the IF image at the third focal point 61. Therefore, the image sensor 25 detects a light profile (near-field pattern) in a region (near field) nearer to the EUV emission point than the third focal point 61.

Embodiment 2

Figure 5:
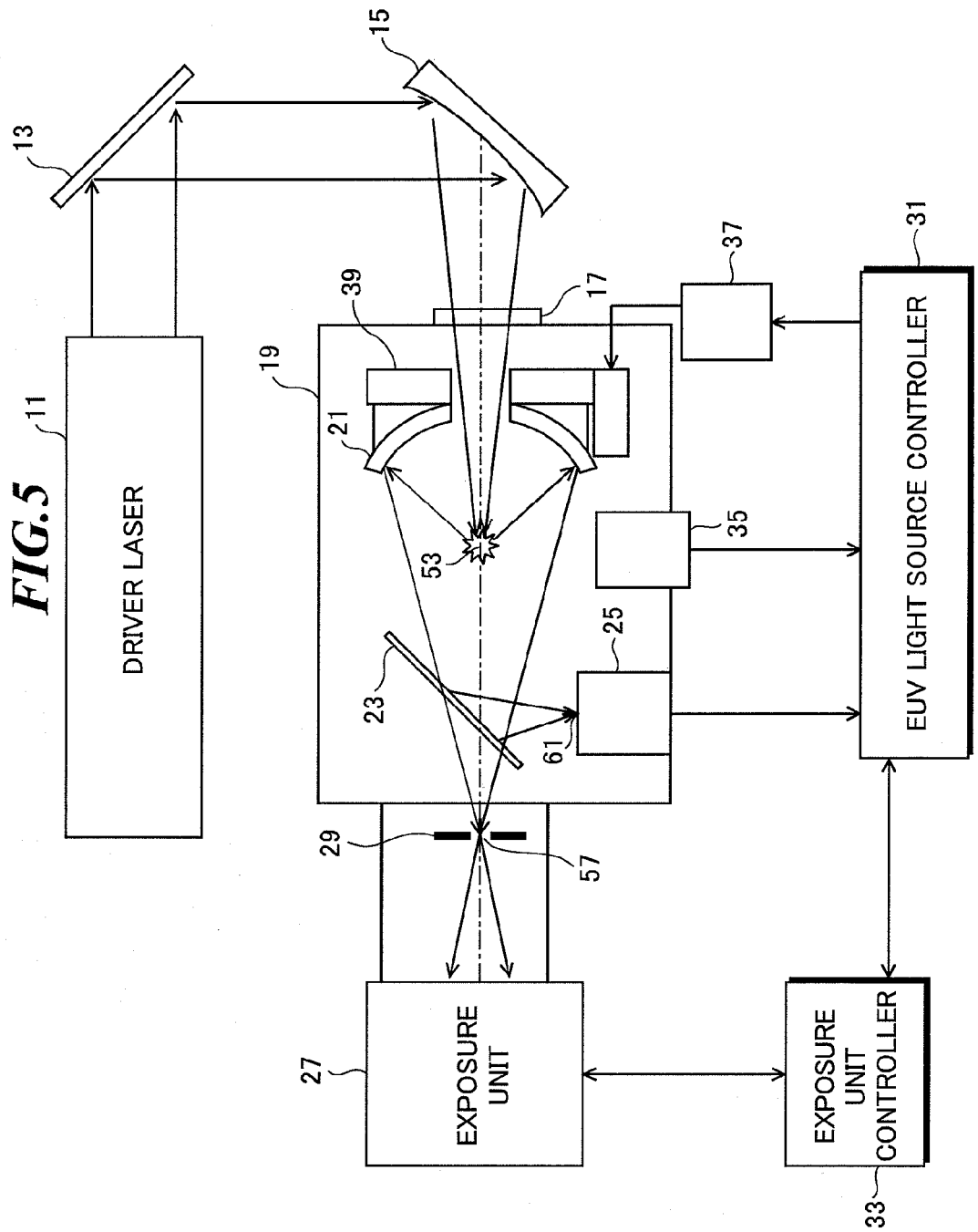
FIG. 5 is a schematic diagram showing a configuration of an EUV light source apparatus according to the second embodiment of the present invention.

FIG. 5 is a schematic diagram showing a configuration of an EUV light source apparatus according to the second embodiment of the present invention. The EUV light source apparatus according to the second embodiment includes a feedback control system for the purpose of IF image stabilization in addition to the EUV light source apparatus according to the first embodiment. In the EUV light source apparatus as shown in FIG. 5, an EUV light source controller 31, an image sensor 35, an EUV collector mirror actuator 37, and an EUV collector mirror stage 39 are added to the EUV light source apparatus as shown in FIG. 1. Further, the EUV light source controller 31 transmits and receives signals between an exposure unit controller 33 attached to the exposure unit 27 and itself.

The light reflected by the splitter optical element 23 provided between the first focal point 53 and the second focal point 57 of the EUV collector mirror 21 forms an IF image at the third focal point 63, and the image sensor 25 detects a profile (location and/or shape) of the light split by the splitter optical element 23 and outputs a detection result to the EUV light source controller 31.

The EUV light source controller 31 stores reference data representing an ideal profile (location and/or shape) of the light split by the splitter optical element 23, calculates an error between the detection result of the profile received from the image sensor 25 and the ideal profile, and performs feedback control to reduce the error, and thereby, generates a control signal for controlling the EUV collector mirror actuator 37. The MTV collector mirror actuator 37 can three-dimensionally adjust the light profile (location and/or shape) of the IF image by moving the EUV collector mirror stage 39 according to the control signal outputted from the EUV light source controller 31 to adjust the location and/or posture of the EUV collector mirror 21.

Thereby, the alignment (location and/or posture) of the EUV collector mirror 21 is adjusted so as to correct the location of the third focal point 61 at the desired location and maintain it. As a result, the EUV light transmitted through the splitter optical element 23 is focused to the intermediate focusing point (IF) in the ideal location corresponding to the light profile of the IF image on the detection surface of the image sensor 25. In addition, it is preferable to provide an IF aperture 29 at the location of the intermediate focusing point (IF) in order to secure the purity of the EUV light supplied to the exposure unit 27 and prevent the debris and gases generated within the EUV chamber 19 from entering the exposure unit 27 from the EUV chamber 19.

Here, in the case where the driver laser 11 does not accurately apply a laser beam to the target material, the above-mentioned IF image stabilizing control becomes meaningless. Accordingly, the image sensor 35 monitors the vicinity of the EUV emission point, and the EUV light source controller 31 checks the location of the emission point and the light profile. The check is performed by the EUV light source controller 31 receiving the detection result of the image sensor 35, and the above-mentioned IF image stabilizing control is performed when the location of the emission point at the EUV emission point is in the desired location.

Further, the EUV light source controller 31 outputs a normal signal, which permits the operation of the exposure unit, to the exposure unit controller 33 when the light profile of the IF image detected by the image sensor 25 is normal, and outputs an abnormal signal to the exposure unit controller 33 to cause the exposure unit controller 33 to cope with the abnormal situation when the light profile of the IF image detected by the image sensor 25 is abnormal. On the other hand, the exposure unit controller 33 outputs a signal representing an operation status of the exposure unit 27 to the EUV light source controller 31 to cause the EUV light source controller 31 to determine whether the IF image stabilizing control operation is necessary or not.

Figure 6:
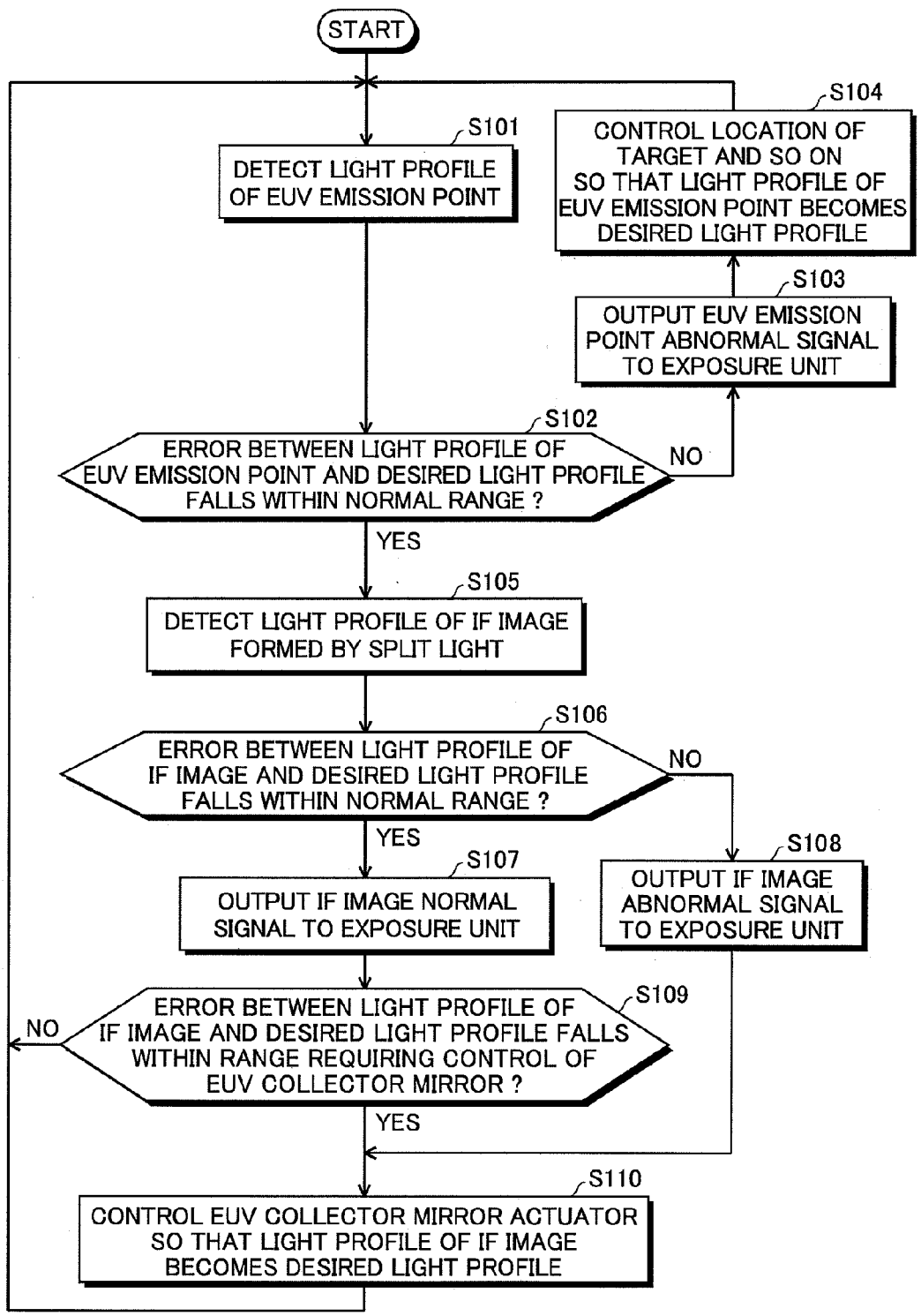
FIG. 6 is a flowchart showing an example of IF image stabilizing control operation in the second embodiment of the present invention.

FIG. 6 is a flowchart showing an example of IF image stabilizing control operation in the second embodiment of the present invention. At step S101, the image sensor 35 detects the light profile (location and/or shape) of the EUV emission point under the control of the EUV light source controller 31. At step S102, the EUV light source controller 31 compares the light profile (location and/or shape) of the EUV emission point detected by the image sensor 35 with the desired light profile (location and/or shape), and determines whether an error between them falls within a normal range or not.

In the case where at least one evaluation item (e.g., one of the location and shape) of the error of the light profile (location and/or shape) of the EUV emission point is determined to be out of the normal range, the EUV light source controller 31 issues a warning by outputting an EUV emission point abnormal signal representing the abnormality of the light profile (location and/or shape) of the EUV emission point to the exposure unit 27 via the exposure unit controller 33 at step S103, and then, controls the location of the target and the location and/or posture of the off-axis parabolic mirror 15 so that the light profile (location and/or shape) of the EUV emission point becomes the desired light profile (location and/or shape) at step S104. Then, the process returns to step S101.

On the other hand, in the case where all evaluation items (e.g., the location and shape) of the error of the light profile (location and/or shape) of the EUV emission point are determined to be within the normal range, the image sensor 25 detects the light profile (location and/or shape) of the IF image formed by the light (split light) reflected by the splitter optical element 23 under the control of the EUV light source controller 31 at step S105. At step S106, the EUV light source controller 31 compares the light profile (location and/or shape) of the IF image detected by the image sensor 25 with the desired light profile (location and/or shape), and determines whether an error between them falls within a normal range or not.

In the case where all evaluation items of the error of the light profile (location and/or shape) of the IF image are determined to be within the normal range, the EUV light source controller 31 outputs an IF image normal signal representing the normality of the light profile (location and/or shape) of the IF image to the exposure unit 27 via the exposure unit controller 33 at step S107. In the case where at least one evaluation item of the error of the light profile (location and/or shape) of the IF image is determined to be out of the normal range, the EUV light source controller 31 outputs an IF image abnormal signal representing the abnormality of the light profile (location and/or shape) of the IF image to the exposure unit 27 via the exposure unit controller 33 at step S108.

Further, at step S109, the EUV light source controller 31 determines whether an error between the light profile (location and/or shape) of the IF image and the desired light profile falls within a range requiring the control of the EUV collector mirror or not. In the case where all evaluation items of the error of the light profile (location and/or shape) of the IF image are determined to be within the desired range and the control of the EUV collector mirror is determined to be unnecessary, the EUV light source controller 31 returns the process to step S101, and monitors the abnormality in the EUV light generating operation. On the other hand, in the case where at least one evaluation item of the error of the light profile (location and/or shape) of the IF image is out of the desired range and the control of the EUV collector mirror is determined to be necessary, the process moves to step S110.

At step S110, the EUV light source controller 31 controls the EUV collector mirror actuator 37 so that the light profile (location and/or shape) of the IF image becomes the desired light profile (location and/or shape), returns the process to step S101, and monitors the abnormality in the EUV light generating operation.

Here, even when the light profile of the IF image is normal, whether the light profile falls within a range requiring the control of the EUV collector mirror or not is determined, and thereby, the EUV collector mirror can be controlled to stabilize the IF image before an abnormal signal is issued to the exposure unit. As a result, the frequency of issues of abnormal signals to the exposure unit becomes lower and the availability rate can be improved.

Specific examples of the location and shape of the light profile described in this application will be explained as below.
(1) The location of the light profile may be evaluated by the location of the center of gravity, peak location, or the center location of the section at light intensity of ($\frac{1}{2}$)P or ($1/e^2$)P of peak intensity "P".
(2) The shape of the light profile may be evaluated by the area or the maximum diameter of the section at light intensity of ($\frac{1}{2}$)P or ($1/e^2$)P of the maximum light intensity "P".

Further, the location of the light profile of the IF image may be evaluated, for example, to control the posture of the EUV collector mirror 21, and the shape of the light profile of the IF image may be evaluated, for example, to control the location of the EUV collector mirror 21 such that the area becomes the minimum.

The EUV light source apparatus according to the second embodiment has the following advantages.
(1) Even while the EUV light is supplied to the exposure unit to perform exposure, the location of IF can be stabilized and the yield of wafers or the like to be exposed is improved.
(2) When the EUV collector mirror is replaced for maintenance, alignment of a new EUV collector mirror can be automatically performed and the mirror replacement time can be shortened.
(3) Even while the EUV light is supplied to the exposure unit to perform exposure, the light intensity distribution of the IF image can be detected, and alignment of the EUV collector mirror can be stabilized at a high speed even when the alignment of the EUV collector mirror is affected by the changes of thermal load.
(4) Even while the EUV light is supplied to the exposure unit to perform exposure, the light intensity distribution of the IF image can be detected, and abnormalities that cannot be improved by controlling the location and/or posture of the EUV collector mirror can be detected.

Figure 7:
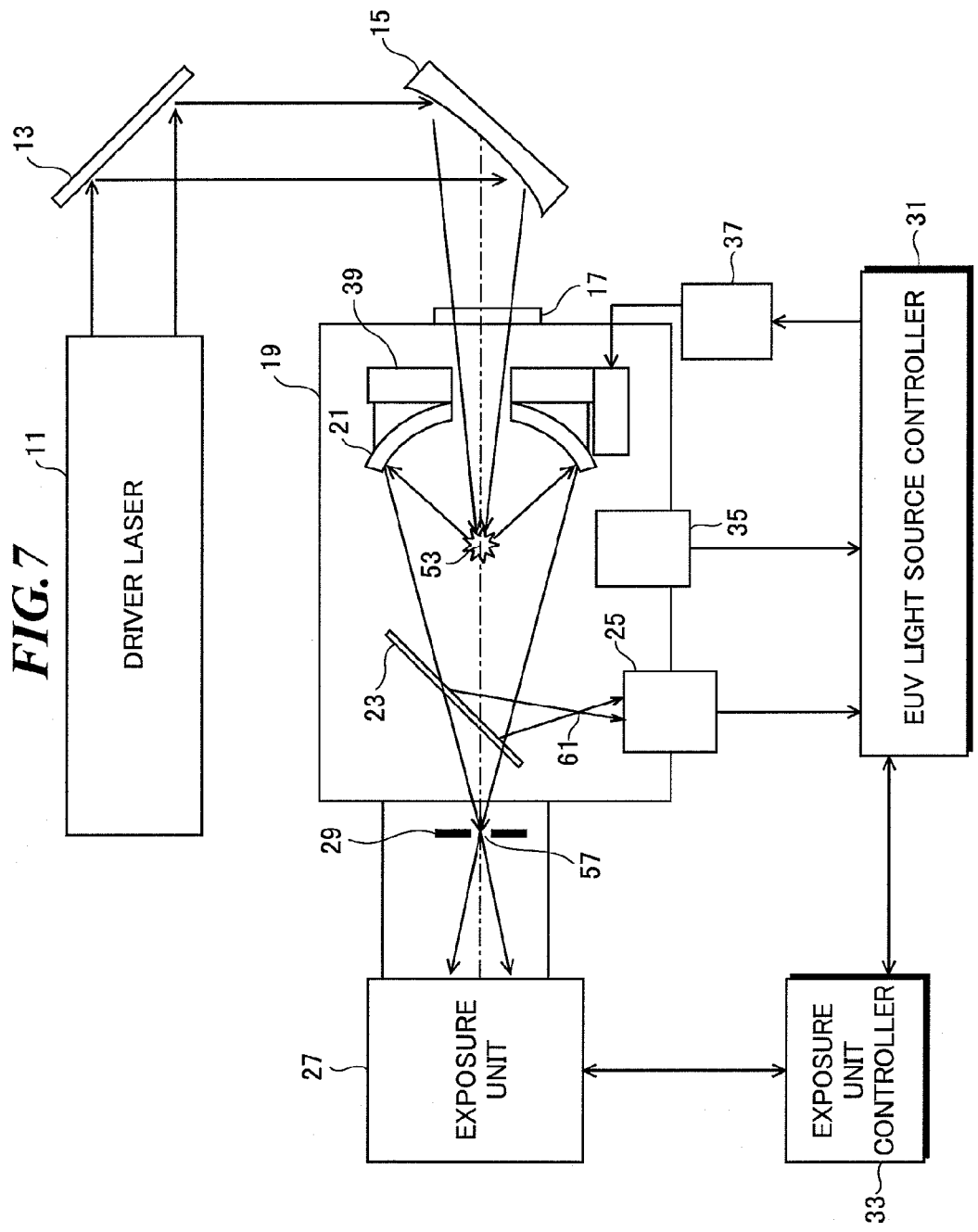
FIG. 7 is a schematic diagram showing a configuration of an EUV light source apparatus according to a modified example of the second embodiment of the present invention.

FIG. 7 is a schematic diagram showing a configuration of an EUV light source apparatus according to a modified example of the second embodiment of the present invention. In the modified example of the second embodiment as shown in FIG. 7, the image sensor 25 for detecting the profile of the light split by the splitter optical element 23 is provided farther from the splitter optical element 23 than that in the second embodiment as shown in FIG. 5. Thereby, the light reflected by the splitter optical element 23 enters the detection surface of the image sensor 25 after forming the IF image at the third focal point 61. Therefore, the image sensor 25 detects a light profile (far-field pattern) in a region (far field) farther from the EUV emission point than the third focal point 61. Alternatively, in place of detecting the far-field pattern, a light profile (near-field pattern) in a region (near field) nearer to the EUV emission point than the third focal point 61 may be detected.

Figure 8:
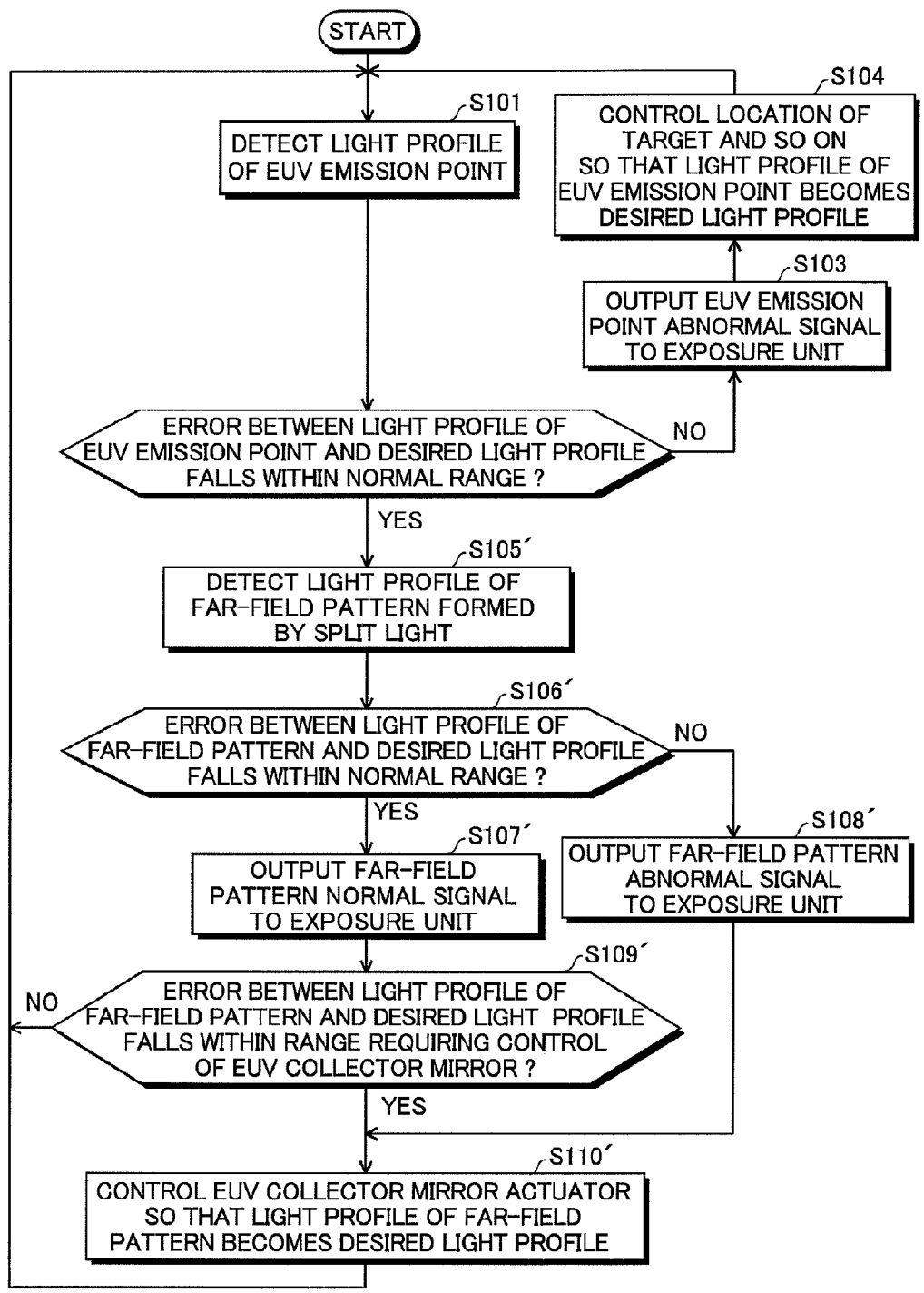
FIG. 8 is a flowchart showing an example of far-field pattern stabilizing control operation in the modified example of the second embodiment of the present invention.

FIG. 8 is a flowchart showing an example of far-field pattern stabilizing control operation in the modified example of the second embodiment of the present invention. The process to step S104 is the same as that shown in FIG. 6. At step S105', under the control of the EUV light source controller 31, the image sensor 25 detects the light profile (location and/or shape) of the far-field pattern formed by the light (split light) reflected by the splitter optical element 23. At step S106', the EUV light source controller 31 compares the light profile (location and/or shape) of the far-field pattern detected by the image sensor 25 with the desired light profile (location and/or shape), and determines whether an error between them falls within a normal range or not.

In the case where all evaluation items of the error of the light profile (location and/or shape) of the far-field pattern are determined to be within the normal range, the EUV light source controller 31 outputs a far-field pattern normal signal representing the normality of the light profile (location and/or shape) of the far-field pattern to the exposure unit 27 via the exposure unit controller 33 at step S107'. In the case where at least one evaluation item of the error of the light profile (location and/or shape) of the far-field pattern is determined to be out of the normal range, the EUV light source controller 31 outputs a far-field pattern abnormal signal representing the abnormality of the light profile (location and/or shape) of the far-field pattern to the exposure unit 27 via the exposure unit controller 33 at step S108'.

Further, at step S109', the EUV light source controller 31 determines whether an error between the light profile (location and/or shape) of the far-field pattern and the desired light profile falls within a range requiring the control of the EUV collector mirror or not. In the case where all evaluation items of the error of the light profile (location and/or shape) of the far-field pattern are determined to be within the desired range and the control of the EUV collector mirror is determined to be unnecessary, the EUV light source controller 31 returns the process to step S101, and monitors the abnormality in the EUV light generating operation. On the other hand, in the case where at least one evaluation item of the error of the light profile (location and/or shape) of the far-field pattern is out of the desired range and the control of the EUV collector mirror is determined to be necessary, the process moves to step S110'.

At step S110', the EUV light source controller 31 controls the EUV collector mirror actuator 37 so that the light profile (location and/or shape) of the far-field pattern becomes the desired light profile (location and/or shape). And then, the process returns to step S101, and the EUV light source controller 31 monitors the abnormality in the EUV light generating operation.

FIGS. 9-23 are diagrams for explanation of various splitter optical elements available for the present invention. The splitter optical element 23 is an optical element for guiding a part of the EUV light, which is included in the light reflected by the EUV collector mirror 21, to the exposure unit 27, and guiding another part of the EUV light or light having other wavelengths to the image sensor 25.

When the target is irradiated with a laser beam, plasma is generated. From the plasma, not only the EUV light having a wavelength of 13.5 nm to be used in the exposure unit 27 but also various kinds of light including EUV light having other wavelengths, VUV (vacuum ultraviolet) light, DUV (deep ultraviolet) light, visible light, infrared light, and so on are emitted. However, when the EUV light having a wavelength of 13.5 nm mixed with the light having other wavelengths enters the exposure unit and projection and exposure of a mask pattern are performed, the condition of image formation in photolithography becomes deteriorated. Accordingly, a spectral purity filter (SPF) for transmitting only the EUV light having a wavelength of 13.5 nm is provided in an optical path of the EUV light, and thereby, the light other than the EUV light having a wavelength of 13.5 nm is cut.

Figure 9:
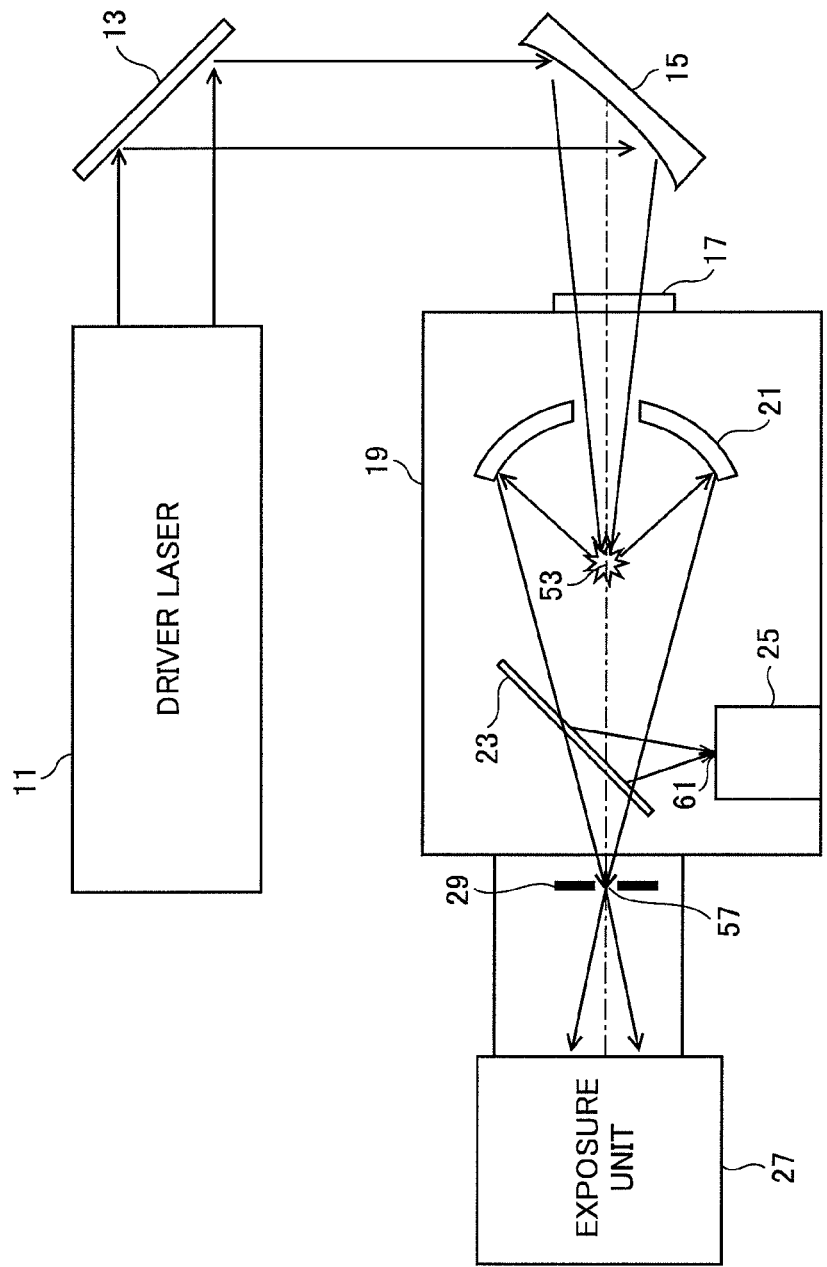
FIG. 9 is a schematic diagram showing a configuration of an EUV light source apparatus according to the first example using a spectral purity filter (SPF) of thin-film type as a splitter optical element.

FIG. 9 is a schematic diagram showing a configuration of an EUV light source apparatus according to the first example using a spectral purity filter of thin-film type as a splitter optical element. In the first example, as the splitter optical element 23, a spectral purity filter (SPF) of thin-film type for EUV light is used. For example, among SPFs supplied by LUXEL CORPORATION, there is an SPF including a multilayer-film of silicon (Si) having a thickness of 500 angstroms, zirconium (Zi) having a thickness of 500 angstroms, and silicon (Si) having a thickness of 500 angstroms with a grid mesh attached thereto. In the SPF, the transmittance of EUV light having a wavelength of 13.5 nm is about 50%.

In the first example, as the splitter optical element 23, the above-mentioned thin-film type SPF is provided in an optical path between the first focal point 53 and the second focal point (IF) 57 of the EUV collector mirror 21, and the thin-film type SPF transmits the EUV light having a wavelength of 13.5 nm to allow it to enter the exposure unit 27. On the other hand, the light having other wavelengths is reflected by the surface of the thin-film type SPF. However, the thin-film type SPF also reflects about several percents of the EUV light having a wavelength of 13.5 nm by the grid. The reflected EUV light having a wavelength of 13.5 nm forms an IF image at the third focal point 61, and the image sensor 25 detects the light profile (location and/or shape) of the IF image. On the other hand, in place of the EUV light having a wavelength of 13.5 nm, the light having other wavelengths may be used for detection of the IF image. Especially, in the case of using a reflective optics, the light may be selected relatively freely for use in detection of the IF image because the amount of change of image formation location depending on the wavelength is small.

As a modified example of the first example, the image sensor 25 for detecting the profile of the light split by the splitter optical element (thin-film type SPF) 23 may be provided farther from the splitter optical element 23 than that in the first example as shown in FIG. 9. Thereby, the light reflected by the splitter optical element 23 enters the detection surface of the image sensor 25 after forming the IF image at the third focal point 61. Therefore, the image sensor 25 detects a light profile (far-field pattern) in a region (far field) farther from the EUV emission point than the third focal point 61. Alternatively, in place of detecting the far-field pattern, a light profile (near-field pattern) in a region (near field) nearer to the EUV emission point than the third focal point 61 may be detected.

Figure 10:
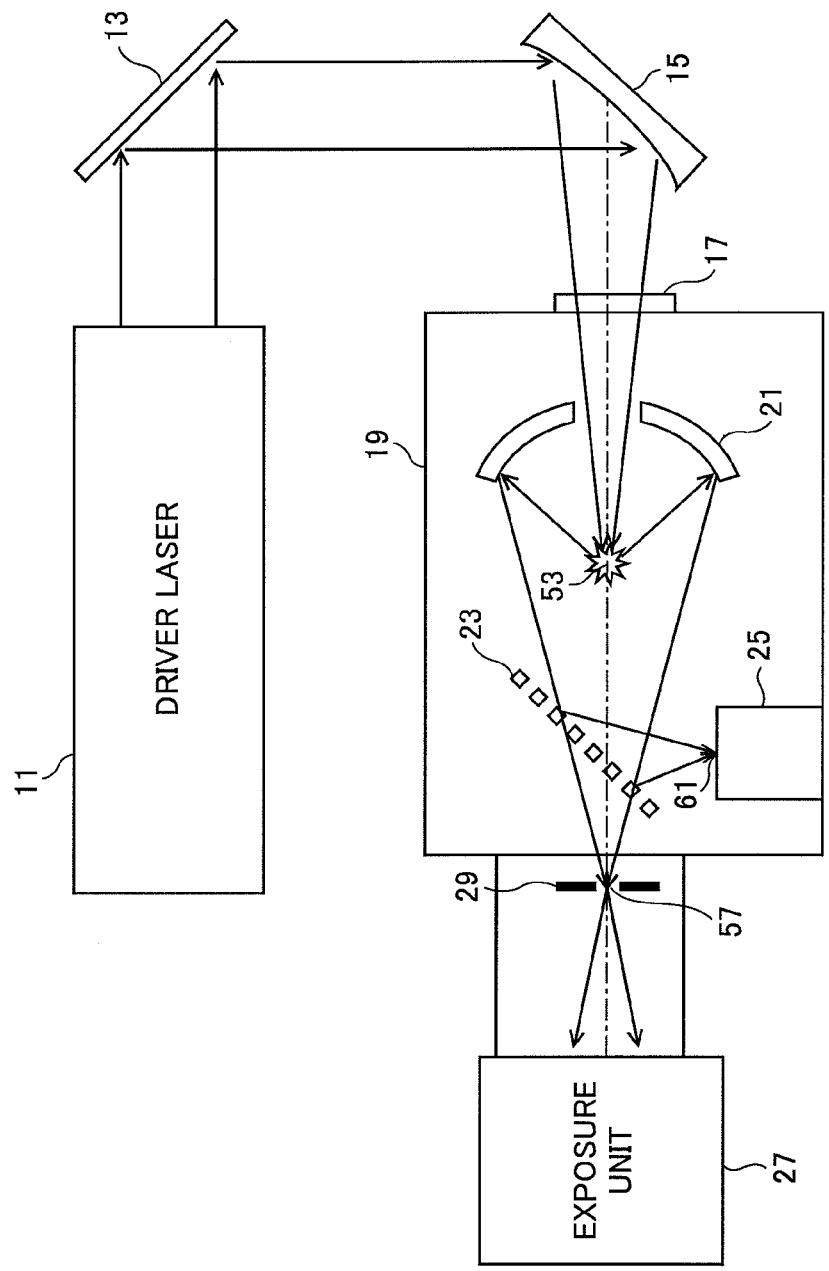
FIG. 10 is a schematic diagram showing a configuration of an EUV light source apparatus according to the second example using an SPF of grid type as a splitter optical element.
Figure 11:
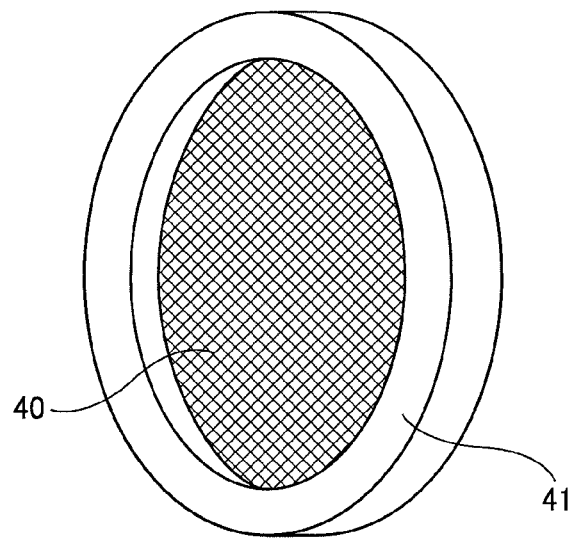
FIG. 11 is a perspective view of the SPF of grid type.
Figure 12:
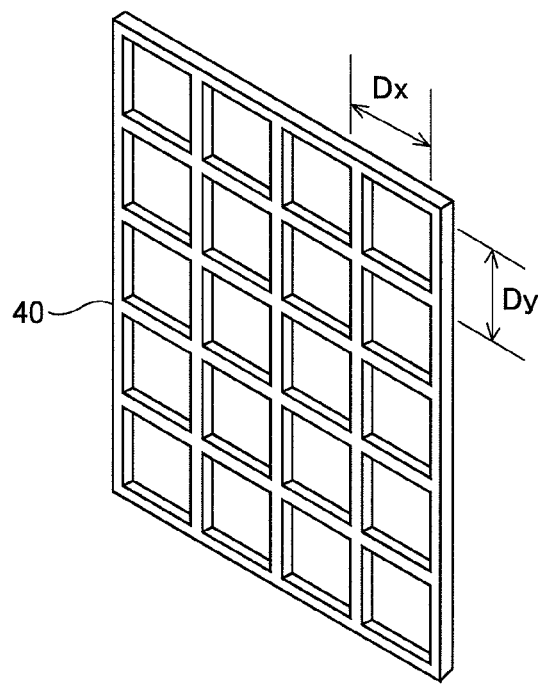
FIG. 12 is an enlarged perspective view showing a grid part of the SPF of grid type.

FIG. 10 is a schematic diagram showing a configuration of an EUV light source apparatus according to the second example using an SPF of grid type as a splitter optical element, FIG. 11 is a perspective view of the SPF of grid type, and FIG. 12 is an enlarged perspective view showing a grid part of the SPF of grid type.

As shown in FIGS. 11 and 12, the splitter optical element (grid type SPF) 23 to be used in the second example is fabricated by fixing a grid 40, in which an opening arrangement is formed, to a frame 41. The grid 40 is formed of a material having conductivity such as a metal, or formed by coating at least the light incident side surface with a material having conductivity. Given that the arrangement pitch of openings (grid interval) is "D" and the wavelength of incident light is "λ", the splitter optical element (grid type SPF) 23 can be used as a filter for transmitting the incident light when λ<2D and totally reflecting the incident light when λ≧2D. Accordingly, in the grid 40 as shown in FIG. 12, the lateral grid interval Dx and the longitudinal grid interval Dy are set to values larger than a half of the wavelength of 13.5 nm of the EUV light.

As shown in FIG. 10, the splitter optical element 23 is provided in an optical path between the first focal point 53 and the second focal point (IF) 57 of the EUV collector mirror 21, and transmits the EUV light having the wavelength of 13.5 nm smaller than twice the grid intervals Dx, Dy to allow it to enter the exposure unit 27. On the other hand, the light having wavelengths equal to or more than twice the grid intervals Dx, Dy is totally reflected by the surface of the splitter optical element 23.

For example, in the case where the driver laser 11 is a $CO_2$ laser that generates a laser beam having a wavelength of 10.6 μm, the laser beam can be totally reflected by a grid fabricated to have grid intervals Dx, Dy of 5.3 μm. The grid may be fabricated at an aperture ratio of about 70% to 90%. The reflected light forms an IF image at the third focal point 61, and the image sensor 25 detects the light profile (location and/or shape) of the IF image. However, the grid type SPF also reflects about several percents of the EUV light having a wavelength of 13.5 nm, so the light profile (location and/or shape) of the IF image may be detected by using the EUV light.

As a modified example of the second example, the image sensor 25 for detecting the profile of the light split by the splitter optical element (grid type SPF) 23 may be provided farther from the splitter optical element 23 than that in the second example as shown in FIG. 10. Thereby, the light reflected by the splitter optical element 23 enters the detection surface of the image sensor 25 after forming the IF image at the third focal point 61. Therefore, the image sensor 25 detects a light profile (far-field pattern) in a region (far field) farther from the EUV emission point than the third focal point 61. Alternatively, in place of detecting the far-field pattern, a light profile (near-field pattern) in a region (near field) nearer to the EUV emission point than the third focal point 61 may be detected.

Figure 13:
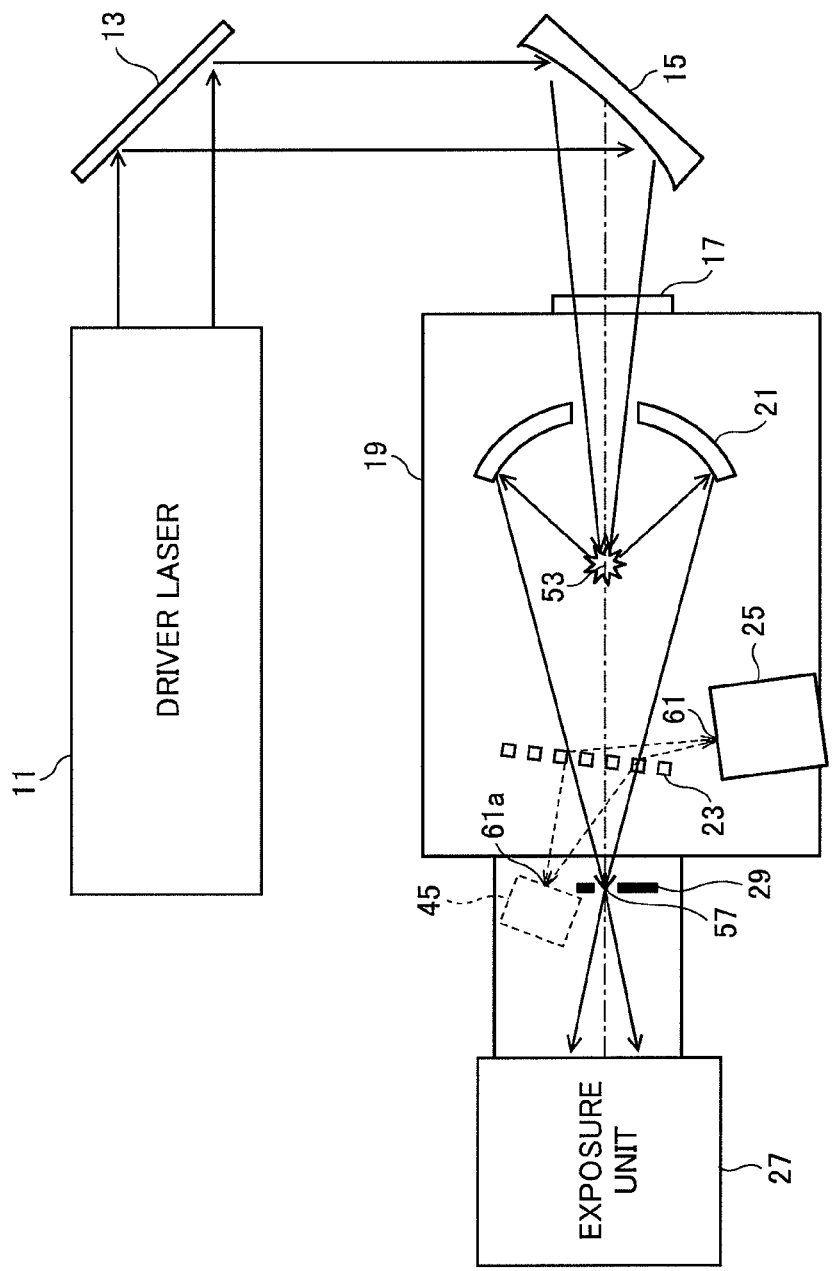
FIG. 13 is a schematic diagram showing a configuration of an EUV light source apparatus according to the third example using an SPF of grid type as a splitter optical element.

FIG. 13 is a schematic diagram showing a configuration of an EUV light source apparatus according to the third example using an SPF of grid type as a splitter optical element. The difference from the second example as shown in FIG. 10 is that an IF image formed by light diffracted by the grid type SPF is used.

The grid also has a function of a diffraction grating for the light having a shorter wavelength than twice the grid interval "D". Accordingly, in the third example, the image sensor 25 detects the IF image formed at the third focal point 61 by the diffracted light reflected by the grid of the splitter optical element 23. Alternatively, an image sensor 45 detects an IF image formed at the third focal point 61a by diffracted light transmitted through the grid of the splitter optical element 23.

The light to be detected by the image sensor 25 or 45 may be EUV light having a wavelength of 13.5 nm, or a $CO_2$ laser beam having a wavelength of 10.6 μm. As is the case in the second example, in the case where the driver laser 11 is a $CO_2$ laser that generates a laser beam having a wavelength of 10.6 μm, the $CO_2$ laser beam can be totally reflected by using a grid type SPF having a grid interval "D" of 5.3 μm or less. Further, the grid may be fabricated at an aperture ratio of about 70% to 90%.

As a modified example of the third example, the image sensor 25 for detecting the profile of the light split by the splitter optical element (grid type SPF) 23 may be provided farther from the splitter optical element 23 than that in the third example as shown in FIG. 13. Thereby, the light diffracted by the splitter optical element 23 enters the detection surface of the image sensor 25 after forming the IF image at the third focal point 61 or 61a. Therefore, the image sensor 25 detects a light profile (far-field pattern) in a region (far field) farther from the EUV emission point than the third focal point 61 or 61a. Alternatively, in place of detecting the far-field pattern, a light profile (near-field pattern) in a region (near field) nearer to the EUV emission point than the third focal point 61 or 61a may be detected.

Figure 14:
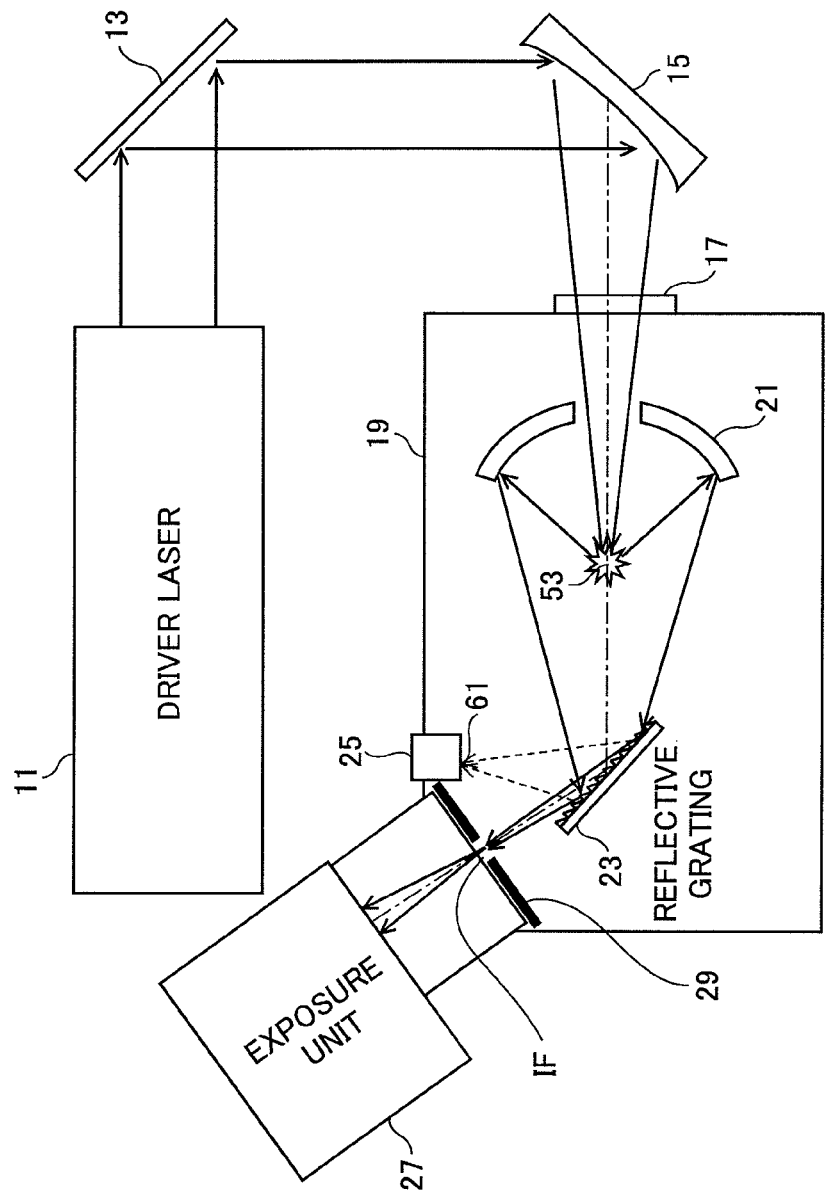
FIG. 14 is a schematic diagram showing a configuration of an EUV light source apparatus according to the fourth example using an SPF of reflective grating as a splitter optical element.
Figure 15:
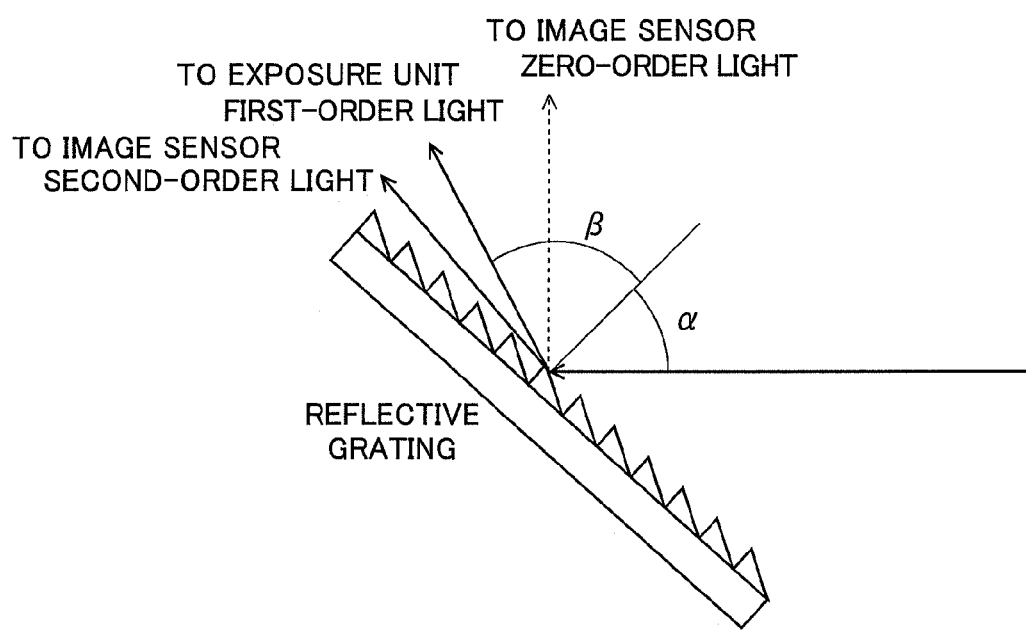
FIG. 15 is a diagram for explanation of a spectroscopic principle of a grating.

FIG. 14 is a schematic diagram showing a configuration of an EUV light source apparatus according to the fourth example using an SPF of reflective grating as a splitter optical element, and FIG. 15 is a diagram for explanation of a spectroscopic principle of a grating.

Referring to FIG. 15, in spectrum-separation using a grating, the following equation holds between an incident angle "a" and a diffraction angle "β".

$$m\lambda = A(\sin \alpha \pm \sin \beta)$$

where "m" is an order of diffraction, "λ" is a wavelength, and "A" is a grating spacing (lattice constant).

When light enters a reflective grating, zero-order light is reflected at the same reflection angle as the incident angle "α" regardless of wavelengths. On the other hand, as to the diffracted light, the diffraction angle "β" becomes larger. Further, the diffraction angle "β" becomes larger as the wavelength "λ" of the incident light becomes longer. Accordingly, using the principle, only the diffracted light having a wavelength of 13.5 nm is allowed to enter the exposure unit, and the zero-order light (reflected light) having a wavelength of 13.5 nm or other wavelengths can be split.

As shown in FIG. 14, the splitter optical element (reflective grating) 23 is provided in the optical path of the light reflected by the EUV collector mirror 21 such that the incident angle is 45 degrees. Further, the first-order diffracted light having a wavelength of 13.5 nm passes through the opening of the IF aperture 29 provided at the intermediate focusing point (IF) and enters the exposure unit 27. On the other hand, the zero-order light reflected at the reflection angle of 45 degrees by the splitter optical element (reflective grating) 23 includes the EUV light having a wavelength of 13.5 nm and light having other wavelengths. The zero-order light forms an IF image at the third focal point 61, and the image sensor 25 detects the location and/or shape of the IF image. Although the image sensor 25 detects the zero-order light in the example, the present invention is not limited to the example, but the image sensor 25 may detect diffracted light of the other order (e.g., second-order) (see FIG. 15).

As a modified example of the fourth example, the image sensor 25 for detecting the profile of the light split by the splitter optical element (reflective grating) 23 may be provided farther from the splitter optical element 23 than that in the fourth example as shown in FIG. 14. Thereby, the light reflected by the splitter optical element 23 enters the detection surface of the image sensor 25 after forming the IF image at the third focal point 61. Therefore, the image sensor 25 detects a light profile (far-field pattern) in a region (far field) farther from the EUV emission point than the third focal point 61. Alternatively, in place of detecting the far-field pattern, a light profile (near-field pattern) in a region (near field) nearer to the EUV emission point than the third focal point 61 may be detected.

Figure 16:
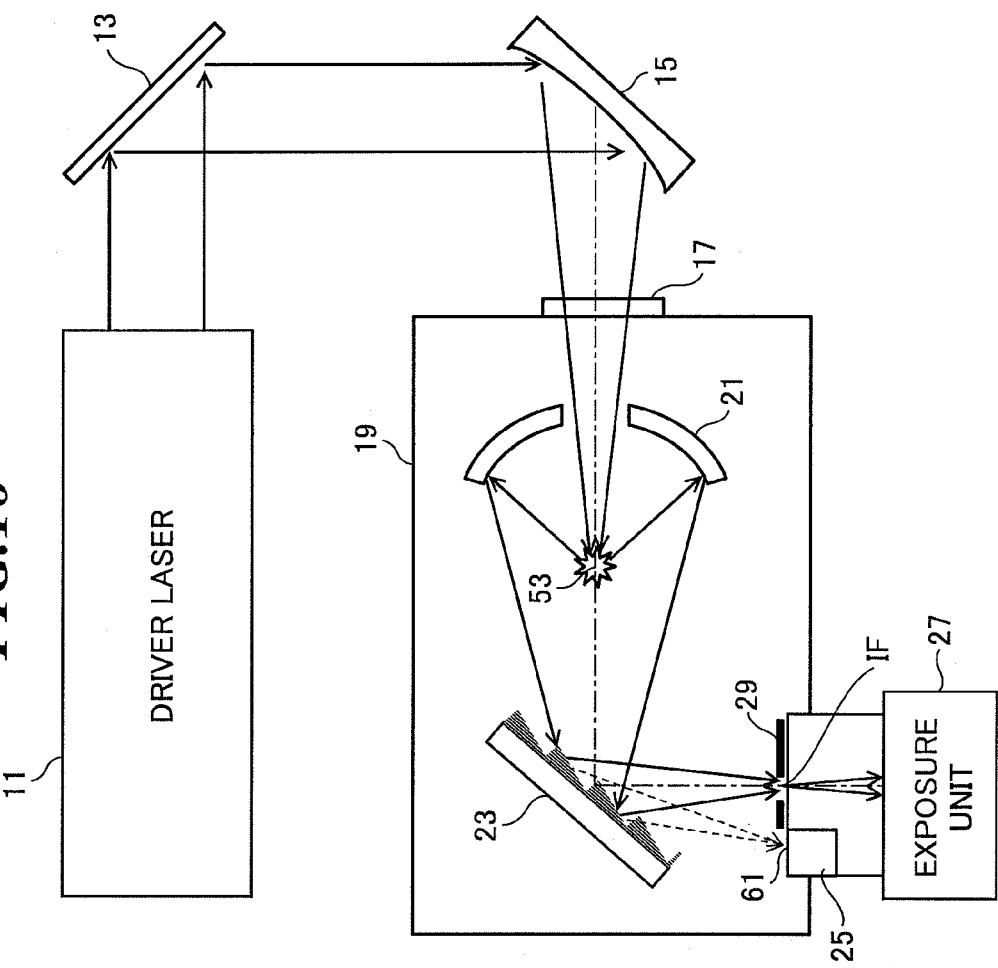
FIG. 16 is a schematic diagram showing a configuration of an EUV light source apparatus according to the fifth example using an SPF of multilayer-coating brazed type as a splitter optical element.
Figure 17:
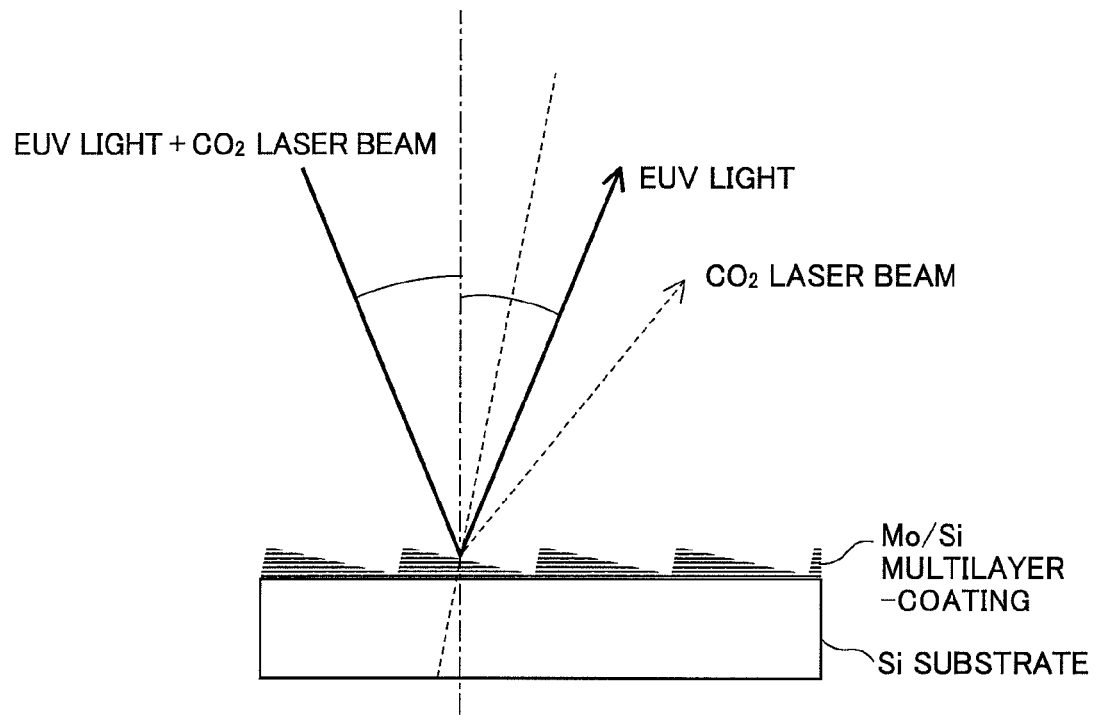
FIG. 17 is a diagram for explanation of a spectroscopic principle of the SPF of multilayer-coating brazed type.

FIG. 16 is a schematic diagram showing a configuration of an EUV light source apparatus according to the fifth example using an SPF of multilayer-coating brazed type as a splitter optical element, and FIG. 17 is a diagram for explanation of a spectroscopic principle of the SPF of multilayer-coating brazed type.

Referring to FIG. 17, a multilayer-coating of molybdenum (Mo)/silicon (Si) that reflects EUV light having a wavelength of 13.5 nm at a high reflectance is coated onto a silicon (Si) substrate, and then, the multilayer-coating is etched to have a saw-tooth shape, and thereby, an SPF of multilayer-coating brazed type is fabricated. In the SPF of multilayer-coating brazed type fabricated in this manner, the EUV light having a wavelength of 13.5 nm is specularly reflected at a reflection angle same as the incident angle by the multilayer-coating. On the other hand, the light having other wavelengths (e.g., $CO_2$ laser beam) is specularly reflected relative to the brazed surface, and thus, the light is reflected at an angle larger by the brazed angle. In this way, by brazing the multilayer-coating, the EUV light having a wavelength of 13.5 nm and the light having other wavelengths can be separated. By using the principle, only the EUV light having a wavelength of 13.5 nm can be allowed to enter the exposure unit.

As shown in FIG. 16, the splitter optical element (SPF of multilayer-coating brazed type) 23 is provided in the optical path of the light reflected by the EUV collector mirror 21 such that the incident angle is 45 degrees. The EUV light having a wavelength of 13.5 nm is reflected at the reflection angle of 45 degrees by the splitter optical element (SPF of multilayer-coating brazed type) 23, and the reflected light passes through the opening of the IF aperture 29 provided at the intermediate focusing point (IF) to enter the exposure unit 27. On the other hand, the light having other wavelengths reflected by the brazed surface forms an IF image at the third focal point 61, and the image sensor 25 detects the light profile (location and/or shape) of the IF image.

As a modified example of the fifth example, the image sensor 25 for detecting the profile of the light split by the splitter optical element (SPF of multilayer-coating brazed type) 23 may be provided farther from the splitter optical element 23 than that in the fifth example as shown in FIG. 16. Thereby, the light reflected by the splitter optical element 23 enters the detection surface of the image sensor 25 after forming the IF image at the third focal point 61. Therefore, the image sensor 25 detects a light profile (far-field pattern) in a region (far field) farther from the EUV emission point than the third focal point 61. Alternatively, in place of detecting the far-field pattern, a light profile (near-field pattern) in a region (near field) nearer to the EUV emission point than the third focal point 61 may be detected.

Figure 18:
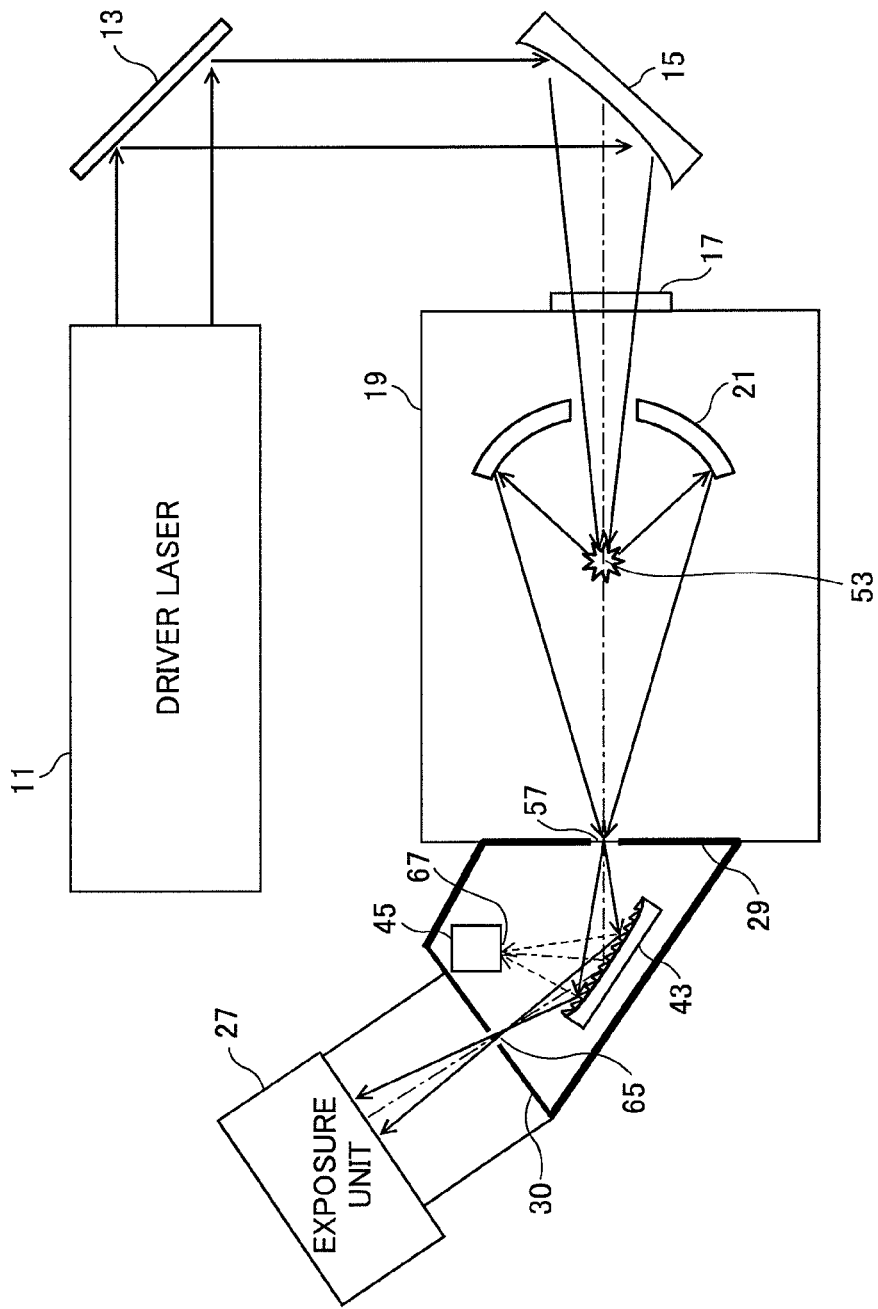
FIG. 18 is a schematic diagram showing a configuration of an EUV light source apparatus according to the sixth example using an SPF of spheroidal reflective grating as a splitter optical element.

FIG. 18 is a schematic diagram showing a configuration of an EUV light source apparatus according to the sixth example using an SPF of spheroidal reflective grating type as a splitter optical element. In this example, an SPF of spheroidal reflective grating having a function of a grating and obtained by forming grooves on the surface of a spheroidal mirror is used. The spheroidal reflective grating has two focal points. By placing the spheroidal reflective grating so that the location of the first focal point of the spheroidal reflective grating coincides with the location of the second focal point (first intermediate focusing point) 57 of the EUV collector mirror 21, an IF image can be formed at the location of the second focal point 67 of the spheroidal reflective grating.

As shown in FIG. 18, when the target is irradiated with a $CO_2$ laser beam at the first focal point 53 of the EUV collector mirror 21, plasma is generated and EUV light having a wavelength of 13.5 nm and light having other wavelengths are radiated from the plasma. The EUV collector mirror 21 reflects the light radiated from the plasma, and thereby, a first emission point image is formed in an opening of a first IF aperture 29 provided at the second focal point (a first intermediate focusing point) 57 of the EUV collector mirror 21.

Further, by the splitter optical element (SPF of spheroidal reflective grating type) 43, the EUV light having a wavelength of 13.5 nm as first-order diffracted light forms a second emission point image in an opening of a second IF aperture 30 provided at the focal point of the diffracted light of the spheroidal reflective grating (a second intermediate focusing point) 65, and the EUV light passing through the opening of the second IF aperture 30 is allowed to enter the exposure unit 27. The opening of the first IF aperture 29 is formed slightly larger than the opening of the second IF aperture 30.

On the other hand, a part of the EUV light having a wavelength of 13.5 nm and the light having other wavelengths are reflected by the splitter optical element (SPF of spheroidal reflective grating type) 43 and split, the split light (zero-order light) forms an IF image at the location of the second focal point 67 of the spheroidal reflective grating, and the image sensor 45 detects a light profile (location and/or shape) of the IF image. The IF image is observed as a projection of the second emission point image at the second intermediate focusing point 65, and therefore, the IF image can be used for adjustment of the location and/or posture of the optics forming the second emission point image.

As a modified example of the sixth example, the image sensor 45 for detecting the profile of the light split by the splitter optical element (SPF of spheroidal reflective grating type) 43 may be provided farther from the splitter optical element 43 than that in the sixth example as shown in FIG. 18. Thereby, the light reflected by the splitter optical element 43 enters the detection surface of the image sensor 45 after forming the IF image at the second focal point 67 of the spheroidal reflective grating. Therefore, the image sensor 45 detects a light profile (far-field pattern) in a region (far field) farther from the EUV emission point than the focal point 67. Alternatively, in place of detecting the far-field pattern, a light profile (near-field pattern) in a region (near field) nearer to the EUV emission point than the focal point 67 may be detected.

Figure 19:
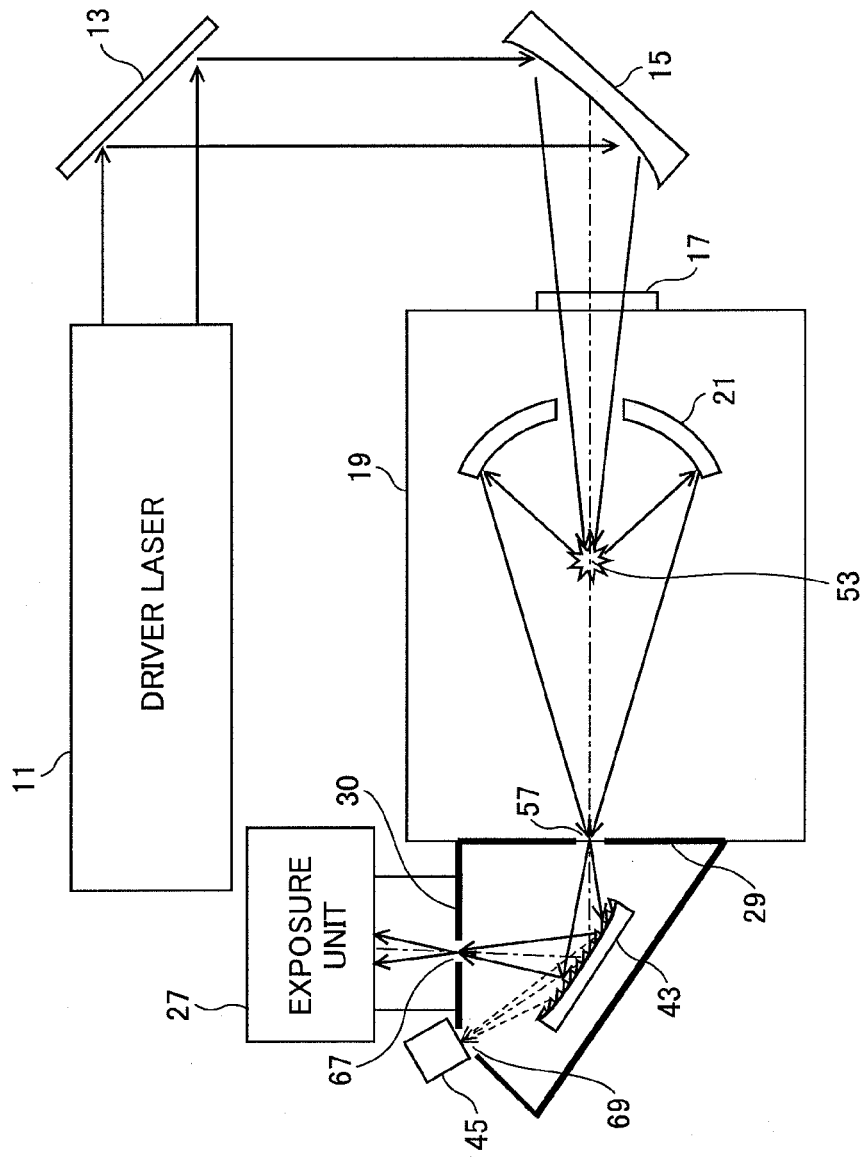
FIG. 19 is a schematic diagram showing a configuration of an EUV light source apparatus according to the seventh example using an SPF of spheroidal multilayer-coating brazed type as a splitter optical element.

FIG. 19 is a schematic diagram showing a configuration of an EUV light source apparatus according to the seventh example using an SPF of spheroidal multilayer-coating brazed type as a splitter optical element. In the example, an SPF of spheroidal multilayer-coating brazed type (hereinafter, also referred to as "spheroidal multilayer-coating mirror") is used. The spheroidal multilayer-coating mirror is fabricated by coating a multilayer-coating of molybdenum (Mo)/silicon (Si) same as that shown in FIG. 17 onto a spheroidal mirror, and then, etching the multilayer-coating such that a predetermined brazed angle is formed. The EUV light having a wavelength of 13.5 nm is specularly reflected by the multilayer-coating with respect to the surface of the spheroidal multilayer-coating mirror. On the other hand, the light having other wavelengths is specularly reflected with respect to the brazed surface, and thus, the light is reflected at an angle larger by the brazed angle. By placing the spheroidal multilayer-coating mirror so that the location of the first focal point of the spheroidal multilayer-coating mirror coincides with the location of the second focal point (the first intermediate focusing point) 57 of the EUV collector mirror 21, an emission point image can be formed at the location of the second focal point 67 of the spheroidal multilayer-coating mirror.

As shown in FIG. 19, when the target is irradiated with a CO2 laser beam at the location of the first focal point 53 of the EUV collector mirror 21, plasma is generated and EUV light having a wavelength of 13.5 nm and light having other wavelengths are radiated from the plasma. The EUV collector mirror 21 reflects the light radiated from the plasma, and thereby, the first emission point image is formed in the opening of the first IF aperture 29 provided at the second focal point of the EUV collector mirror 21 (the first intermediate focusing point) 57.

Further, by the splitter optical element (spheroidal multilayer-coating mirror) 43, the EUV light having a wavelength of 13.5 nm as reflected light by the spheroidal surface forms the second emission point image in the opening of the second IF aperture 30 provided at the second focal point of the spheroidal multilayer-coating mirror (the second intermediate focusing point) 67, and the EUV light passing through the opening of the second IF aperture 30 is allowed to enter the exposure unit 27. The opening of the first IF aperture 29 is formed slightly larger than the opening of the second IF aperture 30.

On the other hand, light other than the light having a wavelength of 13.5 nm as the reflected light by the brazed surface of the splitter optical element (spheroidal multilayer-coating mirror) 43 is split, the split light forms an IF image at a location of a focal point 69 of the reflected light by the brazed surface, and an image sensor 45 detects a light profile (location and/or shape) of the IF image. The IF image is observed as a projection of the second emission point image at the second intermediate focusing point 67, and thus, the IF image can be used for adjustment of the location and/or posture of the optics forming the second emission point image.

As a modified example of the seventh example, the image sensor 45 for detecting the profile of the light split by the splitter optical element (spheroidal multilayer-coating mirror) 43 may be provided farther from the splitter optical element 43 than that in the seventh example as shown in FIG. 19. Thereby, the light reflected by the brazed surface of the spheroidal multilayer-coating mirror enters the detection surface of the image sensor 45 after forming the IF image at the focal point 69 of the reflected light by the brazed surface. Therefore, the image sensor 45 detects a light profile (far-field pattern) in a region (far field) farther from the EUV emission point than the focal point 69. Alternatively, in place of detecting the far-field pattern, a light profile (near-field pattern) in a region (near field) nearer to the EUV emission point than the focal point 69 may be detected.

Figure 20:
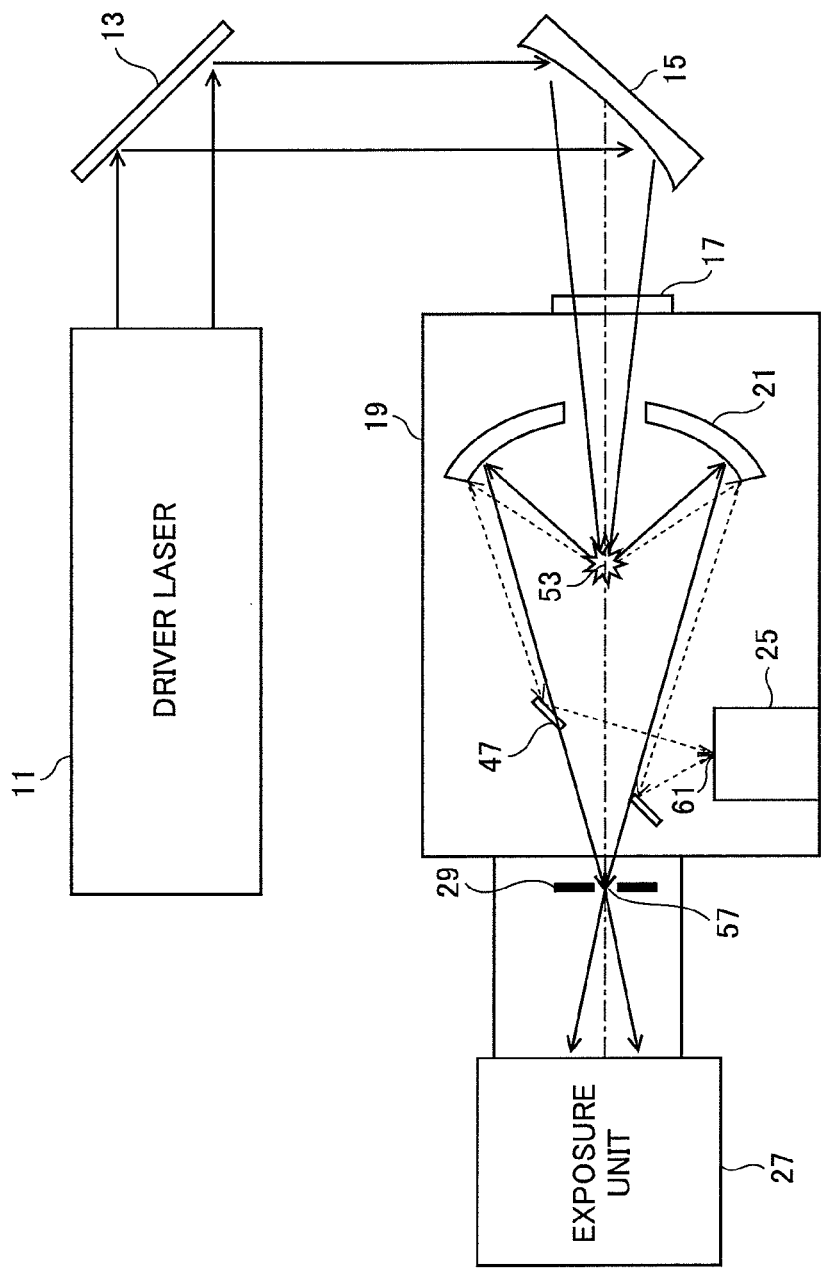
FIG. 20 is a schematic diagram showing a configuration of an EUV light source apparatus according to the eighth example using an ellipsoidal annular planar reflection mirror for reflecting light reflected by an peripheral part of the EUV collector mirror, as a splitter optical element.
Figure 21:
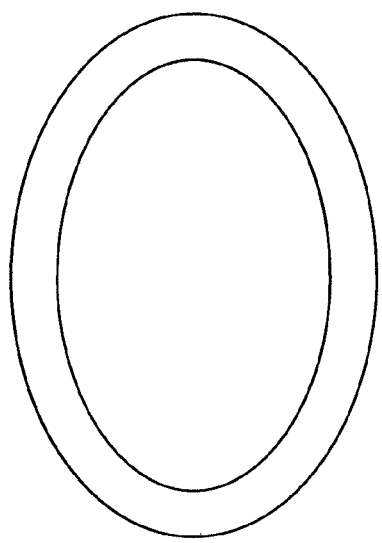
FIG. 21 shows a shape of the reflection mirror in FIG. 20.

FIG. 20 is a schematic diagram showing a configuration of an EUV light source apparatus according to the eighth example using an ellipsoidal annular planar reflection mirror, which reflects light reflected by an peripheral part of the EUV collector mirror, as a splitter optical element, and FIG. 21 shows a shape of the reflection mirror. The ellipsoidal annular planar reflection mirror to be used as a splitter optical element 47 in this example has an opening for passing light to be outputted to the exposure unit and formed at the center as shown in FIG. 21.

As shown in FIG. 20, the ellipsoidal annular planar reflection mirror is provided in an optical path between the first focal point 53 and the second focal point (IF) 57 of the EUV collector mirror 21. The EUV light having a wavelength of 13.5 nm and light having other wavelengths passing through the opening of the ellipsoidal annular planar reflection mirror form an emission point image at a location of the opening of the IF aperture 29 and enter the exposure unit 27. By providing a filter in the exposure unit 27 or an incident aperture of the exposure unit 27, only the EUV light having a wavelength of 13.5 nm enters the interior of the exposure unit 27. In this example, it is necessary to make the aperture (NA) of the EUV collector mirror 21 larger than the incident aperture (NA) necessary for the exposure unit.

On the other hand, the EUV light having a wavelength of 13.5 nm reflected by the mirror surface of the ellipsoidal annular planar reflection mirror and the light having other wavelengths form an IF image at the third focal point 61, and the image sensor 25 detects a light profile (location and/or shape) of the IF image. A filter for transmitting only the EUV light having a wavelength of 13.5 nm may be provided before the image sensor 25 so that only the EUV light having a wavelength of 13.5 nm among the light reflected by the mirror surface of the ellipsoidal annular planar reflection mirror reaches the detection surface of the image sensor 25.

Although the ellipsoidal annular planar reflection mirror is used in this example, the present invention is not limited to that, but a splitter optical element may be used that transmits light in a region necessary for the exposure unit 27 and reflects light in a region unnecessary for the exposure unit 27 among the light reflected by the EUV collector mirror 21. For example, a splitter optical element, on which plural small reflection mirrors are arranged, may be used.

As a first modified example of the eighth example, the image sensor 25 for detecting the profile of the light split by the splitter optical element (ellipsoidal annular planar reflection mirrors) 47 may be provided farther from the splitter optical element 47 than that in the eighth example as shown in FIG. 20. Thereby, the light reflected by the splitter optical element 47 enters the detection surface of the image sensor 25 after forming the IF image at the third focal point 61. Therefore, the image sensor 25 detects a light profile (far-field pattern) in a region (far field) farther from the EUV emission point than the third focal point 61. Alternatively, in place of detecting the far-field pattern, a light profile (near-field pattern) in a region (near field) nearer to the EUV emission point than the third focal point 61 may be detected.

Figure 22:
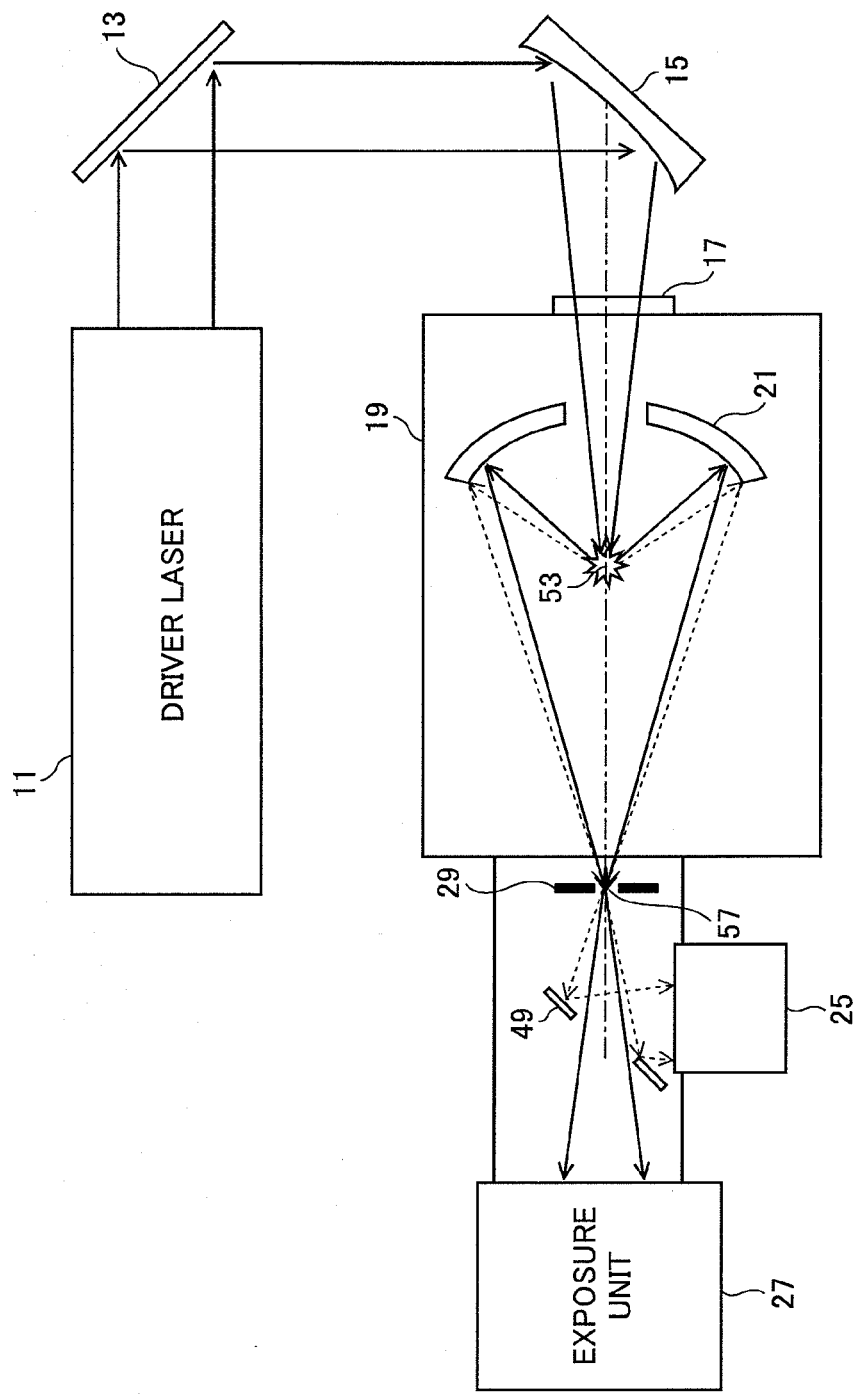
FIG. 22 is a schematic diagram showing a configuration of an EUV light source apparatus according to a second modified example of the eighth example.

FIG. 22 is a schematic diagram showing a configuration of an EUV light source apparatus according to a second modified example of the eighth example. In the second modified example of the eighth example as shown in FIG. 22, in place of the splitter optical element (ellipsoidal annular planar reflection mirror) 47 in the eighth example as shown in FIG. 20, a splitter optical element (ellipsoidal annular planar reflection mirror) 49 is used.

As shown in FIG. 22, the splitter optical element (ellipsoidal annular planar reflection mirror) 49 is provided between the second focal point (IF) 57 of the EUV collector mirror 21 and the exposure unit 27. The EUV light having a wavelength of 13.5 nm and the light having other wavelengths passing through the opening of the ellipsoidal annular planar reflection mirror enter the exposure unit 27. By providing a filter in the exposure unit 27 or an incident aperture of the exposure unit 27, only the EUV light having a wavelength of 13.5 nm enters the interior of the exposure unit 27.

On the other hand, the EUV light having a wavelength of 13.5 nm and the light having other wavelengths reflected by the mirror surface of the ellipsoidal annular planar reflection mirror enter the detection surface of the image sensor 25. Therefore, the image sensor 25 detects a light profile (far-field pattern) in a region (far field) farther from the EUV emission point than the second focal point (IF) 57.

Although the ellipsoidal annular planar reflection mirror is used in this example, the present invention is not limited to that, but a splitter optical element on which plural small reflection mirrors are arranged, an SPF, or a diffraction grating may be used.

Figure 23:
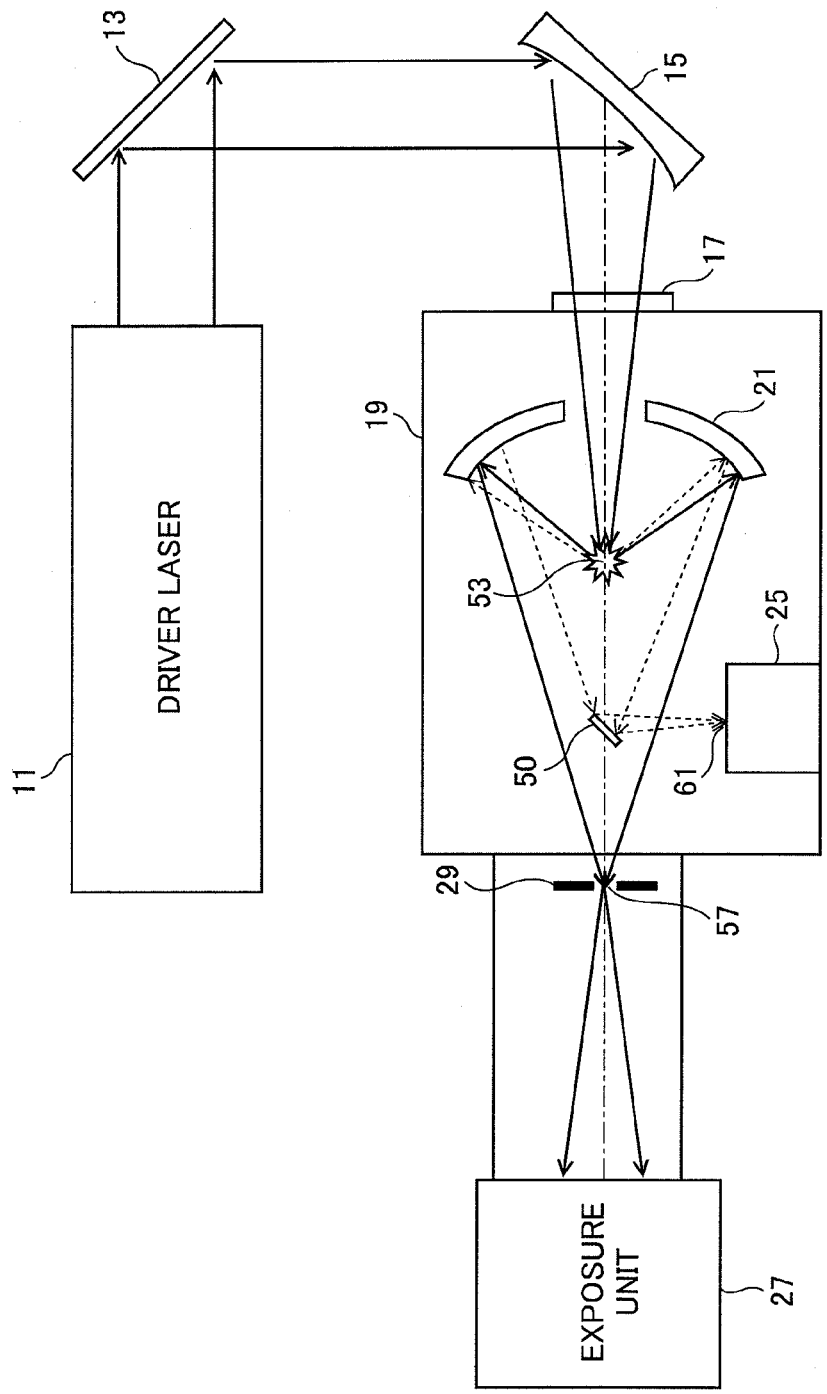
FIG. 23 is a schematic diagram showing a configuration of an EUV light source apparatus according to the ninth example using a reflection mirror for reflecting light in an obscuration area of the light reflected by the EUV collector mirror, as a splitter optical element.

FIG. 23 is a schematic diagram showing a configuration of an EUV light source apparatus according to the ninth example using a reflection mirror, which reflects light in an obscuration area among the light reflected by the EUV collector mirror, as a splitter optical element. Here, the obscuration area is an area corresponding to an angle range in which the EUV light collected by the EUV collector mirror 21 is not used in the exposure unit 27.

As shown in FIG. 23, the reflection mirror to be used as a splitter optical element 50 in this example is provided within the obscuration area between the first focal point 53 and the second focal point (IF) 57 of the EUV collector mirror 21. The EUV light having a wavelength of 13.5 nm and the light having other wavelengths passing around the splitter optical element (reflection mirror) 50 form an emission point image at the location of the opening of the IF aperture 29 and enter the exposure unit 27. By providing a filter in the exposure unit 27 or an incident aperture of the exposure unit 27, only the EUV light having a wavelength of 13.5 nm enters the interior of the exposure unit 27.

On the other hand, the EUV light having a wavelength of 13.5 nm and the light having other wavelengths reflected by the mirror surface of the splitter optical element (reflection mirror) 50 form an IF image at the third focal point 61, and the image sensor 25 detects a light profile (location and/or shape) of the IF image. A filter for transmitting only the EUV light having a wavelength of 13.5 nm may be provided before the image sensor 25 so that only the EUV light having a wavelength of 13.5 nm among the light reflected by the mirror surface of reflection mirror reaches the detection surface of the image sensor 25.

As a modified example of the ninth example, the image sensor 25 for detecting the profile of the light split by the splitter optical element (reflection mirror) 50 may be provided farther from the splitter optical element 50 than that in the ninth example as shown in FIG. 23. Thereby, the light reflected by the splitter optical element 50 enters the detection surface of the image sensor 25 after forming the IF image at the third focal point 61. Therefore, the image sensor 25 detects a light profile (far-field pattern) in a region (far field) farther from the EUV emission point than the third focal point 61. Alternatively, in place of detecting the far-field pattern, a light profile (near-field pattern) in a region (near field) nearer to the EUV emission point than the third focal point 61 may be detected.

Embodiment 3

Figure 24:
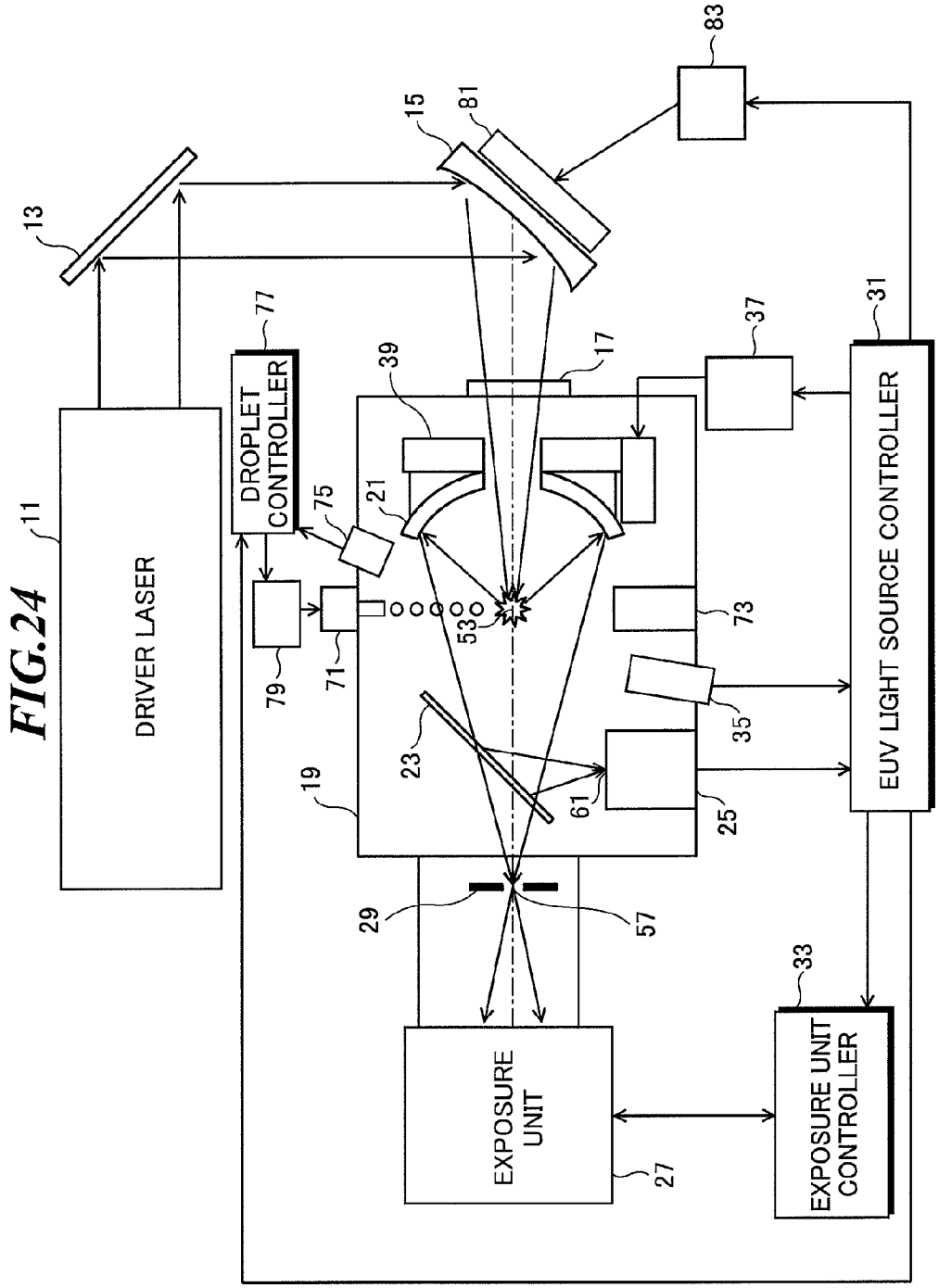
FIG. 24 is a schematic diagram showing a configuration of an EUV light source apparatus according to the third embodiment of the present invention.

FIG. 24 is a schematic diagram showing a configuration of an EUV light source apparatus according to the third embodiment of the present invention. In order to adjust the location of the second focal point according to the light profile (location and/or shape) of the IF image at the third focal point, it is necessary that the location of the EUV light at the first focal point is stable. Accordingly, in the EUV light source apparatus according to the third embodiment, a control system for controlling the location of the droplets of the target material and a control system for controlling the location of the focusing point of the laser beam outputted from the driver laser are embodied, and the rest of the configuration is the same as that in the second embodiment.

As shown in FIG. 24, the EUV light source apparatus according to the third embodiment includes a droplet generating unit 71, a droplet catcher 73, a droplet location sensor 75, a droplet controller 77, a droplet actuator 79, an off-axis parabolic mirror holder 81 for supporting the off-axis parabolic mirror 15, and an off-axis parabolic mirror actuator 83 for moving the off-axis parabolic mirror 15 together with the off-axis parabolic mirror holder 81 in addition to the component elements of the EUV light source apparatus according to the second embodiment.

In the third embodiment, by operating the two control systems, the location of the EUV emission point can be controlled into a desired location, and then, the EUV light can be appropriately provided to the exposure unit 27 according to the above-mentioned IF image stabilizing control.

The first control system is a feedback control system for detecting the location of the droplets and controlling the location of the droplets into a desired location. In the first control system, the droplet location sensor 75 detects the location of the droplets of the target material, and outputs data representing the location of the droplets to the droplet controller 77. The droplet controller 77 outputs a control signal to the droplet actuator 79 based on a detection result of the location of the droplets to adjust the location of the droplet generating unit 71. In this manner, the location of the droplets is controlled to be the desired location.

Further, the second control system is a feedback control system for controlling the location of the focusing point of the driver laser beam to overlap with the droplets after the droplet location is stabilized into the desired location by the first control system. In the second control system, the image sensor 35 measures the light profile (location and/or shape) of the EUV emission point and outputs data representing the light profile (location and/or shape) of the EUV emission point to the EUV light source controller 31. The EUV light source controller 31 outputs a control signal to the off-axis parabolic mirror actuator 83 so that the light profile (location and/or shape) of the EUV emission point becomes a desired light profile (location and/or shape). The off-axis parabolic mirror actuator 83 adjusts the location and/or posture of the off-axis parabolic mirror holder 81 according to the control signal.

By the feedback control using the first and second control systems, the light profile (location and/or shape) of the EUV emission point is stabilized to be a desired light profile. The subsequent IF image stabilizing control is the same as that in the second embodiment.

Figure 25:
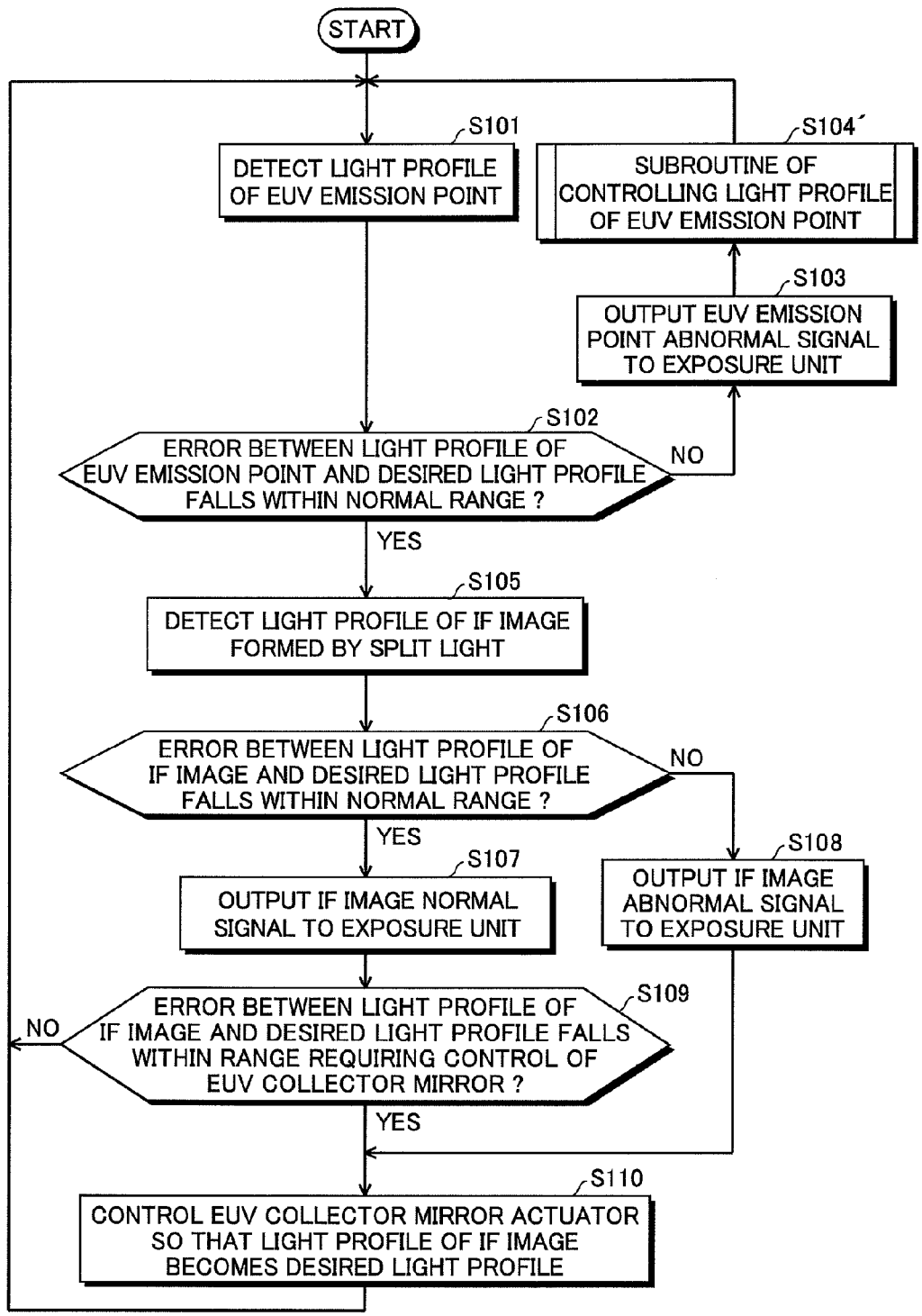
FIG. 25 is a flowchart showing an example of IF image stabilizing control operation in the third embodiment of the present invention.
Figure 26:
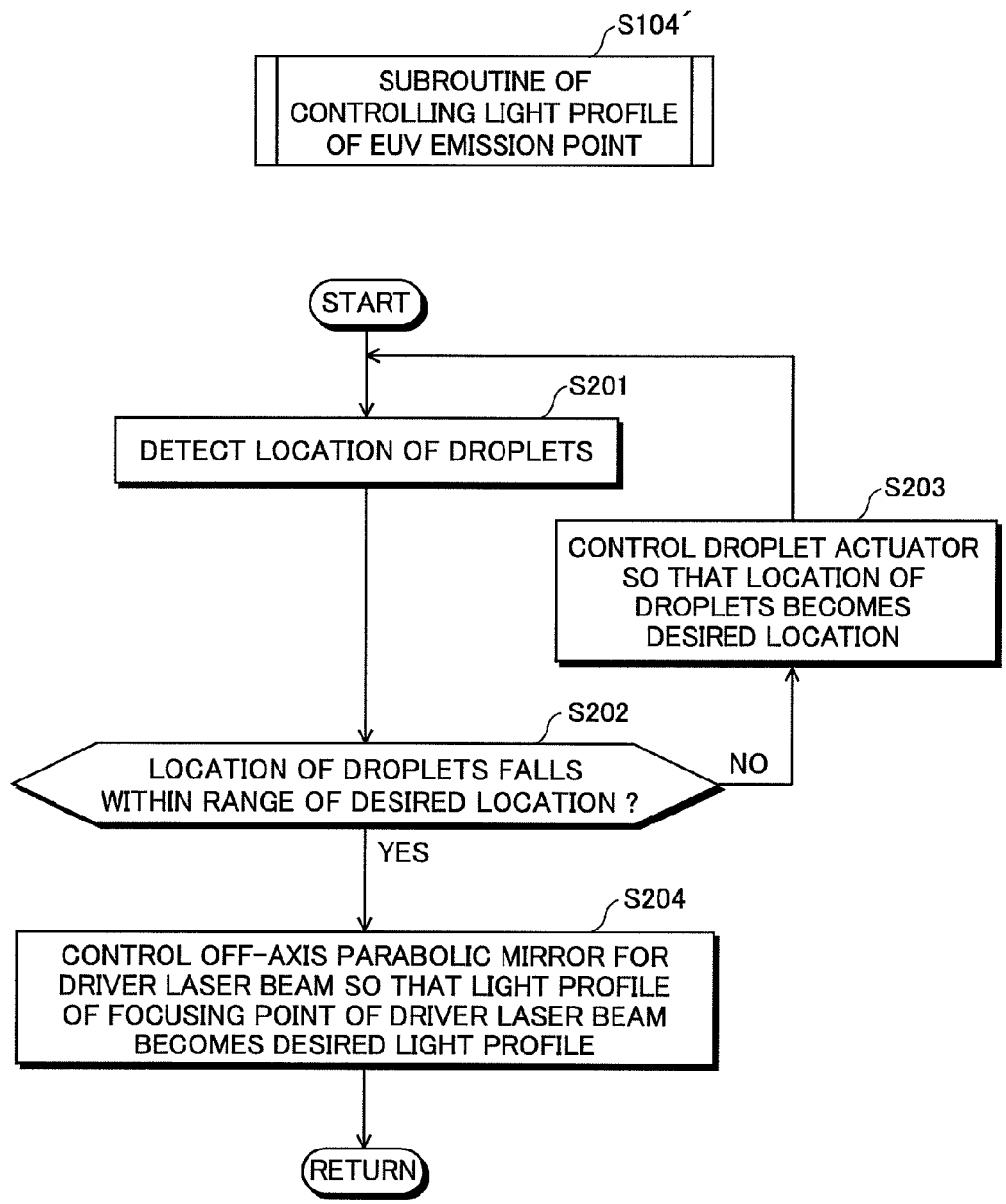
FIG. 26 is a flowchart for explanation of a subroutine in FIG. 25.

FIG. 25 is a flowchart showing an example of IF image stabilizing control operation in the third embodiment of the present invention, and FIG. 26 is a flowchart for explanation of a subroutine in FIG. 25. At step S101 as shown in FIG. 25, the image sensor 35 detects the light profile (location and/or shape) of the EUV emission point under the control of the EUV light source controller 31. At step S102, the EUV light source controller 31 compares the light profile (location and/or shape) of the EUV emission point detected by the image sensor 35 with the desired light profile (location and/or shape), and determines whether an error between them falls within a normal range or not.

In the case where at least one evaluation item of the error of the light profile (location and/or shape) of the EUV emission point is determined to be out of the normal range, the EUV light source controller 31 issues a warning to the exposure unit 27 via the exposure unit controller 33 by outputting an EUV emission point abnormal signal at step S103, and then, controls the location of the droplets and the location and/or posture of the off-axis parabolic mirror 15 so that the light profile (location and/or shape) of the EUV emission point becomes the desired light profile (location and/or shape) at step S104'. Then, the process returns to step S101.

The operation at step S104' is executed by a subroutine of controlling the light profile of the MTV emission point as shown in FIG. 26. At step S201 as shown in FIG. 26, the droplet location sensor 75 detects the location of the droplets under the control of the droplet controller 77. At step S202, the droplet controller 77 determines whether the detected location of the droplets falls within a range of a desired location or not.

In the case where the location of the droplets is out of the range of the desired location, at step S203, the droplet controller 77 controls the droplet actuator 79 so that the location of the droplets becomes the desired location. The droplet actuator 79 moves the droplet generating unit 71 within a two-dimensional surface perpendicular to the output direction of the droplets under the control of the droplet controller 77. Then, the process returns to step S201.

In the case where the location of the droplets is within the range of the desired location, at step S204, the EUV light source controller 31 controls the off-axis parabolic mirror actuator 83 for the driver laser beam so that the light profile (location and/or shape) of focusing point of the driver laser beam becomes the desired light profile (location and/or shape). The off-axis parabolic mirror actuator 83 drives the off-axis parabolic mirror holder 81 to adjust the location and/or posture of the off-axis parabolic mirror 15 under the control of the EUV light source controller 31. Then, the subroutine ends.

Referring to FIG. 25 again, at step S102, in the case where all evaluation items of the error of the light profile (location and/or shape) of the EUV emission point are determined to be within the normal range, at step S105, the image sensor 25 detects the light profile (location and/or shape) of the IF image formed by the light (split light) reflected by the splitter optical element 23 under the control of the EUV light source controller 31. At step S106, the EUV light source controller 31 compares the light profile (location and/or shape) of the IF image detected by the image sensor 25 with the desired light profile (location and/or shape), and determines whether an error between them falls within a normal range or not.

In the case where all evaluation items of the error of the light profile (location and/or shape) of the IF image are determined to be within the normal range, the EUV light source controller 31 outputs an IF image normal signal to the exposure unit 27 via the exposure unit controller 33 at step S107. In the case where at least one evaluation item of the error of the light profile (location and/or shape) of the IF image is determined to be out of the normal range, the EUV light source controller 31 outputs an IF image abnormal signal to the exposure unit 27 via the exposure unit controller 33 at step S108.

Further, at step S109, the EUV light source controller 31 determines whether an error between the light profile (location and/or shape) of the IF image and the desired light profile falls within a range requiring the control of the EUV collector mirror or not. In the case where all evaluation items of the error of the light profile (location and/or shape) of the IF image are determined to be within the desired range and the control of the EUV collector mirror is determined to be unnecessary, the process returns to step S101 and the EUV light source controller 31 monitors the abnormality in the EUV light generating operation. On the other hand, in the case where at least one evaluation item of the error of the light profile (location and/or shape) of the IF image is out of the desired range and the control of the EUV collector mirror is determined to be necessary, the process moves to step S110.

At step S110, the EUV light source controller 31 controls the EUV collector mirror actuator 37 so that the light profile (location and/or shape) of the IF image becomes the desired light profile (location and/or shape), and then, the process returns to step S101 and the EUV light source controller 31 monitors the abnormality in the EUV light generating operation.

Figure 27:
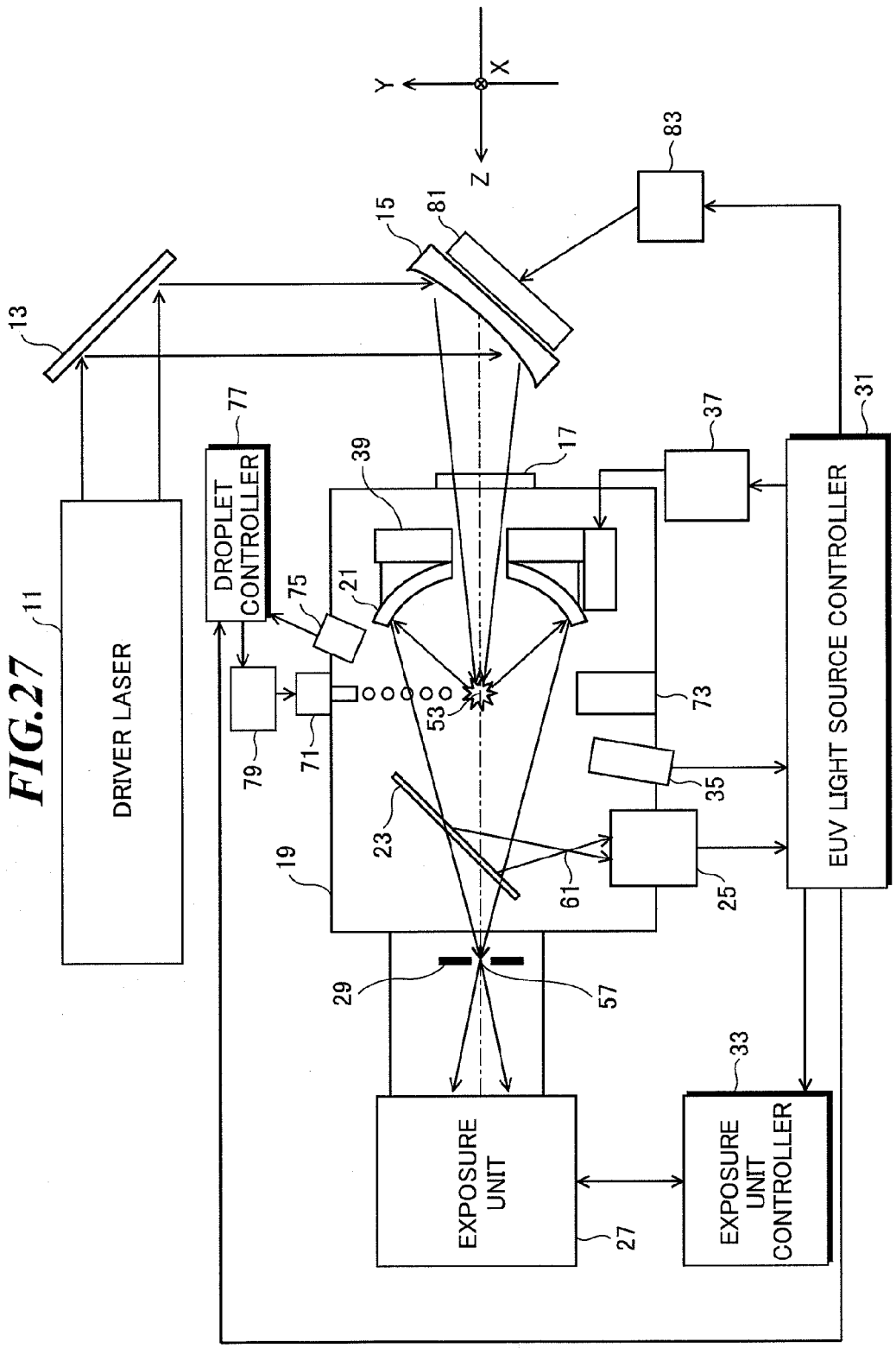
FIG. 27 is a schematic diagram showing a configuration of an EUV light source apparatus according to a modified example of the third embodiment of the present invention.

FIG. 27 is a schematic diagram showing a configuration of an EUV light source apparatus according to a modified example of the third embodiment of the present invention. In the modified example of the third embodiment as shown in FIG. 27, the image sensor 25 for detecting the profile of the light split by the splitter optical element 23 is provided farther from the splitter optical element 23 than that in the third embodiment as shown in FIG. 24. Thereby, the light reflected by the splitter optical element 23 enters the detection surface of the image sensor 25 after forming the IF image at the third focal point 61. Therefore, the image sensor 25 detects a light profile (far-field pattern) in a region (far field) farther from the EUV emission point than the third focal point 61. Alternatively, in place of detecting the far-field pattern, a light profile (near-field pattern) in a region (near field) nearer to the EUV emission point than the third focal point 61 may be detected.

Figure 28:
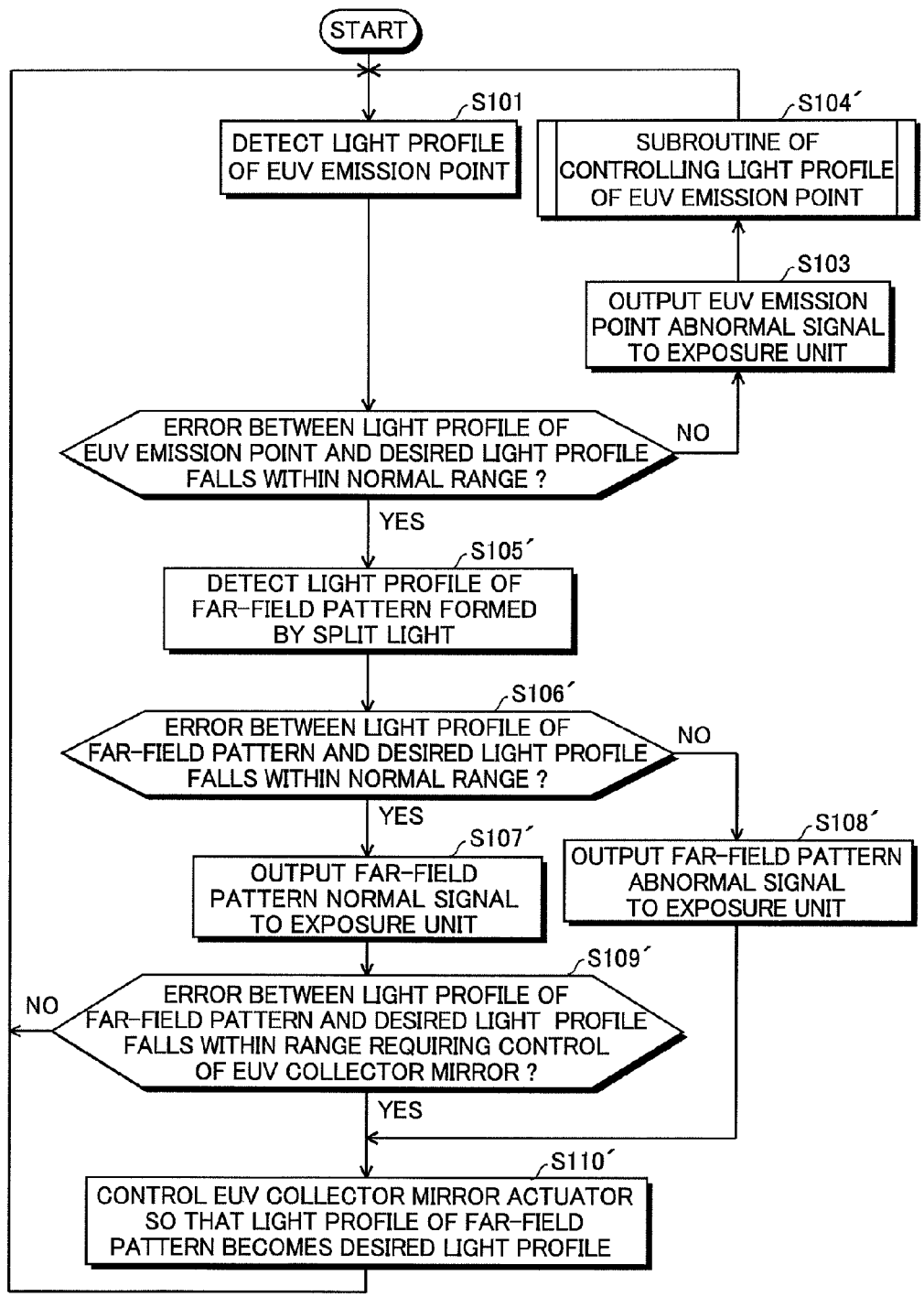
FIG. 28 is a flowchart showing an example of far-field pattern stabilizing control operation in the modified example of the third embodiment of the present invention.

FIG. 28 is a flowchart showing an example of far-field pattern stabilizing control operation in the modified example of the third embodiment of the present invention. The process to step S104' is the same as that shown in FIG. 25. At step S105', the image sensor 25 detects the light profile (location and/or shape) of the far-field pattern formed by the light (split light) reflected by the splitter optical element 23 under the control of the EUV light source controller 31. At step S106', the EUV light source controller 31 compares the light profile (location and/or shape) of the far-field pattern detected by the image sensor 25 with the desired light profile (location and/or shape), and determines whether an error between them falls within a normal range or not.

In the case where all evaluation items of the error of the light profile (location and/or shape) of the far-field pattern are determined to be within the normal range, the EUV light source controller 31 outputs a far-field pattern normal signal to the exposure unit 27 via the exposure unit controller 33 at step S107'. On the other hand, in the case where at least one evaluation item of the error of the light profile (location and/or shape) of the far-field pattern is determined to be out of the normal range, the EUV light source controller 31 outputs a far-field pattern abnormal signal to the exposure unit 27 via the exposure unit controller 33 at step S108'.

Further, at step S109', the EUV light source controller 31 determines whether an error between the light profile (location and/or shape) of the far-field pattern and the desired light profile falls within a range requiring the control of the EUV collector mirror or not. In the case where all evaluation items of the error of the light profile (location and/or shape) of the far-field pattern are determined to be within the desired range and the control of the EUV collector mirror is determined to be unnecessary, the process returns to step S101 and the EUV light source controller 31 monitors the abnormality in the EUV light generating operation. On the other hand, in the case where at least one evaluation item of the error of the light profile (location and/or shape) of the far-field pattern is out of the desired range and the control of the EUV collector mirror is determined to be necessary, the process moves to step S110'.

At step S110', the EUV light source controller 31 controls the EUV collector mirror actuator 37 so that the light profile (location and/or shape) of the far-field pattern becomes the desired light profile (location and/or shape), and then, the process returns to step S101 and the EUV light source controller 31 monitors the abnormality in the EUV light generating operation.

Embodiment 4

Figure 29:
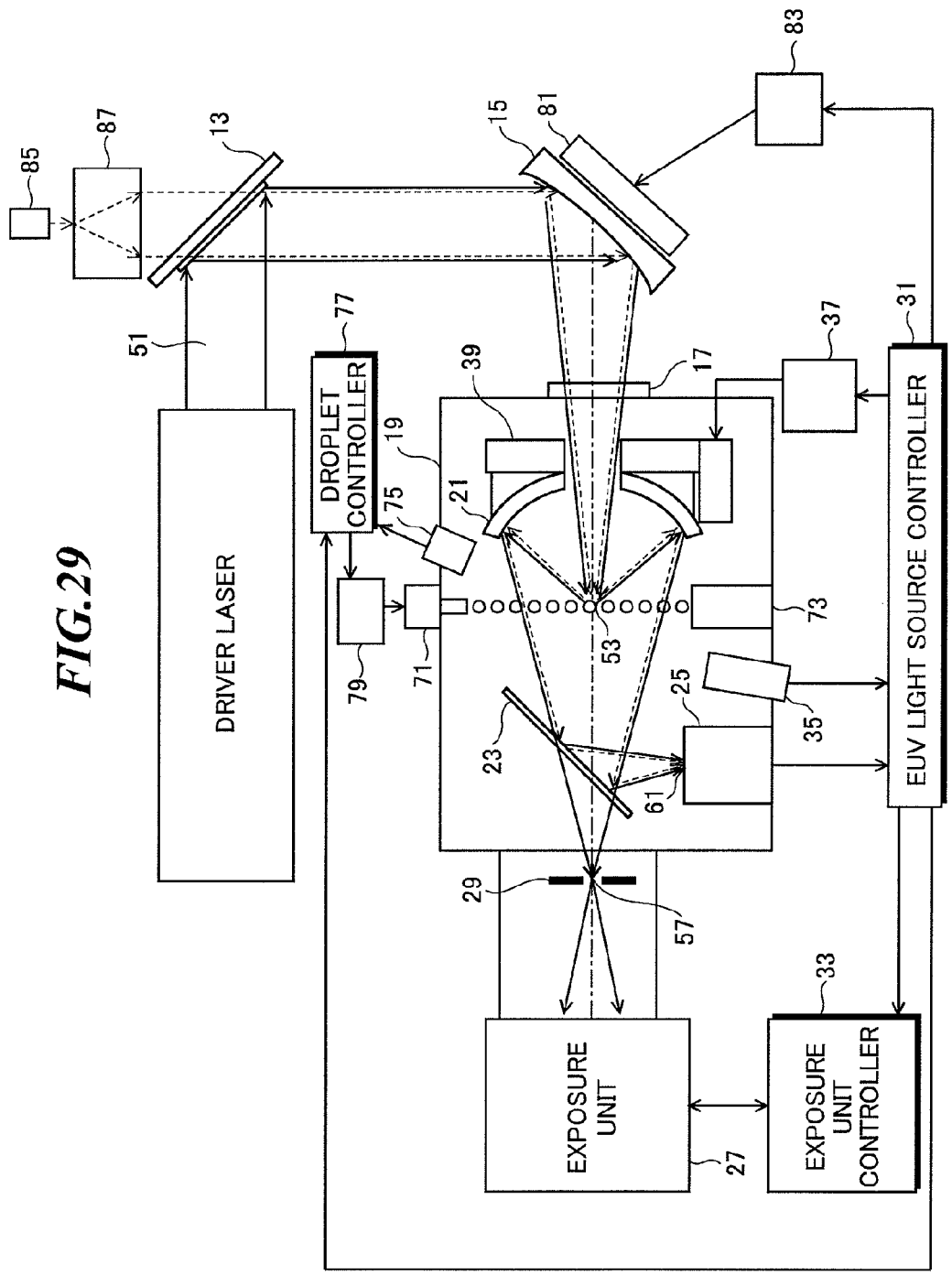
FIG. 29 is a schematic diagram showing a configuration of an EUV light source apparatus according to the fourth embodiment of the present invention.

FIG. 29 is a schematic diagram showing a configuration of an EUV light source apparatus according to the fourth embodiment of the present invention. The EUV light source apparatus according to the fourth embodiment additionally includes a guide laser 85 and a guide laser beam collimator 87 in order to adjust the location of the intermediate focusing point (IF) by applying a guide laser beam in place of the driver laser beam, and differs in that a semi-transmissive mirror for reflecting the driver laser beam at high reflectance and transmitting the guide laser beam is used as a reflection mirror 13 for the driver laser beam, compared to the EUV light source apparatus according to the third embodiment as shown in FIG. 24. The rest of the configuration is the same as that of the third embodiment.

According to the fourth embodiment, since the guide laser beam is converged on the focal point of the off-axis parabolic mirror 15 by using the optics for the driver laser beam, the initial alignment of the optics for the driver laser beam, and further, the optics for EUV light can be performed based on the IF image formed by the guide laser beam without emission of the EUV light. Further, in the case where the driver laser beam as non-visible light is used, visible light is used as the guide laser beam, and thereby, the adjustment condition can be checked by visual observation.

The guide laser beam emitted from the guide laser 85 passes through the guide laser beam collimator 87 to be expanded to have the same diameter as that of the driver laser beam. Then, the guide laser beam is transmitted through the reflection mirror 13 from behind, enters the off-axis parabolic mirror 15 such that its track substantially overlaps coaxially with the driver laser beam, and is reflected by the off-axis parabolic mirror 15 and focused on the focal point of the off-axis parabolic mirror 15. The guide laser beam focused on the focal point of the off-axis parabolic mirror 15 is reflected by the droplets and scattered.

In this regard, by adjusting the location and/or posture of the off-axis parabolic mirror holder 81 based on a relationship between the location of the droplets detected by the droplet location sensor 75 and the light profile (location and/or shape) of the focusing point of the guide laser beam detected by the image sensor 35, the light profile (location and/or shape) of the EUV emission point can be adjusted to the desired light profile (location and/or shape). Further, by using the IF image formed by the guide laser light reflected by the droplets, the initial alignment of the optics of the EUV light can be performed.

Figure 30:
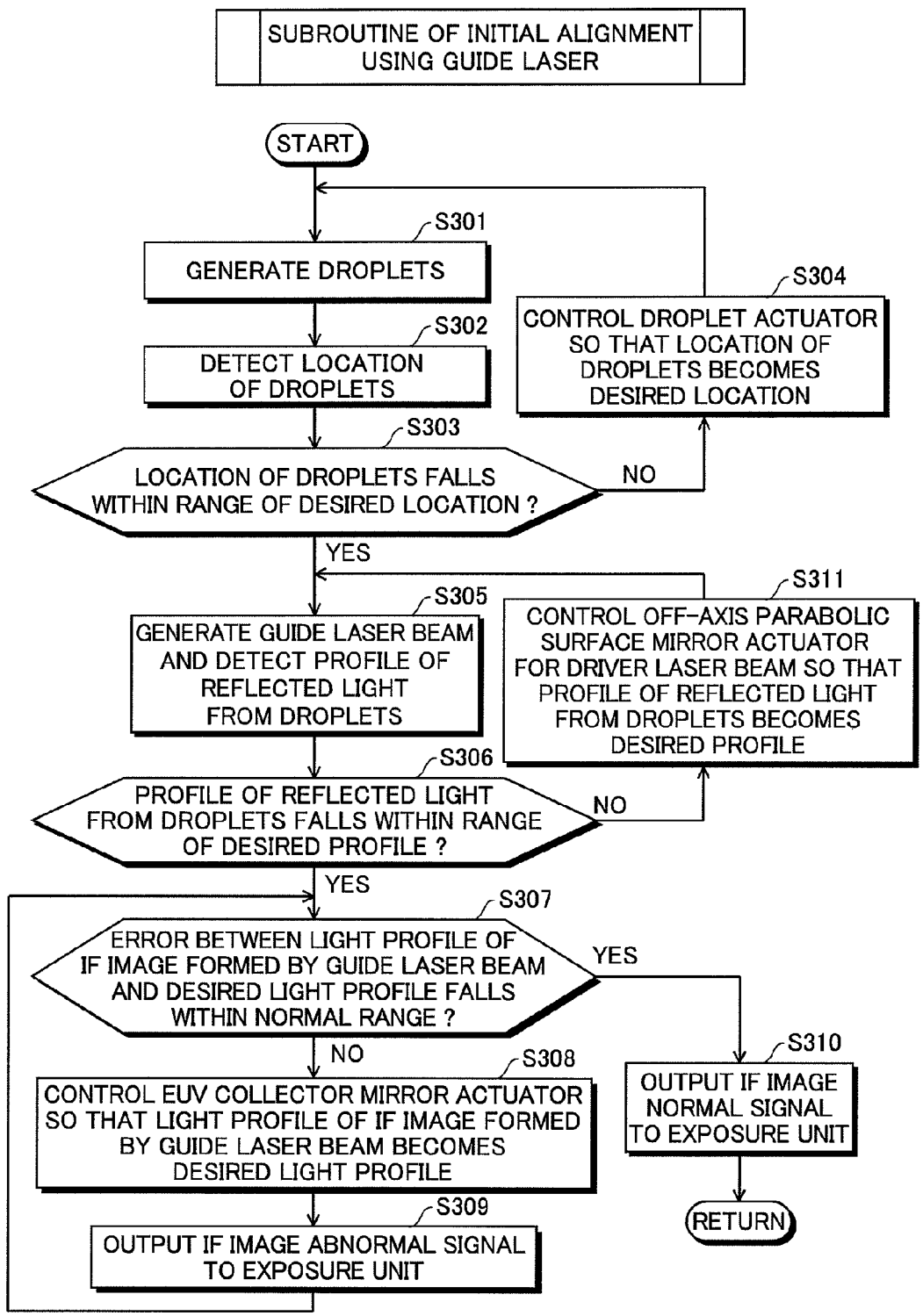
FIG. 30 is a flowchart showing an example of initial alignment operation in the fourth embodiment of the present invention.

FIG. 30 is a flowchart showing an example of initial alignment operation in the fourth embodiment of the present invention. The initial alignment operation is executed by a subroutine of initial alignment using the guide laser.

When the subroutine is started, at step S301, the droplet generating unit 71 generates droplets under the control of the droplet controller 77. At step S302, the droplet location sensor 75 detects the location of the droplets under the control of the droplet controller 77. At step S303, the droplet controller 77 determines whether the location of the droplets falls within a range of a desired location or not based on the detection result of the droplet location sensor 75.

In the case where the location of the droplets is out of the range of the desired location, at step S304, the droplet controller 77 controls the droplet actuator 79 to adjust the location of the droplet generating unit 71 so that the location of the droplets becomes the desired location. Then, the process returns to step S301.

On the other hand, in the case where the location of the droplets is within the range of the desired location, at step S305, the guide laser 85 generates a guide laser beam. Thereby, the droplets are irradiated with the guide laser beam. Then, the guide laser beam reflected and scattered by the droplet enters the image sensor 35. Here, the image sensor 35 detects the profile (location and/or shape) of the light reflected and scattered from the droplets.

At step S306, the EUV light source controller 31 determines whether the profile (location and/or shape) of the reflected light from the droplets falls within a range of the desired profile (location and/or shape) or not. In the case where the profile (location and/or shape) of the reflected light from the droplets is determined to be out of the range of the desired profile (location and/or shape), the process moves to step S311.

At step S311, the EUV light source controller 31 feedback-controls the off-axis parabolic mirror actuator 83 for the driver laser beam based on the detection result of the image sensor 35 to adjust the location and/or posture of the off-axis parabolic mirror 15 so that the profile (location and/or shape) of the reflected light from the droplets becomes the desired light profile (location and/or shape). Then, the process returns to step S305, and steps S311 and S305 are repeated until the profile (location and/or shape) of the reflected light from the droplets falls within the range of the desired profile (location and/or shape).

On the other hand, in the case where the profile (location and/or shape) of the reflected light from the droplets is determined to be within the range of the desired profile (location and/or shape), the process moves to step S307. The light reflected from the droplet surfaces is reflected by the EUV collector mirror 21. Then, a part of the guide laser beam toward the intermediate focusing point (IF) is reflected by the splitter optical element 23, and forms a droplet image on the detection surface of the image sensor 25. The droplet image is defined as an IF image formed by the guide laser beam. Here, the EUV collector mirror 21 can reflect both the EUV light and the guide laser beam. Therefore, the IF image formed by the guide laser beam coincides with the IF image by the EUV light radiated from the plasma and collected by the EUV collector mirror 39.

At step S307, the EUV light source controller 31 compares the light profile (location and/or shape) of the IF image formed by the guide laser beam with the desired light profile (location and/or shape), and determines whether an error between them falls within a normal range or not.

In the case where at least one evaluation item of the error of the light profile (location and/or shape) of the IF image formed by the guide laser beam is determined to be out of the normal range, the EUV light source controller 31 controls the EUV collector mirror actuator 37 so that the light profile (location and/or shape) of the IF image becomes the desired light profile (location and/or shape) at step S308. Further, at step S309, the EUV light source controller 31 outputs an IF image abnormal signal to the exposure unit 27 via the exposure unit controller 33 so as not to activate the exposure unit 27. Then, the process returns to step S307.

On the other hand, in the case where all evaluation items of the error of the light profile (location and/or shape) of the IF image are determined to be within the normal range, the EUV light source controller 31 outputs an IF image normal signal to the exposure unit 27 via the exposure unit controller 33 at step S310. Then, the subroutine ends.

According to the embodiment, since the initial alignment of the optics can be performed by using the guide laser, preliminary adjustment of the optics can be made based on the location of the emission point and the IF image without emission of EUV light, and the time required for preparation of exposure of the EUV chamber is shortened. Further, the time required for replacement and recovery of the EUV collector mirror or the droplet generating unit requiring replacement as maintenance parts is drastically shortened.

Figure 31:
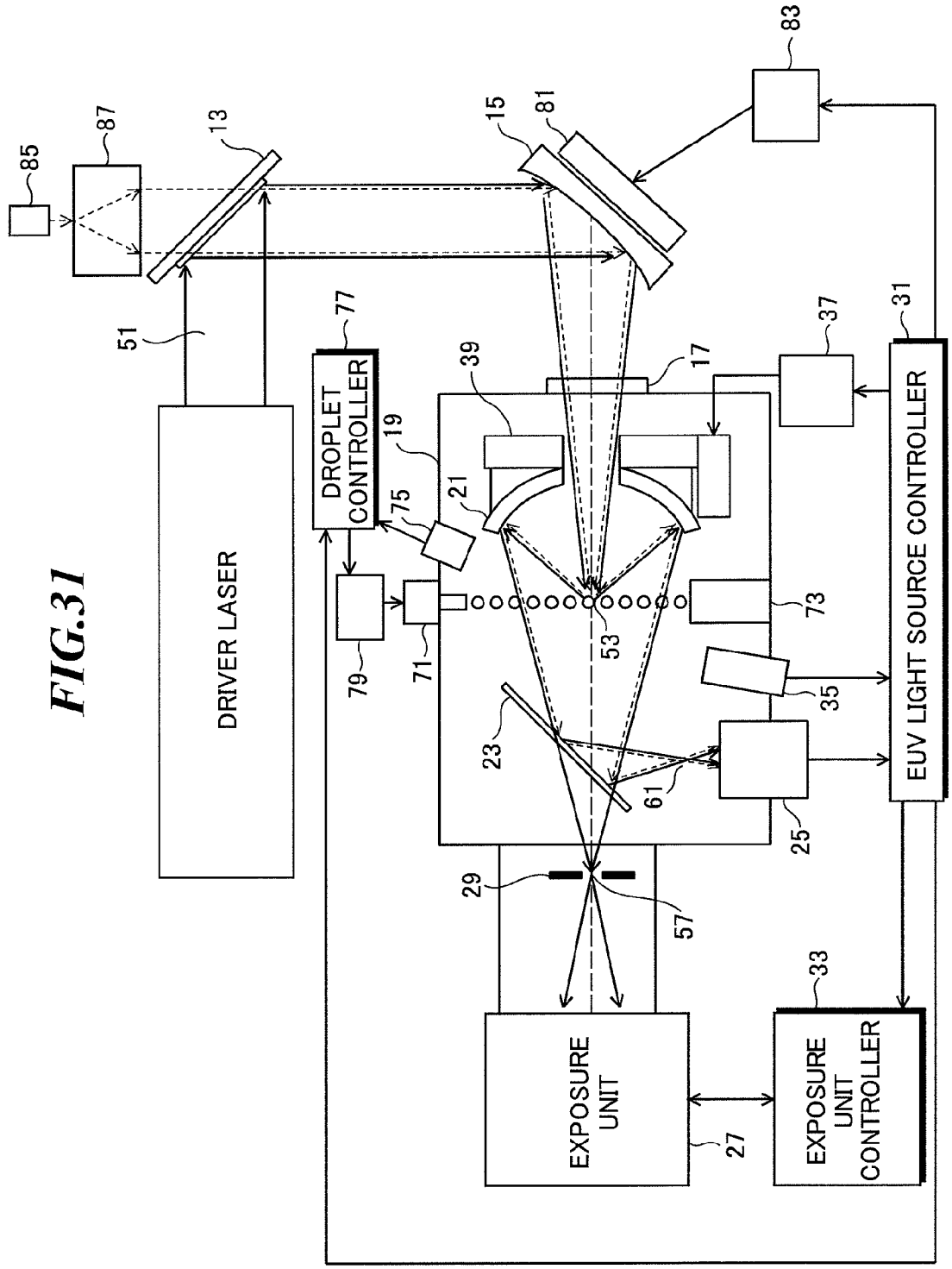
FIG. 31 is a schematic diagram showing a configuration of an EUV light source apparatus according to a modified example of the fourth embodiment of the present invention.

FIG. 31 is a schematic diagram showing a configuration of an EUV light source apparatus according to a modified example of the fourth embodiment of the present invention. In the modified example of the fourth embodiment as shown in FIG. 31, the image sensor 25 for detecting the profile of the light split by the splitter optical element 23 is provided farther from the splitter optical element 23 than that in the fourth embodiment as shown in FIG. 29. Thereby, the light reflected by the splitter optical element 23 enters the detection surface of the image sensor 25 after forming the IF image at the third focal point 61. Therefore, the image sensor 25 detects a light profile (far-field pattern) in a region (far field) farther from the EUV emission point than the third focal point 61. Alternatively, in place of detecting the far-field pattern, a light profile (near-field pattern) in a region (near field) nearer to the EUV emission point than the third focal point 61 may be detected.

Figure 32:
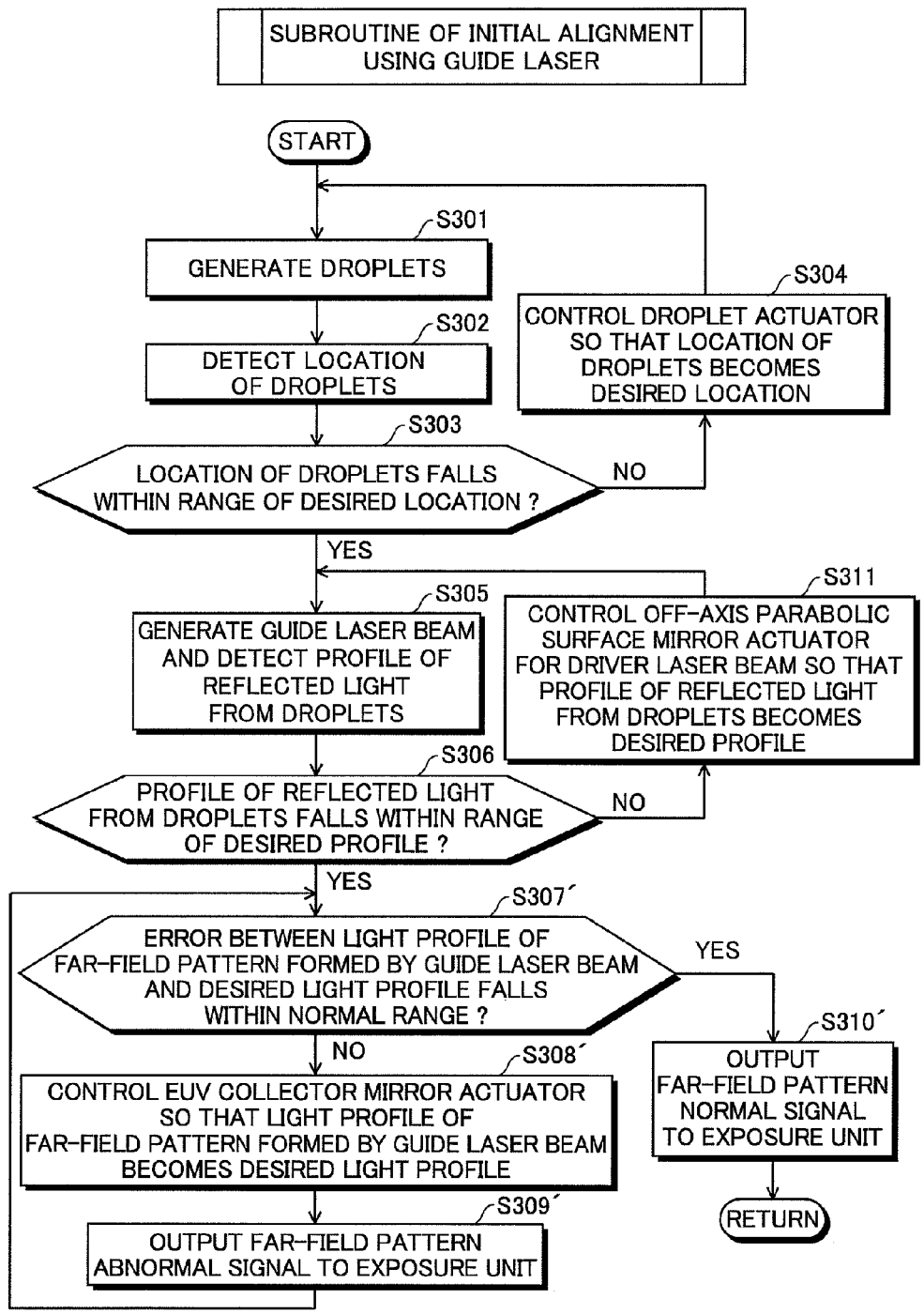
FIG. 32 is a flowchart showing an example of initial alignment operation in the modified example of the fourth embodiment of the present invention.

FIG. 32 is a flowchart showing an example of initial alignment operation in the modified example of the fourth embodiment of the present invention. Steps S301-S306 and S311 are the same as those shown in FIG. 30. At step S306, in the case where the profile (location and/or shape) of the reflected light from the droplets is determined to be within the desired profile, the process moves to step S307'. A part of the guide laser beam reflected by the droplets and the EUV collector mirror 21 toward the intermediate focusing point (IF) is reflected by the splitter optical element 23, and forms a far-field pattern on the detection surface of the image sensor 25. At step S307', the EUV light source controller 31 compares the light profile (location and/or shape) of the far-field pattern formed by the guide laser beam with the desired light profile (location and/or shape), and determines whether an error between them falls within a normal range or not.

In the case where at least one evaluation item of the error of the light profile (location and/or shape) of the far-field pattern is determined to be out of the normal range, the EUV light source controller 31 controls the EUV collector mirror actuator 37 so that the light profile (location and/or shape) of the far-field pattern becomes the desired light profile (location and/or shape) at step S308'. Further, at step S309', the EUV light source controller 31 outputs a far-field pattern abnormal signal to the exposure unit 27 via the exposure unit controller 33 so as not to activate the exposure unit 27. Then, the process returns to step S307'.

On the other hand, in the case where all evaluation items of the error of the light profile (location and/or shape) of the far-field pattern are determined to be within the normal range, the EUV light source controller 31 outputs a far-field pattern normal signal to the exposure unit 27 via the exposure unit controller 33 at step S310'. Then, the subroutine ends.

Embodiment 5

Figure 33:
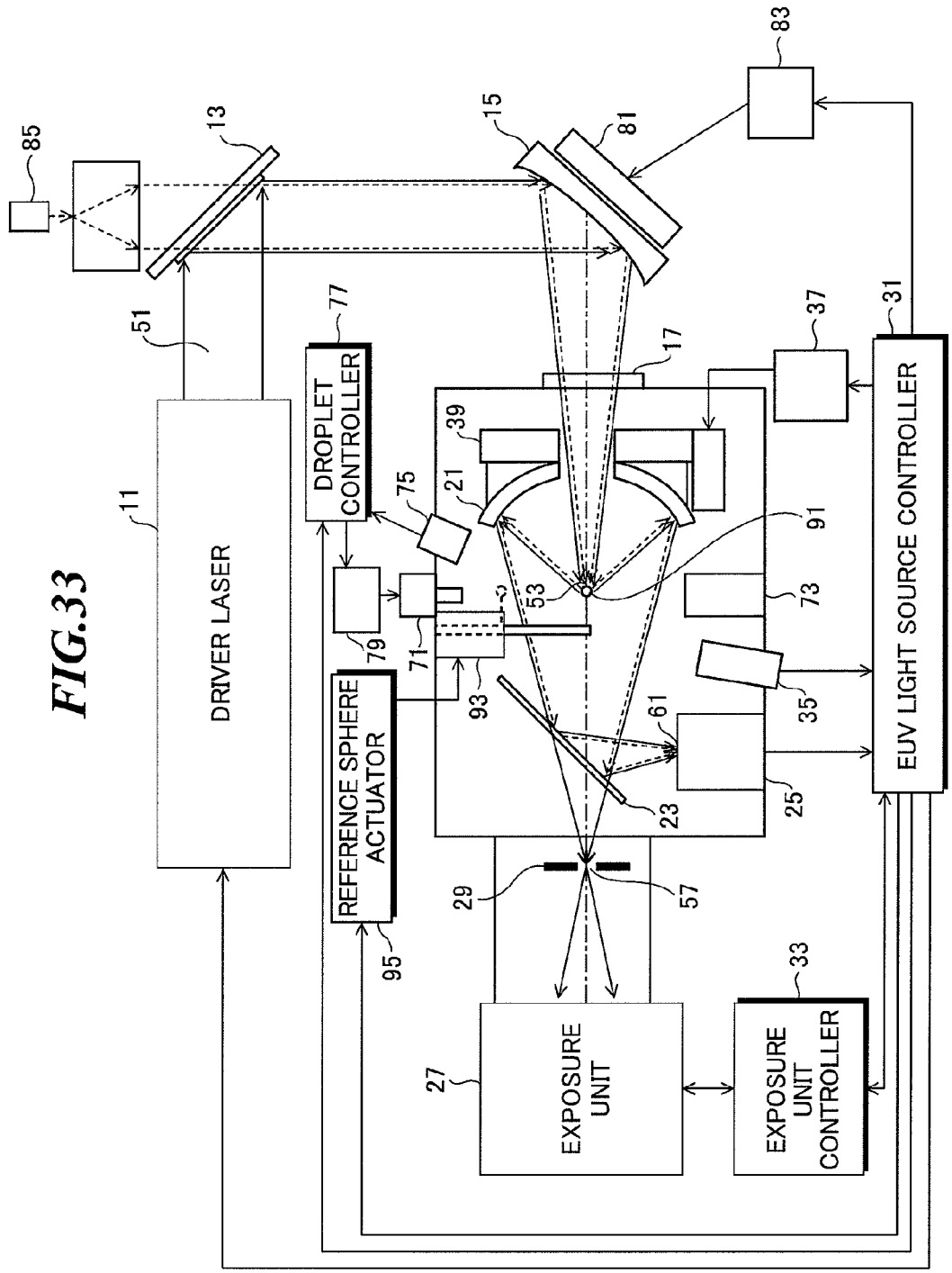
FIG. 33 is a schematic diagram showing a configuration of an EUV light source apparatus according to the fifth embodiment of the present invention.

FIG. 33 is a schematic diagram showing a configuration of an EUV light source apparatus according to the fifth embodiment of the present invention. The EUV light source apparatus according to the fifth embodiment includes a reference sphere supporting unit 93 for supporting a reference sphere 91 and a reference sphere actuator 95 for inserting the reference sphere 91 into a reference location of the EUV emission point in addition to the EUV light source apparatus according to the fourth embodiment as shown in FIG. 29.

The guide laser beam generated by the guide laser 85 is applied to the reference sphere 91 inserted into the reference location of the EUV emission point, reflected and scattered on the surface of the reference sphere 91, and further, reflected by the EUV collector mirror 21. A part of the guide laser beam is reflected by the splitter optical element 23 and forms an IF image on the detection surface of the image sensor 25. The image sensor 25 detects a light profile of the IF image formed by the guide laser beam. Since the IF image formed by the guide laser beam corresponds to the emission point image formed by the EUV light, the EUV light source controller 31 adjusts the location and/or posture of the EUV collector mirror 21 based thereon, and thereby, initial alignment for generating EUV light is performed. In this manner, the alignment of the optics can be adjusted by using the reference sphere 91 without generating droplets by the droplet generating unit 71.

Figure 34:
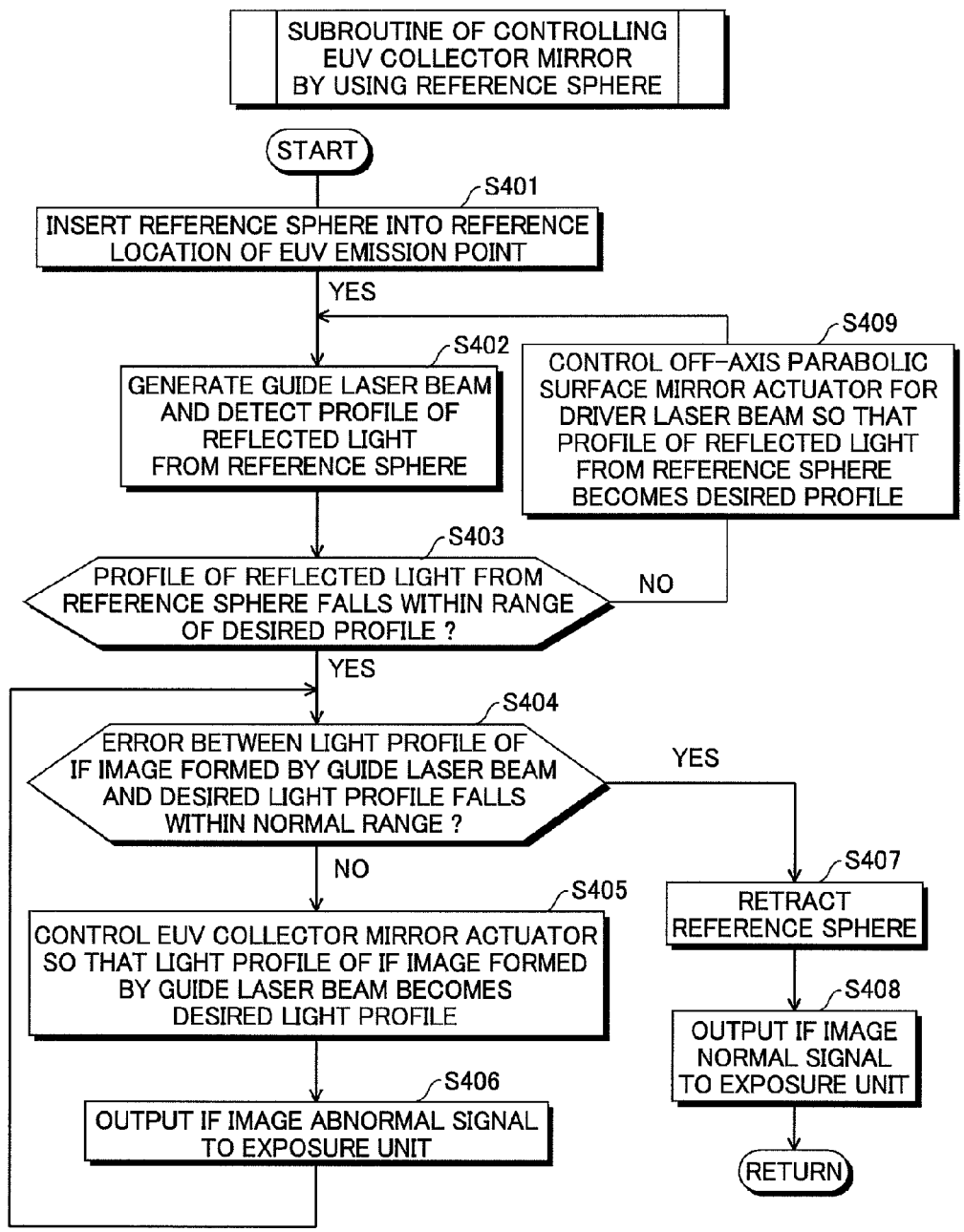
FIG. 34 is a flowchart showing an example of initial alignment operation in the fifth embodiment of the present invention.

FIG. 34 is a flowchart showing an example of initial alignment operation in the fifth embodiment of the present invention. The initial alignment operation is executed by a subroutine of controlling the EUV collector mirror by using the reference sphere.

When the subroutine is started, at step S401, the reference sphere actuator 95 drives the reference sphere supporting unit 93 to insert the reference sphere 91 into the reference location of the EUV emission point under the control of the EUV light source controller 31. At step S402, the guide laser 85 generates a guide laser beam. Thereby, the guide laser beam is applied to the reference sphere 91, and the image sensor 35 detects the profile of the reflected light from the reference sphere 91 based on the guide laser beam reflected and scattered by the reference sphere 91.

At step S403, the EUV light source controller 31 determines whether the profile (location and/or shape) of the reflected light from the reference sphere 91 falls within a range of the desired profile (location and/or shape) or not. In the case where the profile (location and/or shape) of the reflected light from the reference sphere 91 is determined to be out of the range of the desired profile, the process moves to step S409.

At step S409, the EUV light source controller 31 feedback-controls the off-axis parabolic mirror actuator 83 for the driver laser beam based on the detection result of the image sensor 35 to adjust the location and/or posture of the off-axis parabolic mirror 15 so that the profile (location and/or shape) of the reflected light from the reference sphere 91 becomes the desired light profile (location and/or shape). Then, the process returns to step S402.

On the other hand, in the case where the profile (location and/or shape) of the reflected light from the reference sphere 91 is determined to be within the range of the desired profile, the process moves to step S404. A part of the guide laser beam reflected by the reference sphere 91 and the EUV collector mirror 21 toward the intermediate focusing point (IF) is reflected by the splitter optical element 23, and forms an IF image on the detection surface of the image sensor 25. At step S404, the EUV light source controller 31 compares the light profile (location and/or shape) of the IF image formed by the guide laser beam with the desired light profile (location and/or shape), and determines whether an error between them falls within a normal range or not.

In the case where at least one evaluation item of the error of the light profile (location and/or shape) of the IF image is determined to be out of the normal range, the EUV light source controller 31 controls the EUV collector mirror actuator 37 so that the light profile (location and/or shape) of the IF image becomes the desired light profile (location and/or shape) at step S405. Further, at step S406, the EUV light source controller 31 outputs an IF image abnormal signal to the exposure unit 27 via the exposure unit controller 33 so as not to activate the exposure unit 27. Then, the process returns to step S404.

On the other hand, in the case where all evaluation items of the error of the light profile (location and/or shape) of the IF image are determined to be within the normal range, the reference sphere actuator 95 drives the reference sphere supporting unit 93 to retract the reference sphere 91 under the control of the EUV light source controller 31 at step S407. Further, at step S408, the EUV light source controller 31 outputs an IF image normal signal to the exposure unit 27 via the exposure unit controller 33. Then, the subroutine ends.

According to the fifth embodiment, since the reference location of the EUV emission point is provided without generating droplets or EUV light, the location of the EUV collector mirror can be controlled based on the IF image formed by the guide laser beam. Therefore, the time required for preparation of exposure in the EUV light source apparatus is shortened. Especially, replacement and recovery of the EUV collector mirror as a maintenance part can be performed during the start-up of the droplet generating unit, and the time required for maintenance is drastically shortened.

Figure 35:
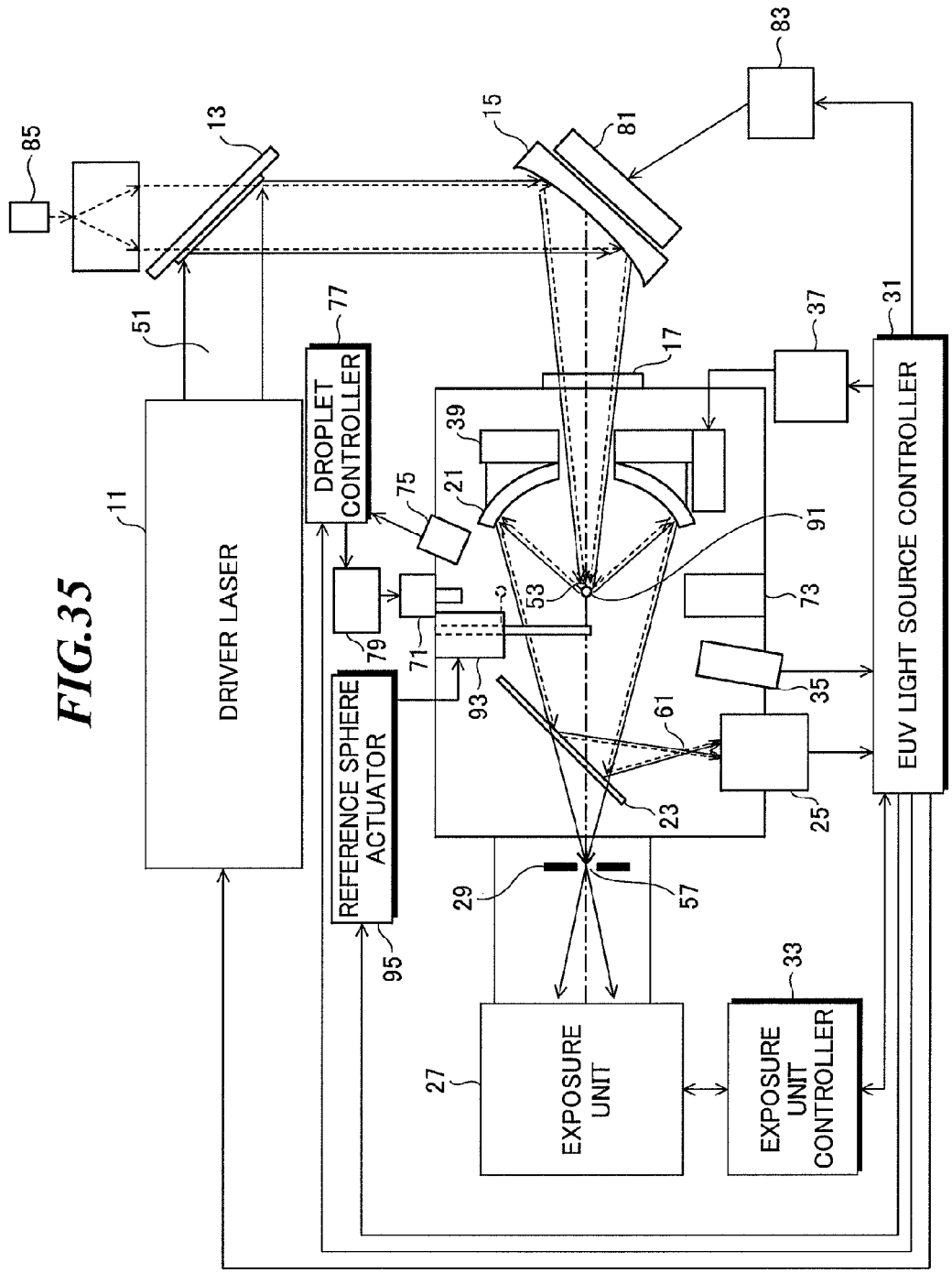
FIG. 35 is a schematic diagram showing a configuration of an EUV light source apparatus according to a modified example of the fifth embodiment of the present invention.

FIG. 35 is a schematic diagram showing a configuration of an EUV light source apparatus according to a modified example of the fifth embodiment of the present invention. In the modified example of the fifth embodiment as shown in FIG. 35, the image sensor 25 for detecting the profile of the light split by the splitter optical element 23 is provided farther from the splitter optical element 23 than that in the fifth embodiment as shown in FIG. 35. Thereby, the light reflected by the splitter optical element 23 enters the detection surface of the image sensor 25 after forming the IF image at the third focal point 61. Therefore, the image sensor 25 detects a light profile (far-field pattern) in a region (far field) farther from the EUV emission point than the third focal point 61. Alternatively, in place of detecting the far-field pattern, a light profile (near-field pattern) in a region (near field) nearer to the EUV emission point than the third focal point 61 may be detected.

Figure 36:
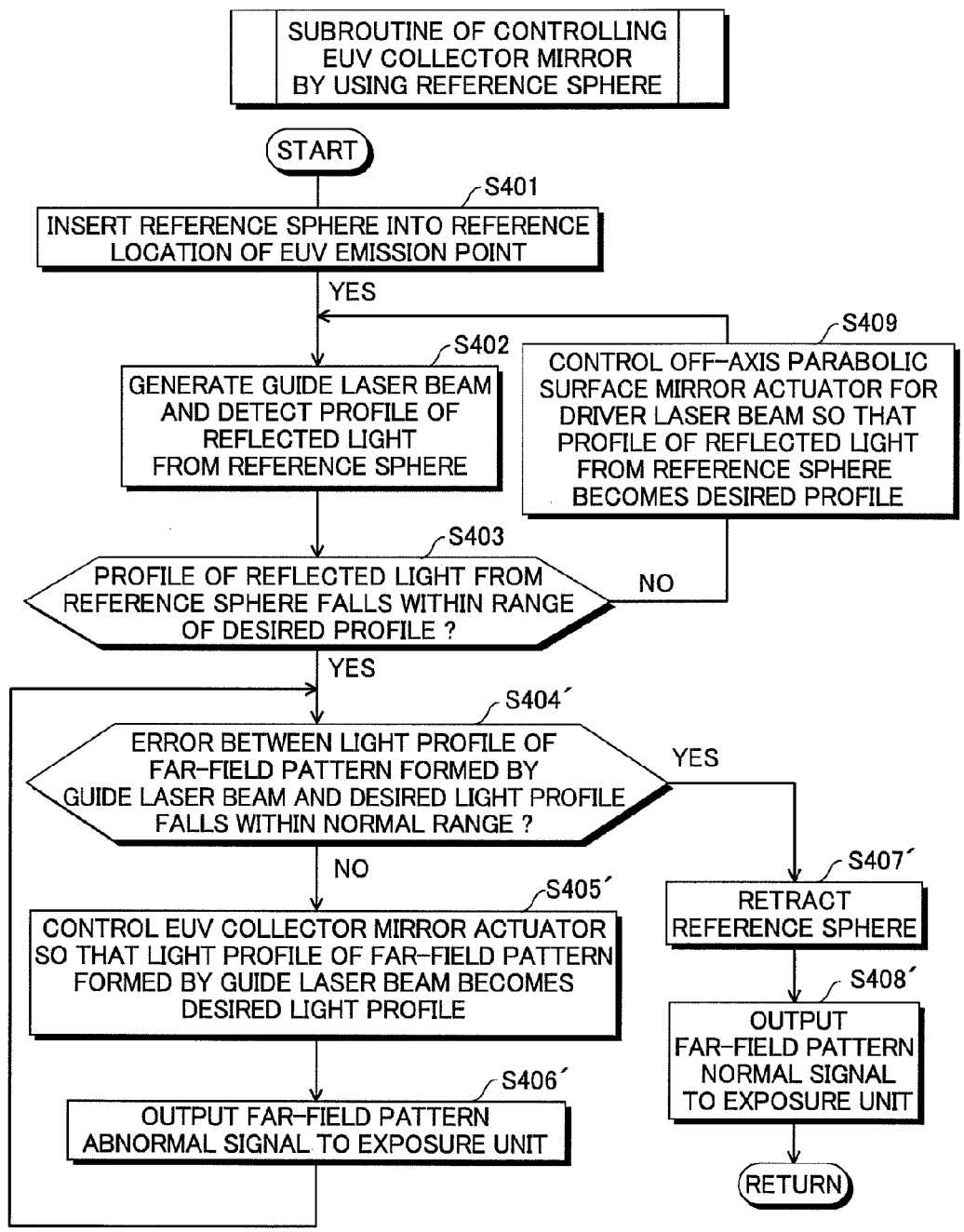
FIG. 36 is a flowchart showing an example of initial alignment operation in the modified example of the fifth embodiment of the present invention.

FIG. 36 is a flowchart showing an example of initial alignment operation in the modified example of the fifth embodiment of the present invention. Steps S401-S403 and S409 are the same as those shown in FIG. 34. At step S403, in the case where the profile (location and/or shape) of the reflected light from the reference sphere 91 is determined to be within the desired profile, the process moves to step S404'. A part of the guide laser beam reflected by the reference sphere 91 and the EUV collector mirror 21 toward the intermediate focusing point (IF) is reflected by the splitter optical element 23, and forms a far-field pattern on the detection surface of the image sensor 25. At step S404', the EUV light source controller 31 compares the light profile (location and/or shape) of the far-field pattern formed by the guide laser beam with the desired light profile (location and/or shape), and determines whether an error between them falls within a normal range or not.

In the case where at least one evaluation item of the error of the light profile (location and/or shape) of the far-field pattern is determined to be out of the normal range, the EUV light source controller 31 controls the EUV collector mirror actuator 37 so that the light profile (location and/or shape) of the far-field pattern becomes the desired light profile (location and/or shape) at step S405'. Further, at step S406', the EUV light source controller 31 outputs a far-field pattern abnormal signal to the exposure unit 27 via the exposure unit controller 33 so as not to activate the exposure unit 27. Then, the process returns to step S404'.

On the other hand, in the case where all evaluation items of the error of the light profile (location and/or shape) of the far-field pattern are determined to be within the normal range, the reference sphere actuator 95 drives the reference sphere supporting unit 93 to retract the reference sphere 91 under the control of the EUV light source controller 31 at step S407'. Further, at step S408', the EUV light source controller 31 outputs a far-field pattern normal signal to the exposure unit 27 via the exposure unit controller 33. Then, the subroutine ends.
(Image Sensor)

Figure 37:
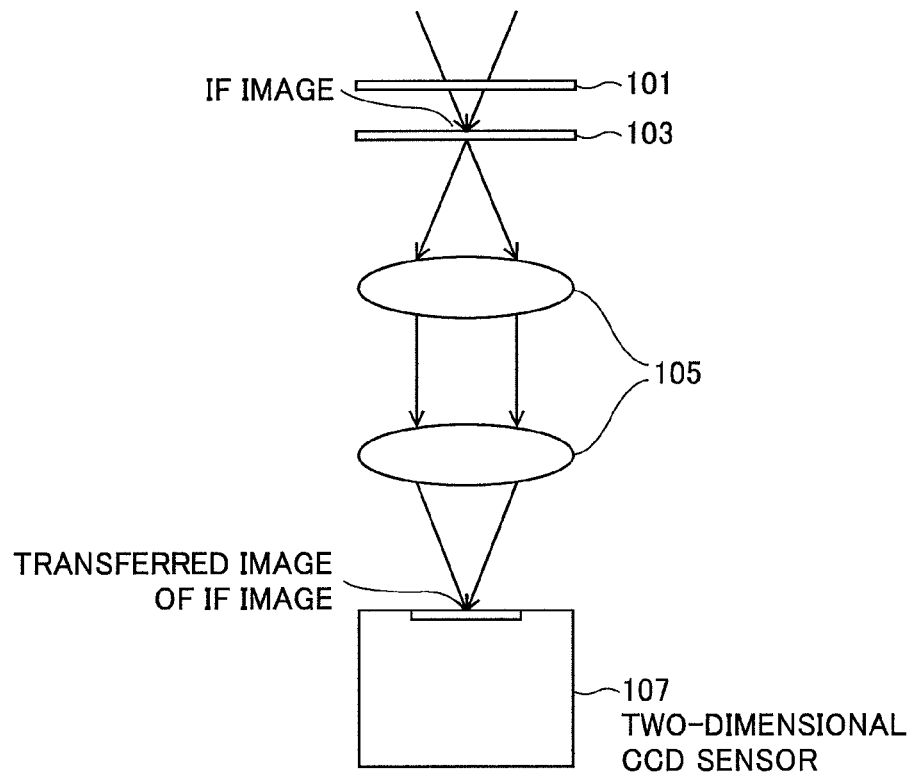
FIG. 37 is a schematic diagram showing a configuration example of an image sensor for detecting an IF image formed by split light.
Figure 38:
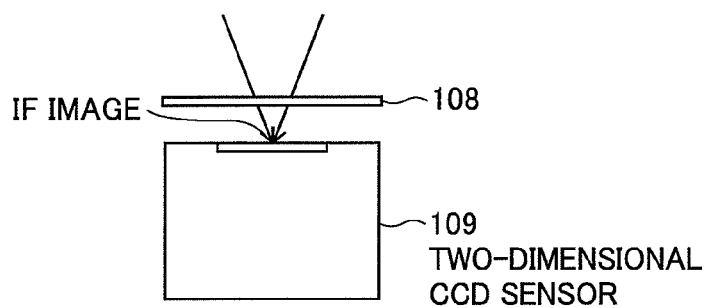
FIG. 38 is a schematic diagram showing a configuration example of an image sensor for detecting an IF image formed by split light.

FIGS. 37 and 38 are schematic diagrams showing configuration examples of an image sensor for detecting an IF image formed by split light.

The image sensor as shown in FIG. 37 includes a band-pass filter 101, a fluorescent screen 103, two transfer lenses 105, and a two-dimensional CCD sensor 107. The split light split by the splitter optical element is focused on the fluorescent screen 103 via the band-pass filter 101, and an IF image is formed on the fluorescent screen 103. Thereby, the fluorescent screen 103 emits light and the IF image is visualized. The transfer lenses 105 transfer the visualized IF image onto the detection surface of the two-dimensional CCD sensor 107, and the two-dimensional CCD sensor 107 detects the transferred image of the IF image, and thereby, the light profile (location and/or shape) of the IF image is measured.

According to the configuration, by selecting the transmission wavelength of the band-pass filter 101, IF images formed by the EUV light, the guide laser beam, and another light can be selectively detected. For example, in the case of detecting an IF image formed by EUV light having a wavelength of 13.5 nm, a band-pass filter formed of an SPF of a thin-film type (Zr/Si multilayered film) is used. Alternatively, in the case of detecting an IF image formed by a guide laser beam generated by a He—Ne laser, a band-pass filter that transmits light having a wavelength of 633 nm is used. In this case, without using the fluorescent screen 103, the transfer lenses 105 transfer the IF image formed by the split light transmitted through the band-pass filter onto the detection surface of the two-dimensional CCD sensor 107, and the two-dimensional CCD sensor 107 detects the transferred image of the IF image.

The image sensor as shown in FIG. 38 includes a band-pass filter 108 formed of an SPF of a thin-film type (Zr/Si multi-layered film), and a two-dimensional CCD sensor 109 that can detect EUV light. The band-pass filter 108 is provided before the two-dimensional CCD sensor 109, and the two-dimensional CCD sensor 109 detects an IF image formed by EUV light. Alternatively, in the case of detecting an IF image formed by light in a visible range, a band-pass filter that transmits visible light may be used so that a typical two-dimensional CCD sensor receives the light in the visible range.

Figure 39:
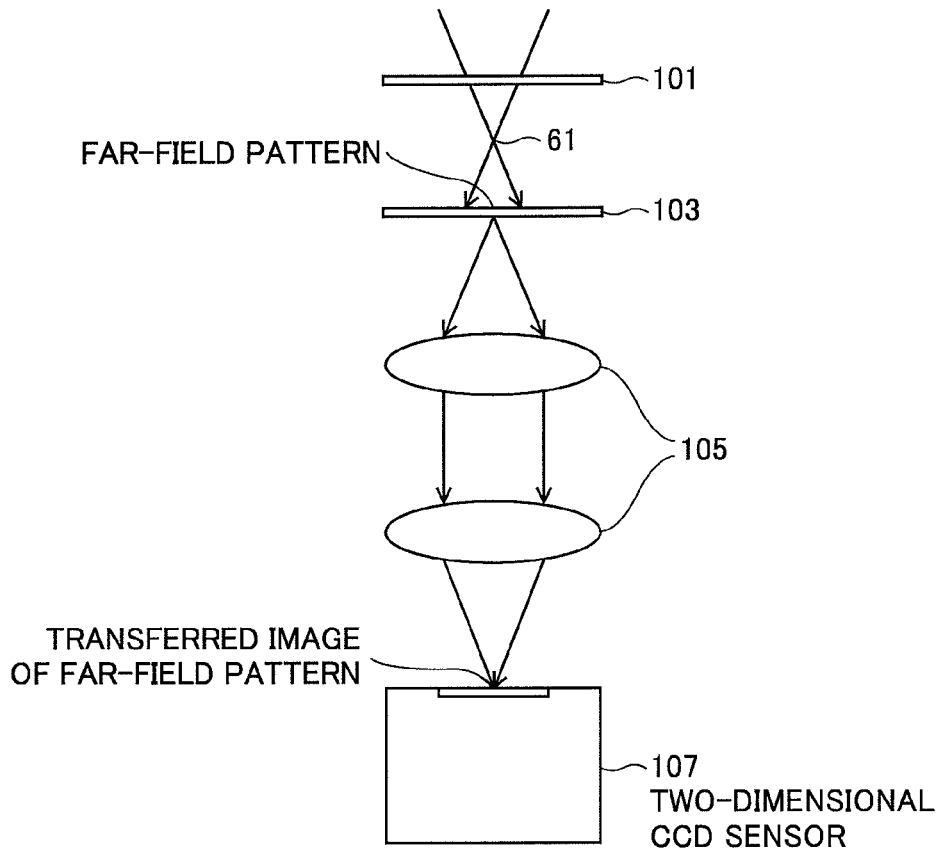
FIG. 39 is a schematic diagram showing a configuration example of an image sensor for detecting a far-field pattern formed by split light.
Figure 40:
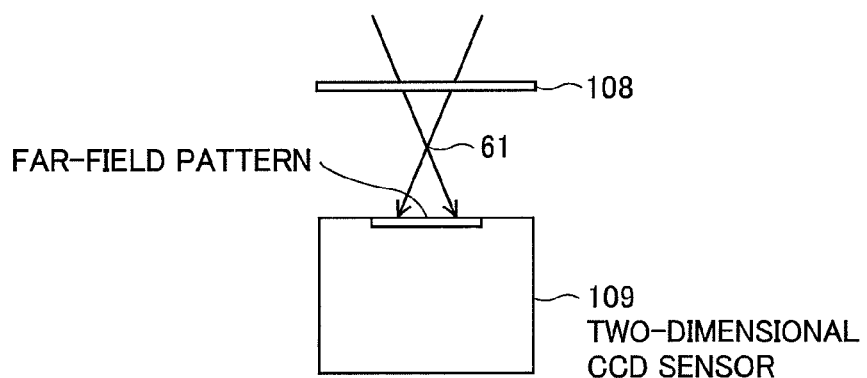
FIG. 40 is a schematic diagram showing a configuration example of an image sensor for detecting a far-field pattern formed by split light.
Figure 41:
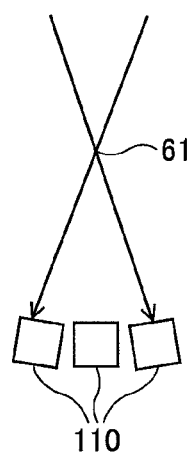
FIG. 41 is a schematic diagram showing a configuration example of an image sensor for detecting a far-field pattern formed by split light.

FIGS. 39-41 are schematic diagrams showing configuration examples of an image sensor for detecting a far-field pattern formed by split light.

In the image sensor as shown in FIG. 39, the fluorescent screen 103 for visualizing the split light is provided farther from the splitter optical element than that in FIG. 37. Therefore, the light reflected by the splitter optical element enters the fluorescent screen 103 after forming an IF image at the focal point 61. Thereby, a far-field pattern is formed on the fluorescent screen 103, and the fluorescent screen 103 emits light to visualize the far-field pattern. The transfer lenses 105 transfer the visualized far-field pattern onto the detection surface of the two-dimensional CCD sensor 107, and the two-dimensional CCD sensor 107 detects the transferred image of the far-field pattern, and thereby, the light profile (location and/or shape) of the far-field pattern is measured.

In the image sensor as shown in FIG. 40, the two-dimensional CCD sensor 109 that can detect EUV light is provided farther from the splitter optical element than that in FIG. 38. Therefore, the light reflected by the splitter optical element enters the two-dimensional CCD sensor 109 after forming an IF image at the focal point 61. Thereby, the two-dimensional CCD sensor 109 detects a far-field pattern formed by the EUV light. Alternatively, in the case of detecting a far-field pattern formed by light in a visible range, a band-pass filter that transmits visible light may be used so that a typical two-dimensional CCD sensor receives the light in the visible range.

The image sensor as shown in FIG. 41 includes plural photodiodes or plural cameras 110 for detecting split light. The split light enters the photodiodes or cameras 110 after forming an IF image at the third focal point 61. Thereby, the photodiodes or cameras 110 detect a far-field pattern formed by the split light.

For example, in the case of detecting a far-field pattern formed by EUV light having a wavelength of 13.5 nm, photodiodes or cameras that can detect EUV light are used. Alternatively, in the case of detecting a far-field pattern formed by a guide laser beam generated by a He—Ne laser, photodiodes or cameras that can detect light having a wavelength of 633 nm are used. Alternatively, in the case of detecting a far-field pattern formed by visible light, photodiodes or cameras that can detect visible light are used.

Figure 42:
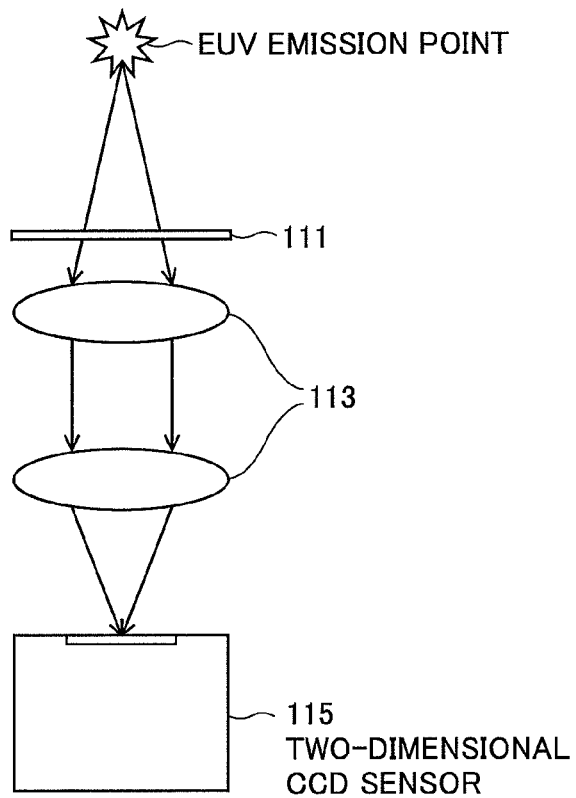
FIG. 42 is a schematic diagram showing a configuration example of an image sensor for detecting an emission point.
Figure 43:
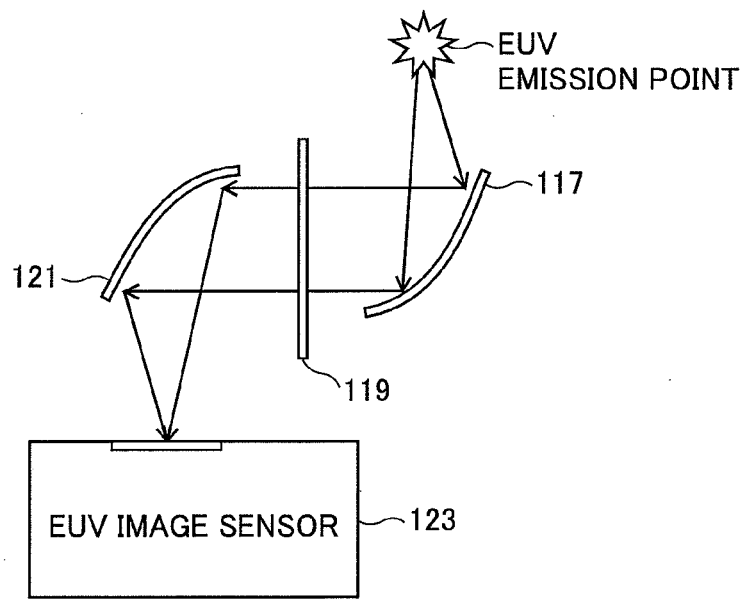
FIG. 43 is a schematic diagram showing a configuration example of an image sensor for detecting an emission point.

FIGS. 42 and 43 are schematic diagrams showing configuration examples of an image sensor for detecting an EUV emission point.

The image sensor as shown in FIG. 42 includes a band-pass filter 111, two transfer lenses 113, and a two-dimensional CCD sensor 115, and the two-dimensional CCD sensor 115 detects visible light. The band-pass filter 111 having a transmission range in the visible region is provided before the transfer lenses 113. It is preferable that lenses with corrected chromatic aberration with respect to the visible region are used as the transfer lenses 113. The transfer lenses 113 transfer an EUV emission point image formed by visible light transmitted through the band-pass filter 111 onto the detection surface of the two-dimensional CCD sensor 115, and the two-dimensional CCD sensor 115 detects the transferred image of the EUV emission point image, and thereby, the light profile (location and/or shape) of the EUV emission point image is measured.

The image sensor as shown in FIG. 43 includes a first off-axis parabolic mirror 117, a band-pass filter 119 such as an SPF including a thin film of Zr, a second off-axis parabolic mirror 121, and an EUV image sensor 123, and the EUV image sensor 123 detects EUV light. Multilayer-coatings that reflect light having a wavelength of 13.5 nm at high reflectance are coated on reflection surfaces of the parabolic mirrors 117 and 121. These component elements are provided such that the EUV emission point is located at a location of the focal point of the first off-axis parabolic mirror 117 and the detection surface of the EUV image sensor 123 is located at a location of the focal point of the second off-axis parabolic mirror 121.

The light emitted from the EUV emission point is reflected by the first off-axis parabolic mirror 117 and turned into parallel light. Only the EUV light having a wavelength of 13.5 nm is transmitted through the band-pass filter 119, reflected by the second off-axis parabolic mirror 121, and converged on the detection surface of the EUV image sensor 123 to form an EUV emission point image. Therefore, the EUV image sensor 123 detects the EUV emission point image, and thereby, the light profile (location and/or shape) of the EUV emission point is measured.

(Far-Field Pattern Stabilizing Control Operation)

Next, a detailed example of far-field pattern stabilizing control operation will be explained with reference to the EUV light source apparatus as shown in FIG. 27 as an example. In the far-field pattern stabilizing control operation, the location and posture of the EUV collector mirror 21 can be adjusted with respect to the X-axis direction (horizontal direction) orthogonal to the ideal output direction of EUV light, the Y-axis direction (vertical direction) orthogonal to the ideal output direction of the EUV light and the X-axis direction, the Z-axis direction as the ideal output direction of EUV light, the posture angle $\theta_X$ within the XZ-plane, and the posture angle $\theta_Y$ within the YZ-plane.

Figure 44:
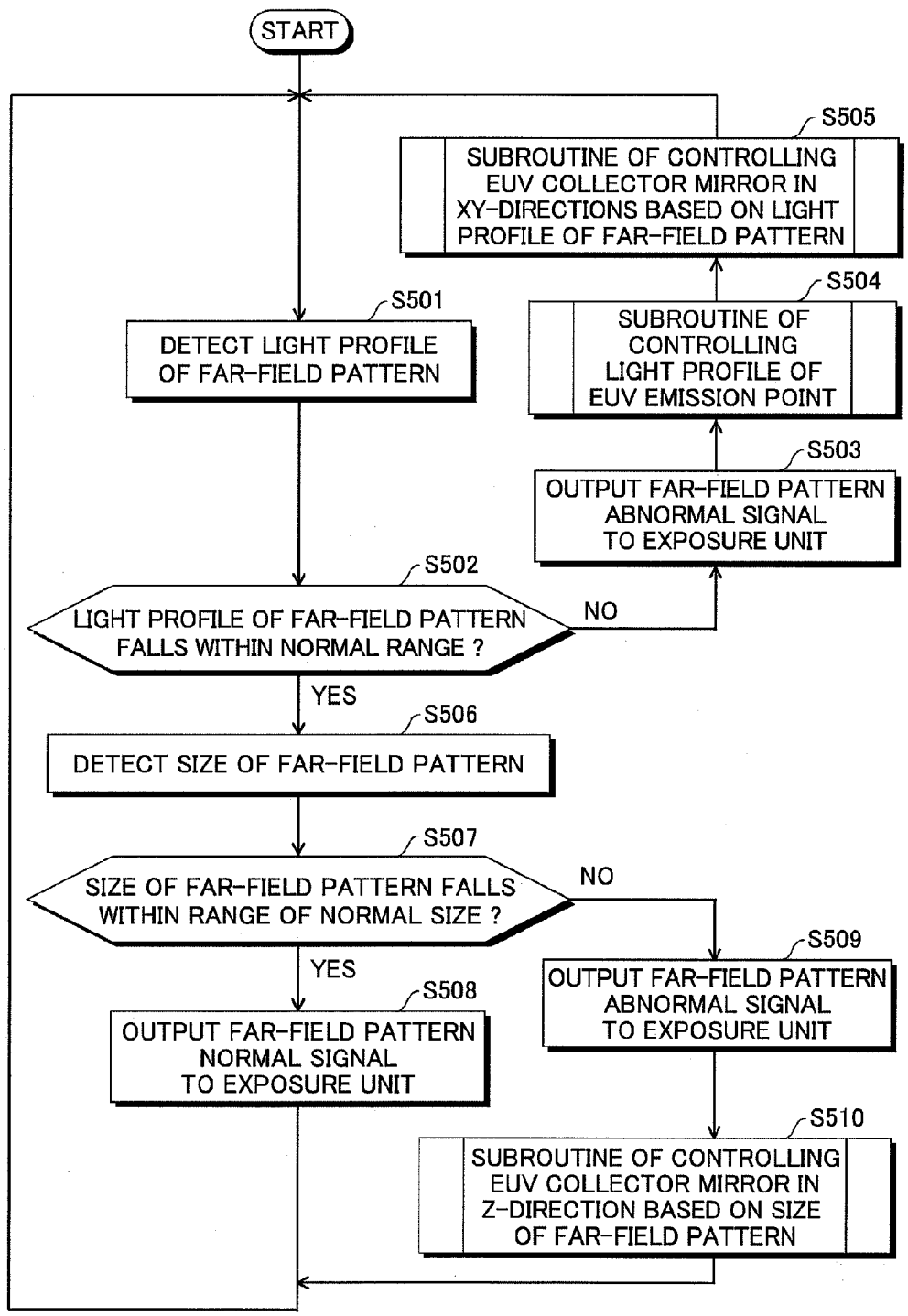
FIG. 44 is a flowchart showing a detailed example of far-field pattern stabilizing control operation.

FIG. 44 is a flowchart showing the detailed example of far-field pattern stabilizing control operation. As shown in FIG. 44, when the control flow is started, the image sensor 25 detects the light profile (location and/or shape) of the far-field pattern formed by the split light split by the splitter optical element 23 under the control of the EUV light source controller 31 at step S501.

At step S502, the EUV light source controller 31 determines whether the light profile (location and/or shape) of the far-field pattern detected by the image sensor 25 falls within a normal range or not. In the case where the light profile (location and/or shape) of the far-field pattern is determined to be out of the normal range, the process moves to step S503. At step S503, the EUV light source controller 31 issues a warning by outputting a far-field pattern abnormal signal to the exposure unit 27 via the exposure unit controller 33.

Then, at step S504, the EUV light source controller 31 controls the location of droplets and the location and/or posture of the off-axis parabolic mirror 15 so that the light profile (location and/or shape) of the EUV emission point becomes the desired light profile (location and/or shape). The operation at step S504 is executed by a subroutine of controlling the light profile (location and/or shape) of the EUV emission point as shown in FIG. 26.

Further, at step S505, the EUV light source controller 31 outputs a control signal to the EUV collector mirror actuator 37 to control the location and the posture of the EUV collector mirror 21 so that the light profile (location and/or shape) of the far-field pattern becomes the desired light profile (location and/or shape). The operation at step S505 is executed by a subroutine of controlling the EUV collector mirror in XY-directions based on the light profile of the far-field pattern, which will be specifically explained later. Then, the process returns to step S501.

On the other hand, in the case where the light profile (location and/or shape) of the far-field pattern is determined to be within the normal range at step S502, the process moves to step S506. At step S506, the image sensor 25 detects the size of the far-field pattern under the control of the EUV light source controller 31.

At step S507, the EUV light source controller 31 determines whether the size of the far-field pattern detected by the image sensor 25 falls within a normal size range or not. In the case where the size of the far-field pattern is determined to be within the normal size range, the EUV light source controller 31 outputs a far-field pattern normal signal to the exposure unit 27 via the exposure unit controller 33 at step S508.

On the other hand, in the case where the size of the far-field pattern is determined to be out of the normal size range, the EUV light source controller 31 issues a warning by outputting a far-field pattern abnormal signal to the exposure unit 27 via the exposure unit controller 33 at step S509. Further, at step S510, the EUV light source controller 31 outputs a control signal to the EUV collector mirror actuator 37 to control the location and/or posture of the EUV collector mirror 21 so that the size of the far-field pattern becomes a desired size. The operation at step S510 is executed by a subroutine of controlling the EUV collector mirror in Z-direction based on the size of the far-field pattern, which will be specifically explained later. Then, the process returns to step S501.

FIGS. 45A-45E are diagrams for explanation of an example of operation of controlling the EUV collector mirror by using a light profile (location and/or shape) of a far-field pattern In FIGS. 45A-45E, for simple explanation, the splitter optical element is omitted and the light reflected by the EUV collector mirror 21 directly forms a far-field pattern on the fluorescent screen 103 (the detection surface of the image sensor 25 as shown in FIG. 27).

Figure 45A:
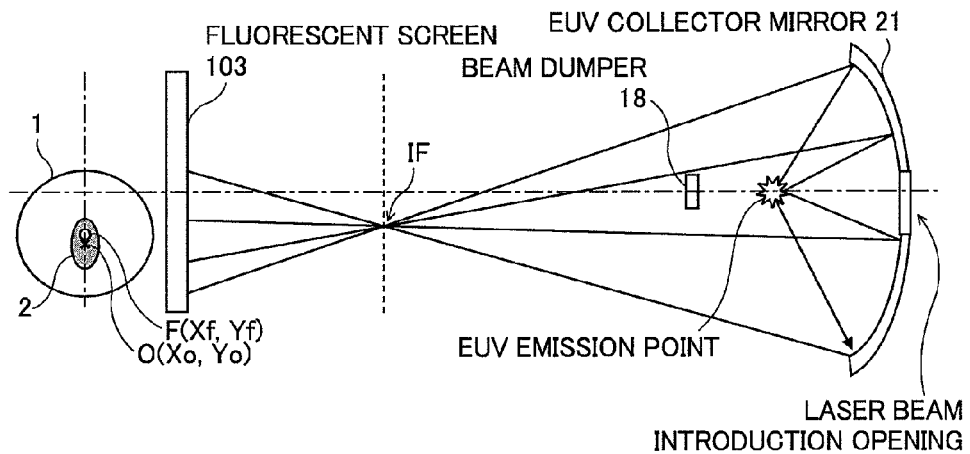
FIGS. 45A-45E are diagrams for explanation of an example of control operation of the EUV collector mirror using a location and an intensity distribution of a far-field pattern.

FIG. 45A shows the case where the location of the EUV collector mirror is shifted downward. Given that the center location of a far-field pattern 1 formed by the EUV collector mirror 21 collecting the EUV light radiated from the EUV emission point is F(Xf, Yf), it is shown that Xf=0 and Yf=−a (a>0), and the center location of the far-field pattern is shifted downward.

Further, a beam dumper 18 for absorbing the driver laser beam is provided in the obscuration area between the first focal point (EUV emission point) and the second focal point (IF) of the EUV collector mirror 21, and a laser beam introduction opening is formed in the EUV collector mirror 21, and thereby, an obscuration pattern 2 is formed within the far-field pattern 1. Given that the center location of the obscuration pattern 2 is O(Xo, Yo), it is shown that Xo=0 and Yo=−b(b>0), and the center location of the obscuration pattern 2 is also shifted downward.

Here, as the obscuration pattern, an example of a pattern of a shadow part (a part where vignetting of EUV light occurs) is shown which is formed by the laser beam dumper 18 (circular) and the laser beam introduction opening (circular) of the EUV collector mirror 21.

Figure 45B:
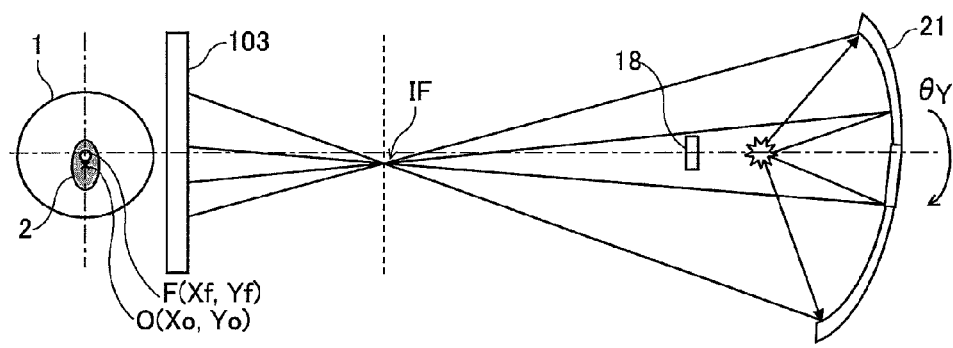

FIG. 45B shows a state in which the posture angle of the EUV collector mirror has been adjusted. As shown in FIG. 45B, the posture angle $\theta_Y$ of the EUV collector mirror 21 has been adjusted such that the center location F(Xf, Yf) of the far-field pattern 1 becomes the target location F(0, 0).

Figure 45C:
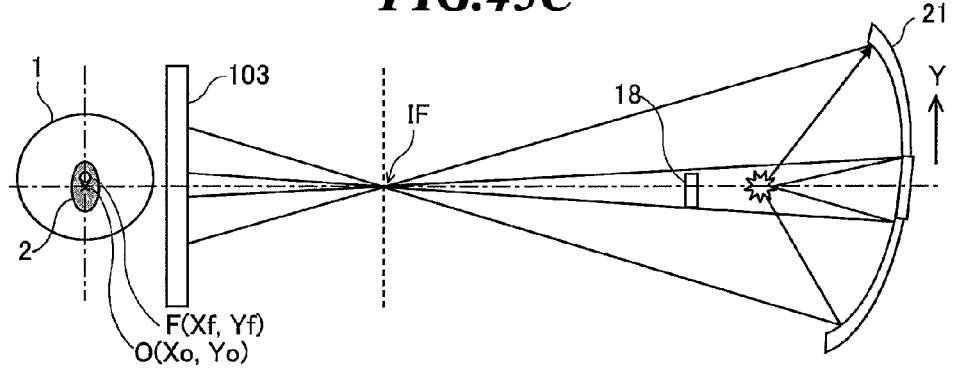

FIG. 45C shows a state in which the location of the EUV collector mirror has been adjusted. As shown in FIG. 45C, the location "Y" of the EUV collector mirror 21 has been adjusted such that the center location O(Xo, Yo) of the obscuration pattern 2 becomes the target location O(0, 0).

Figure 45D:
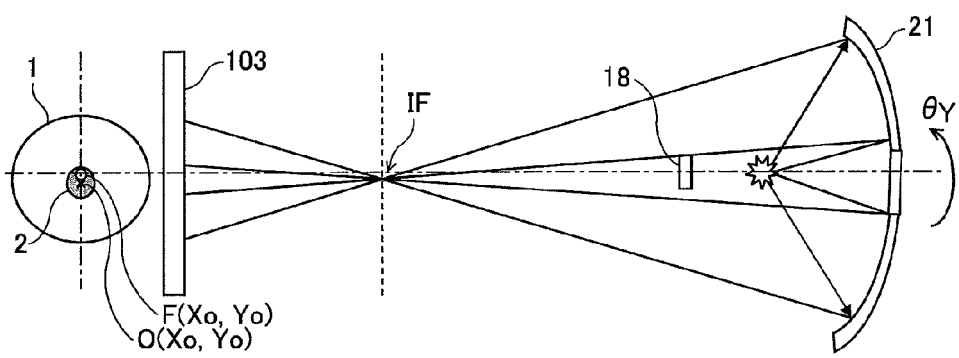

FIG. 45D shows a state in which the posture angle of the EUV collector mirror has been adjusted again. As shown in FIG. 45D, the posture angle $\theta_Y$ of the EUV collector mirror 21 has been adjusted again such that the center location F(Xf, Yf) of the far-field pattern 1 becomes the target location F(0, 0).

Figure 45E:
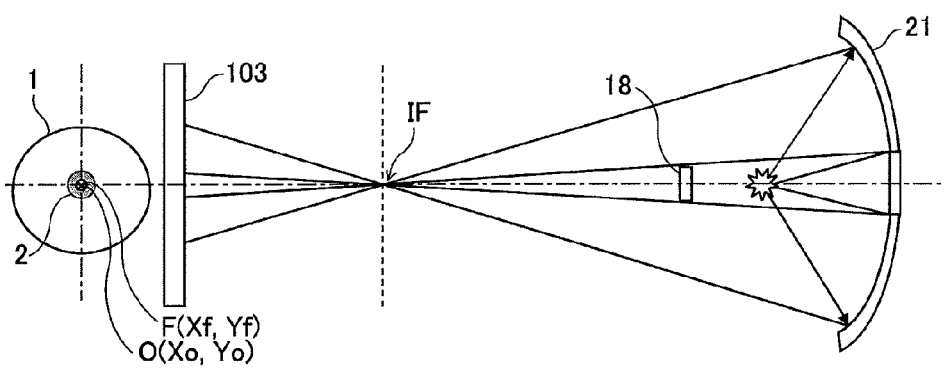

In this manner, the adjustment of the posture angle of the EUV collector mirror 21 as shown in FIG. 45B and the adjustment of the location of the EUV collector mirror 21 as shown in FIG. 45C are repeated until the center location F(Xf,Yf) of the far-field pattern 1 and the center location O(Xo,Yo) of the obscuration pattern 2 fall within the respective ranges of the target locations. Thereby, as shown in FIG. 45E, the light profile (location and/or shape) of the far-field pattern 1 falls within the desired range.

Figure 46:
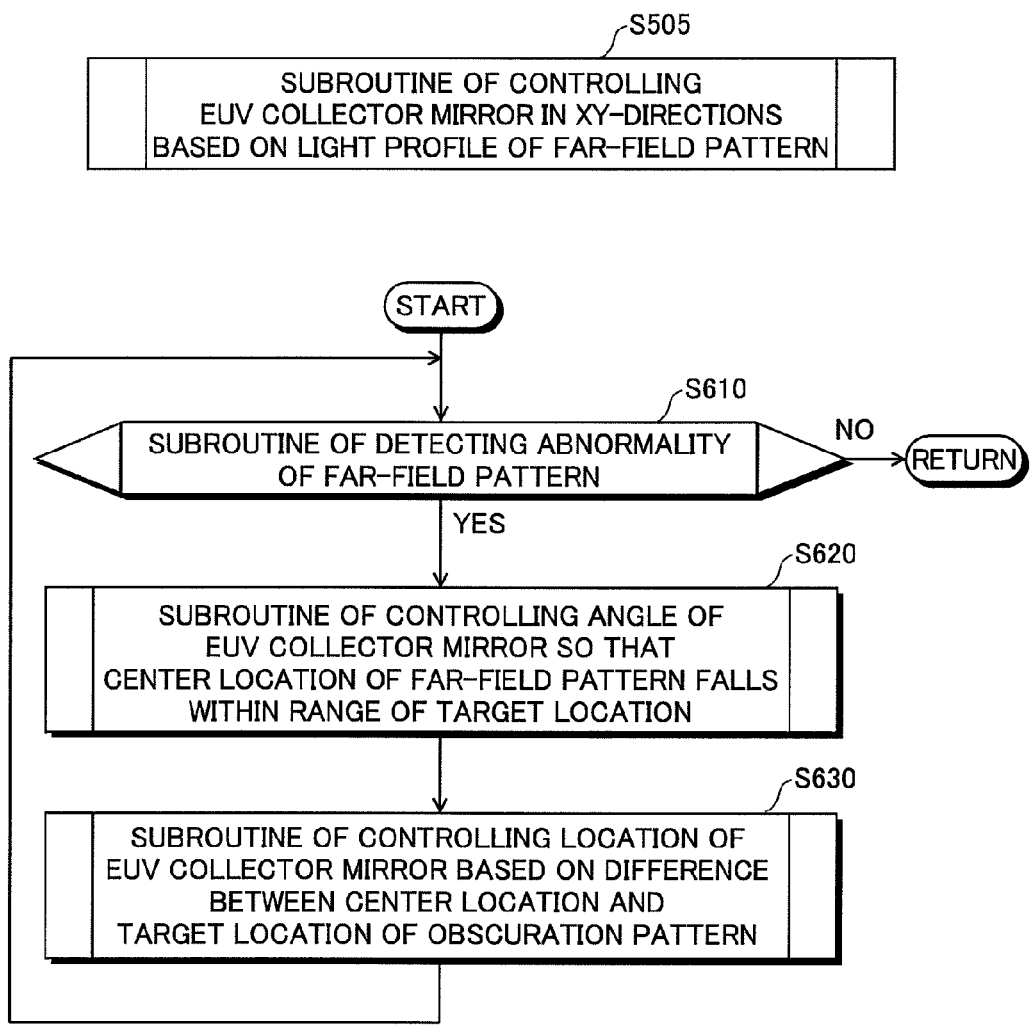
FIG. 46 is a flowchart showing a subroutine of XY-directions control of the EUV collector mirror using a light profile (location and/or shape) of the far-field pattern.

FIG. 46 is a flowchart showing the subroutine of controlling the EUV collector mirror in XY-directions based on the light profile (location and/or shape) of the far-field pattern (step S505 as shown in FIG. 44). First, at step S610, a subroutine of detecting an abnormality of the far-field pattern is executed. In the case where an abnormality of the far-field pattern is detected in the subroutine, the process moves to step S620.

At step S620, a subroutine of controlling the angle of the EUV collector mirror so that the center location of the far-field pattern falls within the range of the target location is executed. When the center location of the far-field pattern falls within the range of the target location, the process moves to step S630. At step S630, a subroutine of controlling the location of the EUV collector mirror based on a difference between the center location and the target location of the obscuration pattern is executed. Then, the process returns to step S610.

In the case where no abnormality of the far-field pattern is detected at step S610, the subroutine of controlling the EUV collector mirror in XY-directions based on the light profile (location and/or shape) of the far-field pattern (step S505 as shown in FIG. 44) ends, and the process returns to step S501 as shown in FIG. 44.

Figure 47:
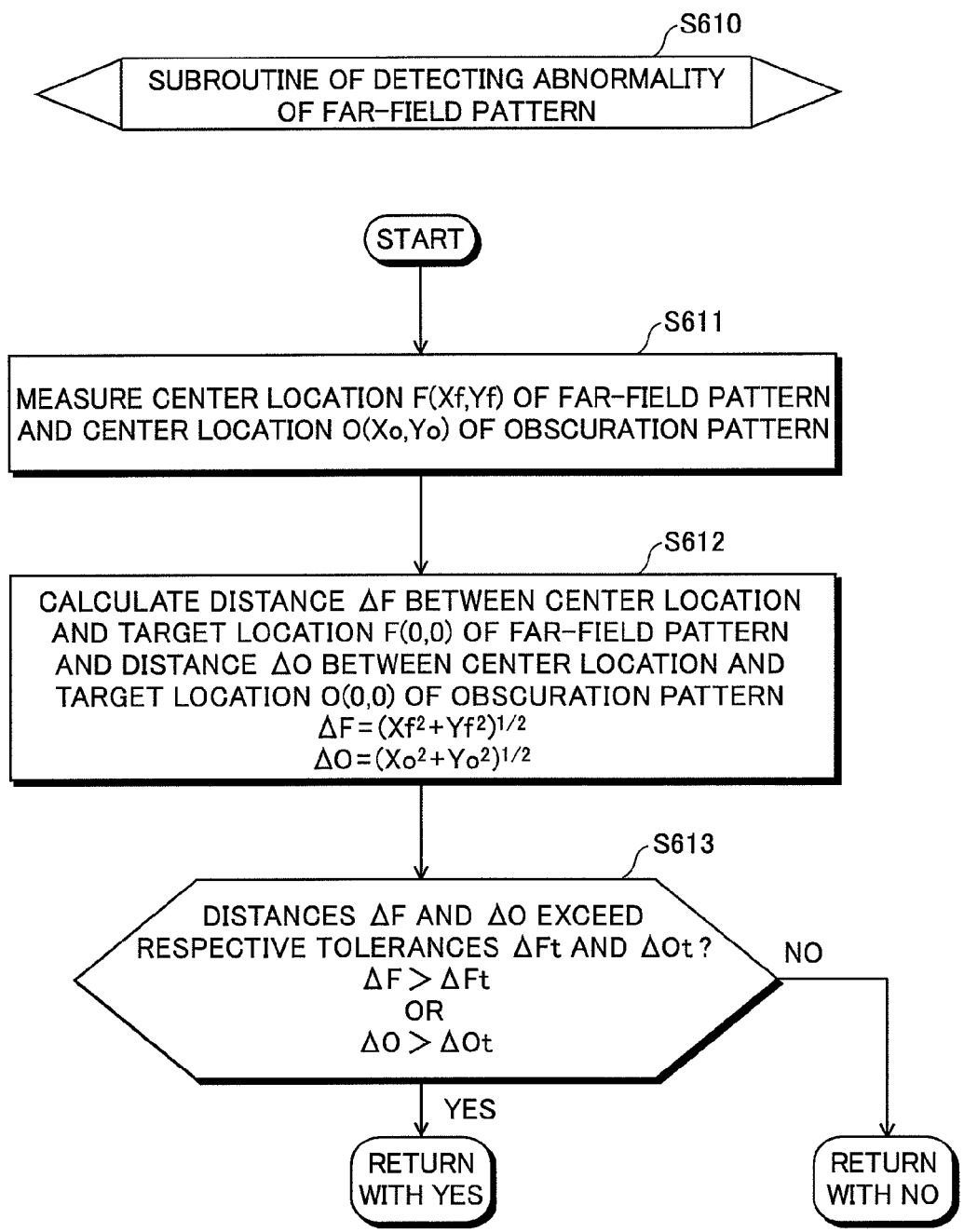
FIG. 47 is a flowchart showing a subroutine of abnormality detection of the far-field pattern.

FIG. 47 is a flowchart showing the subroutine of detecting an abnormality of the far-field pattern (step S610 as shown in FIG. 46). When the subroutine is started, at step S611, the EUV light source controller 31 measures the center location F(Xf,Yf) of the far-field pattern and the center location O(Xo, Yo) of the obscuration pattern based on the detection result of the image sensor 25.

At step S612, the EUV light source controller 31 calculates the distance OF between the center location F(Xf, Yf) of the far-field pattern and the target location F(0, 0) of the far-field pattern, and calculates the distance ΔO between the center location O(Xo, Yo) of the obscuration pattern and the target location O(0, 0) of the obscuration pattern according to the following equations.

$$\Delta F = (Xf^2 + Yf^2)^{1/2}$$

$$\Delta O = (Xo^2 + Yo^2)^{1/2}$$

At step S613, the EUV light source controller 31 determines whether the distances ΔF and ΔO exceed the respective tolerances ΔFt and ΔOt or not. In the case where the distance ΔF exceeds the tolerance ΔFt or the distance ΔO exceeds the tolerance ΔOt, the subroutine ends with the determination result "YES", and the process moves to step S620 as shown in FIG. 46. On the other hand, in the case where the distance ΔF is equal to or less than the tolerance ΔFt and the distance ΔO is equal to or less than the tolerance ΔOt, the subroutine ends with the determination result "NO", and the process moves to step S501 as shown in FIG. 44.

Figure 48:
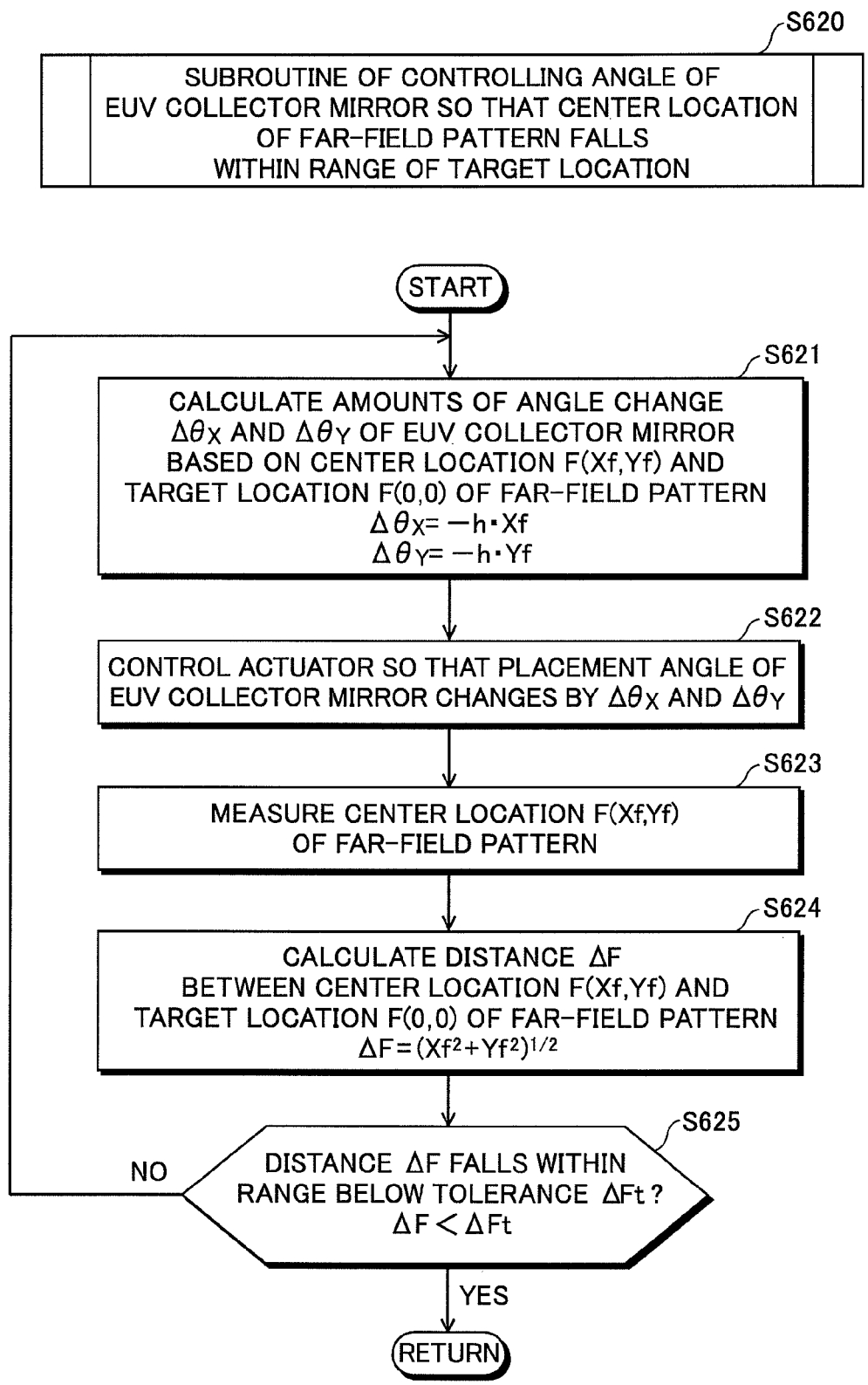
FIG. 48 is a flowchart showing a subroutine of controlling an angle of the EUV collector mirror so that a center location of the far-field pattern falls within a target location range.

FIG. 48 is a flowchart showing the subroutine of controlling the angle of the EUV collector mirror so that the center location of the far-field pattern falls within the range of the target location (step S620 as shown in FIG. 46). When the subroutine is started, at step S621, the EUV light source controller 31 calculates amounts of angle change $\Delta\theta_X$ and $\Delta\theta_Y$ of the EUV collector mirror 21 based on the center location F(Xf,Yf) of the far-field pattern and the target location F(0, 0) of the far-field pattern according to the following equations.

$$\Delta\theta_X = -h \cdot Xf$$

$$\Delta\theta_Y = -h \cdot Yf$$

where "h" is a proportional constant or function for converting the error of the center location of the far-field pattern into the amount of angle change of the EUV collector mirror 21.

At step S622, the EUV light source controller 31 controls the EUV collector mirror actuator 37 so that the placement angle of the EUV collector mirror 21 changes by the amounts of angle change $\Delta\theta_X$ and $\Delta\theta_Y$. Then, at step S623, the EUV light source controller 31 measures the center location F(Xf, Yf) of the far-field pattern based on the detection result of the image sensor 25.

At step S624, the EUV light source controller 31 calculates a distance ΔF between the center location F(Xf, Yf) of the far-field pattern and the target location F(0, 0) of the far-field pattern according to the following equation.

$$\Delta F = (Xf^2 + Yf^2)^{1/2}$$

At step S625, the EUV light source controller 31 determines whether the distance ΔF falls within a range below an tolerance ΔFt or not. In the case where the distance ΔF is determined to be equal to or more than the tolerance ΔFt, the process returns to step S621. On the other hand, in the case where the distance ΔF is determined to be less than the tolerance ΔFt, the subroutine ends and the process moves to step S630 as shown in FIG. 46.

Figure 49:
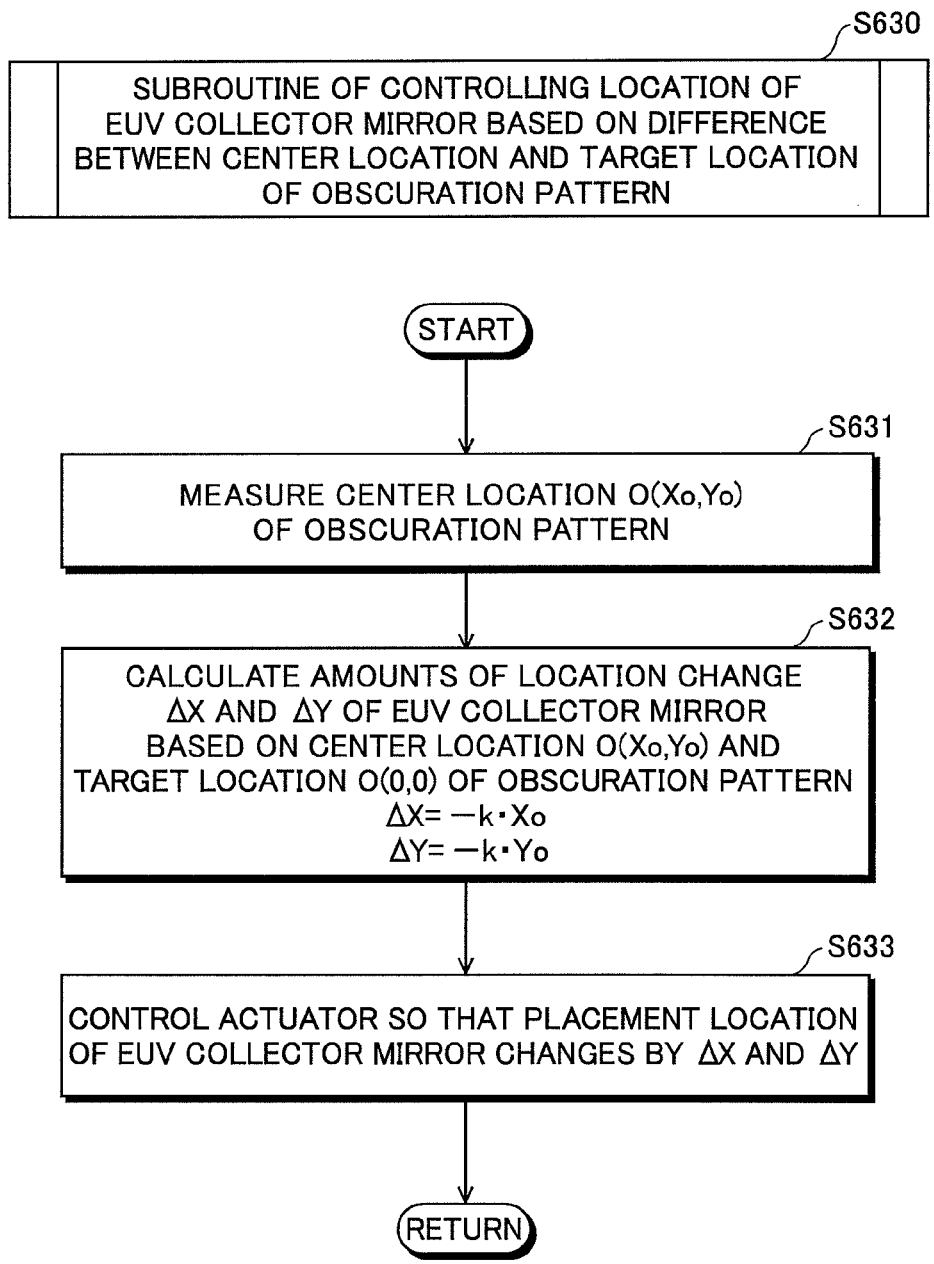
FIG. 49 is a flowchart showing a subroutine of controlling a location of the EUV collector mirror according to a difference between a center location and a target location of an obscuration pattern.

FIG. 49 is a flowchart showing the subroutine of controlling a location of the EUV collector mirror based on a difference between a center location and a target location of the obscuration pattern (step S630 as shown in FIG. 46). When the subroutine is started, at step S631, the EUV light source controller 31 measures the center location O(Xo, Yo) of the obscuration pattern based on the detection result of the image sensor 25.

At step S632, EUV light source controller 31 calculates the amounts of location change ΔX and ΔY of the EUV collector mirror 21 based on the center location O(Xo, Yo) of the obscuration pattern and the target location O(0, 0) of the obscuration pattern according to the following equations.

$$\Delta X = -k \cdot Xo$$

$$\Delta Y = -k \cdot Yo$$

where "k" is a proportional constant or function for converting the error of the center location of the obscuration pattern into the amount of location change of the EUV collector mirror 21.

At step S633, the EUV light source controller 31 controls the EUV collector mirror actuator 37 so that the placement location of the EUV collector mirror 21 changes by the amounts of location change ΔX and ΔY. Then, the subroutine ends and the process returns to step S610 as shown in FIG. 46.

Figure 50A:
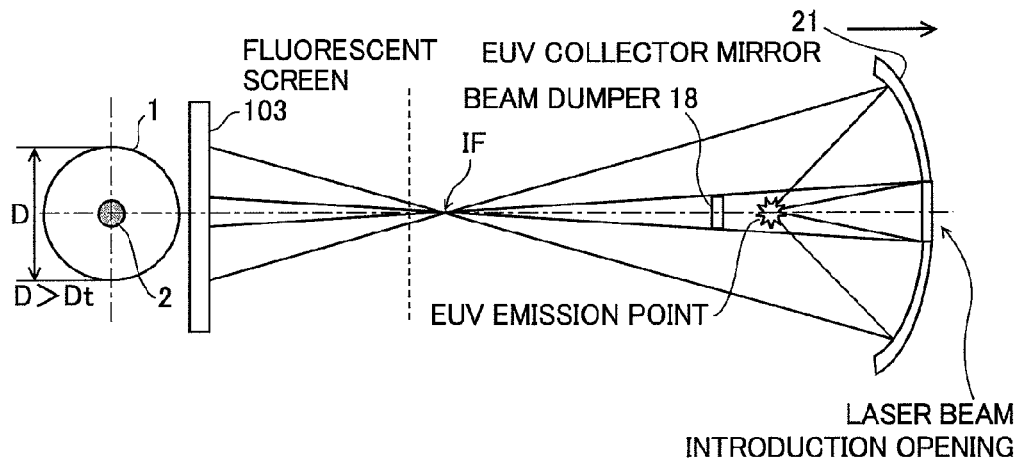
FIGS. 50A-50C show relationships between a placement location of the EUV collector mirror in the Z-axis direction and a far-field pattern.
Figure 50B:
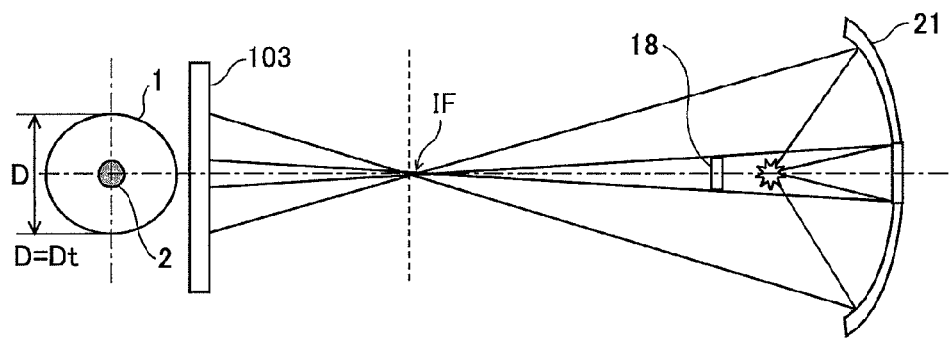
Figure 50C:
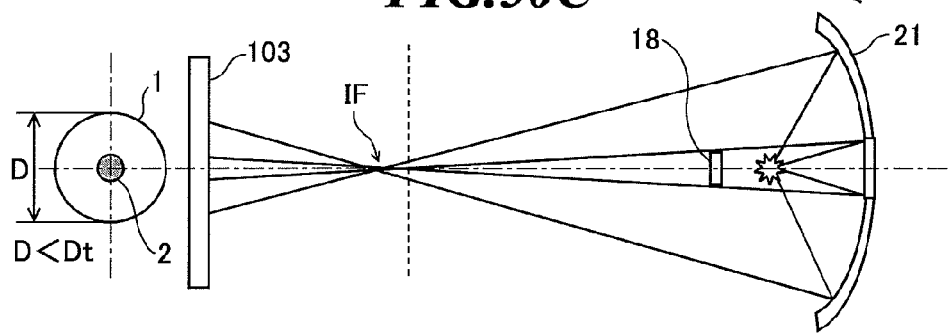

FIGS. 50A-50C show relationships between a placement location of the EUV collector mirror 21 in the Z-axis direction and a far-field pattern. In FIGS. 50A-50C, for simple explanation, the splitter optical element is omitted and the light reflected by the EUV collector mirror 21 directly forms a far-field pattern on the fluorescent screen 103 (the detection surface of the image sensor 25 as shown in FIG. 27).

FIG. 50A shows the case where the EUV collector mirror 21 is shifted rightward. When the EUV collector mirror 21 is shifted rightward (in the minus direction of the Z-axis), a diameter "D" of the far-field pattern 1 becomes larger than a target diameter Dt (D>Dt). FIG. 50B shows the case where the EUV collector mirror 21 is not shifted in the Z-axis direction. When the EUV collector mirror 21 is not shifted in the Z-axis direction, the diameter "D" of the far-field pattern 1 is equal to the target diameter Dt (D=Dt).

FIG. 50C shows the case where the EUV collector mirror 21 is shifted leftward. When the EUV collector mirror 21 is shifted leftward (in the plus direction of the Z-axis), the diameter "D" of the far-field pattern 1 is smaller than the target diameter Dt (D<Dt).

Figure 51:
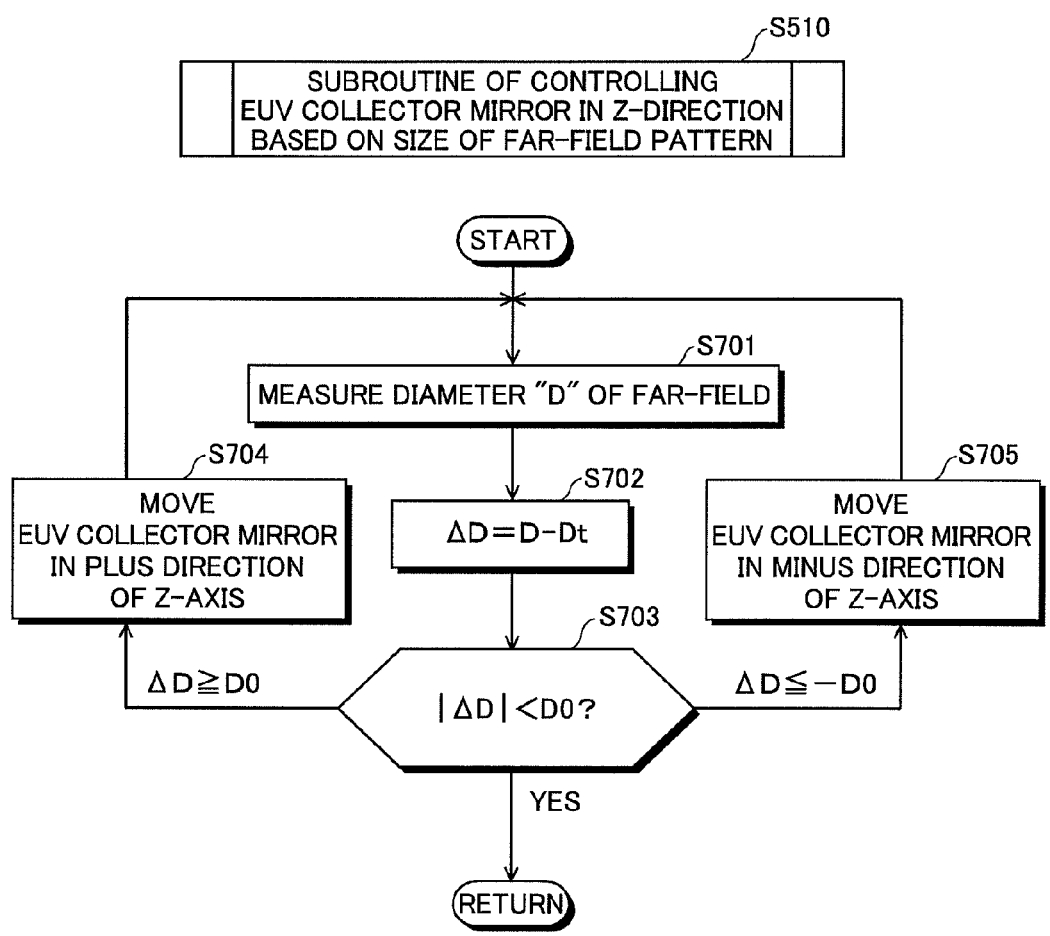
FIG. 51 is a flowchart showing a subroutine of Z-direction control of the EUV collector mirror according to the size of the far-field pattern.
Figure 52:
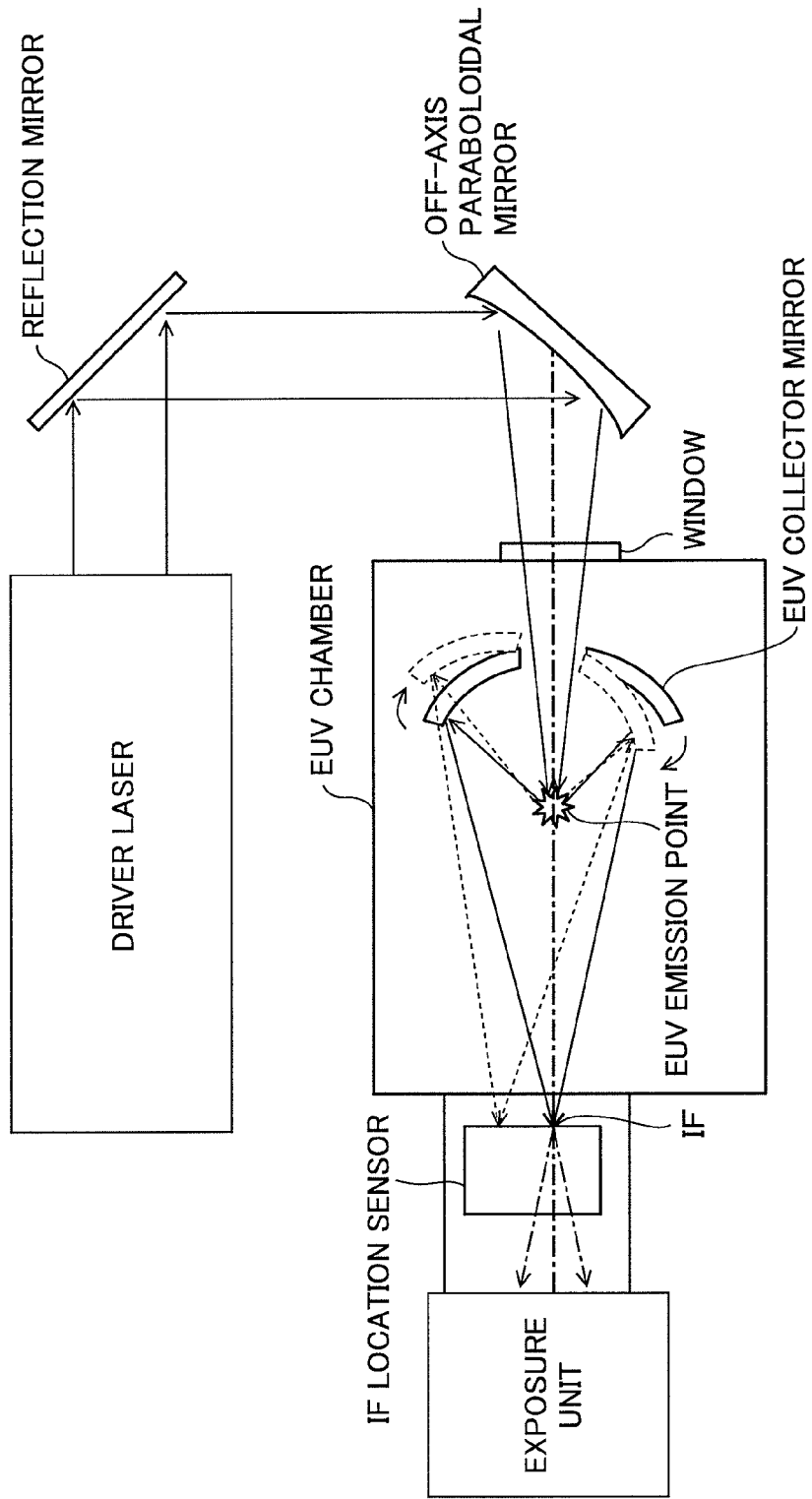
FIG. 52 is a schematic diagram for explanation of a configuration and an alignment method of a conventional LPP type EUV light source apparatus.

FIG. 51 is a flowchart showing the subroutine of controlling the EUV collector mirror in Z-direction based on the size of the far-field pattern (step S510 as shown in FIG. 44). When the subroutine is started, at step S701, the EUV light source controller 31 measures the diameter "D" of the far-field pattern 1 based on the detection result of the image sensor 25. At step S702, the EUV light source controller 31 obtains a difference ΔD between the diameter "D" of the far-field pattern and the target diameter Dt of the far-field pattern.

$$\Delta D = D - Dt$$

At step S703, the EUV light source controller 31 determines whether the absolute value of the difference |ΔD| is smaller than a desired value D0 (D0>0) or not. The case where the absolute value of the difference |ΔD| is not smaller than the desired value D0 includes the case where the difference ΔD is equal to or more than D0 and the case where the difference ΔD is equal to or less than −D0.

In the case where the difference ΔD is equal to or more than D0, the process moves to step A704. At step S704, the EUV light source controller 31 moves the EUV collector mirror 21 in the plus (+) direction of the Z-axis. Then, the process returns to step S701. In the case where the difference ΔD is equal to or less than −D0, the process moves to step S705. At step S705, the EUV light source controller 31 moves the EUV collector mirror 21 in the minus (−) direction of the Z-axis. Then, the process returns to step S701.

On the other hand, in the case where the absolute value of the difference |ΔD| is smaller than the desired value D0, the subroutine ends and the process returns to step S501 as shown in FIG. 44.

As explained above, by detecting the light profiles of the far-field pattern and the obscuration pattern, the optical axis control of the EUV collector mirror 21 becomes easier compared to the case where the light profile of the IF image is detected.

The invention claimed is:

1. An extreme ultraviolet light source apparatus for outputting extreme ultraviolet light emitted from plasma generated by irradiating a target material with a laser beam supplied from an outside, said apparatus comprising:
a chamber in which the extreme ultraviolet light is generated;
a target supply mechanism for supplying the target material to be irradiated with the laser beam into said chamber so as to generate the plasma;
a collector mirror for reflecting and collecting at least the extreme ultraviolet light included in light emitted from the plasma;
a splitter optical element provided in an obscuration area with respect to said collector mirror, for splitting a part of the light emitted from the plasma; and
a detection mechanism for detecting a profile of the light split by said splitter optical element.

2. The extreme ultraviolet light source apparatus according to claim 1, wherein said splitter optical element includes a spectral purity filter for transmitting the extreme ultraviolet light having a desired wavelength reflected by said collector mirror, and reflecting or diffracting light having other wavelengths reflected by said collector mirror.

3. The extreme ultraviolet light source apparatus according to claim 2, wherein said spectral purity filter includes a thin film for transmitting the extreme ultraviolet light.

4. The extreme ultraviolet light source apparatus according to claim 2, wherein said spectral purity filter includes a diffraction grating for transmitting the extreme ultraviolet light.

5. The extreme ultraviolet light source apparatus according to claim 1, wherein said splitter optical element includes a reflective grating for diffracting and focusing the extreme ultraviolet light having a desired wavelength reflected by said collector mirror, and reflecting and splitting light having other wavelengths reflected by said collector mirror.

6. The extreme ultraviolet light source apparatus according to claim 1, wherein said splitter optical element includes a mirror for reflecting light reflected by said collector mirror.

7. The extreme ultraviolet light source apparatus according to claim 1, wherein said collector mirror has a first focal point and a second focal point, and reflects light including the extreme ultraviolet light, which is radiated from the plasma at said first focal point, toward said second focal point.

8. The extreme ultraviolet light source apparatus according to claim 1, further comprising:
a guide laser for generating a guide laser beam,
wherein said collector mirror has a first focal point and a second focal point, and reflects light, which is generated by said guide laser and scattered at said first focal point, toward said second focal point.

9. The extreme ultraviolet light source apparatus according to claim 8, further comprising:
an actuator for inserting a reference sphere, which scatters the guide laser beam generated by said guide laser, to a location of said first focal point of said collector mirror.

10. The extreme ultraviolet light source apparatus according to claim 1, further comprising:
a control mechanism for controlling at least one of a location and a posture of said collector mirror based on a detection result of the profile by said detection mechanism.

11. The extreme ultraviolet light source apparatus according to claim 1, wherein:
said collector mirror has a first focal point and a second focal point, and reflects light, which is generated at said first focal point, toward said second focal point, and
said detection mechanism is provided in a location where an image of the second focal point of said collector mirror is formed.

12. The extreme ultraviolet light source apparatus according to claim 1, wherein:
said collector mirror has a first focal point and a second focal point, and reflects light, which is generated at said first focal point, toward said second focal point, and
said detection mechanism is provided in a predetermined location downstream or upstream of a location where an image of the second focal point of said collector mirror is formed.

13. The extreme ultraviolet light source apparatus according to claim 11, further comprising:
a control mechanism for controlling at least one of a location and a posture of said collector mirror based on a detection result of the profile by said detection mechanism.

14. The extreme ultraviolet light source apparatus according to claim 12, further comprising:
a control mechanism for controlling at least one of a location and a posture of said collector mirror based on a detection result of the profile by said detection mechanism.

15. An extreme ultraviolet light source apparatus for outputting extreme ultraviolet light emitted from plasma generated by irradiating a target material with a laser beam supplied from an outside, said apparatus comprising:
a chamber in which the extreme ultraviolet light is generated;
a target supply mechanism for supplying the target material into said chamber;
a target location sensor for detecting a location of the target material supplied into said chamber;
a target actuator for adjusting a location of said target supply mechanism;

a target controller for controlling said target actuator to adjust the location of said target supply mechanism based on a detection result by said target location sensor such that said target supply mechanism supplies the target material in a predetermined position;

a collector mirror for collecting at least the extreme ultraviolet light included in light emitted from the plasma;

a splitter optical element provided in an obscuration area with respect to said collector mirror, for splitting a part of the light emitted from the plasma; and a detection mechanism for detecting a profile of light split by said splitter optical element.

16. The extreme ultraviolet light source apparatus according to claim 15, wherein said collector mirror has a first focal point and a second focal point, and said splitter optical element is provided between the first focal point and the second focal point of said collector mirror.

17. The extreme ultraviolet light source apparatus according to claim 15, wherein said detection mechanism detects visible light emitted from the plasma.

18. The extreme ultraviolet light source apparatus according to claim 15, wherein said detection mechanism detects the extreme ultraviolet light, which has been transmitted by a grid and reflected by a mirror for reflecting the extreme ultraviolet light, through a filter for transmitting the extreme ultraviolet light.

19. An extreme ultraviolet light source apparatus for outputting extreme ultraviolet light emitted from plasma generated by irradiating a target material with a laser beam supplied from an outside, said apparatus comprising:

a chamber in which the extreme ultraviolet light is generated;

a target supply mechanism for supplying the target material in a predetermined position within said chamber;

laser beam focusing optics configured to irradiate the target material supplied in the predetermined position with the laser beam supplied from the outside so as to generate the plasma;

a collector mirror for collecting at least the extreme ultraviolet light included in light emitted from the plasma;

an optical element actuator for adjusting at least one of a location and posture of at least one optical element included in said laser beam focusing optics;

a splitter optical element provided in an obscuration area with respect to said collector mirror, for splitting a part of the light emitted from the plasma;

a detection mechanism for detecting a profile of light split by said splitter optical element; and a controller for controlling said optical element actuator based on a detection result by said detection mechanism.

20. The extreme ultraviolet light source apparatus according to claim 19, further comprising:

a guide laser for outputting a guide laser beam along an optical path of the laser beam, wherein said detection mechanism further detects a profile of the guide laser beam.

21. The extreme ultraviolet light source apparatus according to claim 1, wherein said collector mirror has a first focal point and a second focal point, and said splitter optical element is provided between the first focal point and the second focal point of said collector mirror.

22. The extreme ultraviolet light source apparatus according to claim 1, wherein said detection mechanism detects visible light emitted from the plasma.

23. The extreme ultraviolet light source apparatus according to claim 19, wherein said collector mirror has a first focal point and a second focal point, and said splitter optical element is provided between the first focal point and the second focal point of said collector mirror.

24. The extreme ultraviolet light source apparatus according to claim 19, wherein said detection mechanism detects visible light emitted from the plasma.

* * * * *